United States Patent
Rothberg et al.

(10) Patent No.: US 12,078,596 B2
(45) Date of Patent: Sep. 3, 2024

(54) HAND-HELD, MASSIVELY-PARALLEL, BIO-OPTOELECTRONIC INSTRUMENT

(71) Applicant: Quantum-Si Incorporated, Guilford, CT (US)

(72) Inventors: Jonathan M. Rothberg, Guilford, CT (US); Benjamin Cipriany, Branford, CT (US); Todd Rearick, Cheshire, CT (US); Paul E. Glenn, Wellesley, MA (US); Faisal R. Ahmad, Guilford, CT (US); Todd Roswech, Westbrook, CT (US); Brittany Lathrop, Derby, CT (US); Thomas Connolly, Cheshire, CT (US)

(73) Assignee: Quantum-Si Incorporated, Branford, CT (US)

( * ) Notice: Subject to any disclaimer, the term of this patent is extended or adjusted under 35 U.S.C. 154(b) by 238 days.

(21) Appl. No.: 16/043,651

(22) Filed: Jul. 24, 2018

(65) Prior Publication Data

US 2019/0025214 A1 Jan. 24, 2019

Related U.S. Application Data

(60) Provisional application No. 62/536,330, filed on Jul. 24, 2017.

(51) Int. Cl.
| | | |
|---|---|---|
| G01N 21/64 | (2006.01) | |
| H01S 5/00 | (2006.01) | |
| H01S 5/02253 | (2021.01) | |
| H01S 5/024 | (2006.01) | |
| H01S 5/026 | (2006.01) | |

(52) U.S. Cl.
CPC ..... *G01N 21/6486* (2013.01); *G01N 21/6402* (2013.01); *G01N 21/6408* (2013.01); *G01N 21/6454* (2013.01); *H01S 5/0071* (2013.01); *H01S 5/02253* (2021.01); *H01S 5/02461* (2013.01); *H01S 5/0262* (2013.01); *G01N 21/648* (2013.01); *G01N 2021/6482* (2013.01); *G01N 2201/0221* (2013.01); *G01N 2201/0873* (2013.01)

(58) Field of Classification Search
CPC ....... G01N 2201/0221; G01N 21/6486; G01N 2201/06113
USPC ............................................. 422/82.05, 82.08
See application file for complete search history.

(56) References Cited

U.S. PATENT DOCUMENTS

| | | |
|---|---|---|
| 5,198,543 A | 3/1993 | Blanco et al. |
| 5,302,509 A | 4/1994 | Cheeseman |
| 5,343,038 A | 8/1994 | Nishiwaki et al. |
| 5,471,515 A | 11/1995 | Fossum et al. |
| 5,674,743 A | 10/1997 | Ulmer |
| 5,822,472 A | 10/1998 | Danielzik et al. |
| 5,912,155 A | 6/1999 | Chatterjee et al. |
| 5,961,924 A | 10/1999 | Reichert et al. |
| 6,134,002 A | 10/2000 | Stimson et al. |
| 6,137,117 A | 10/2000 | Feldstein et al. |
| 6,198,869 B1 | 3/2001 | Kraus et al. |
| 6,210,896 B1 | 4/2001 | Chan |
| 6,232,103 B1 | 5/2001 | Short |
| 6,255,083 B1 | 7/2001 | Williams |
| 6,261,797 B1 | 7/2001 | Sorge et al. |
| 6,265,193 B1 | 7/2001 | Brandis et al. |
| 6,280,939 B1 | 8/2001 | Allen |
| 6,327,410 B1 | 12/2001 | Walt et al. |
| 6,355,420 B1 | 3/2002 | Chan |
| 6,399,320 B1 | 6/2002 | Markau et al. |
| 6,399,335 B1 | 6/2002 | Kao et al. |
| 6,437,345 B1 | 8/2002 | Bruno-Raimondi et al. |
| 6,607,883 B1 | 8/2003 | Frey et al. |
| 6,716,394 B2 | 4/2004 | Jensen et al. |
| 6,787,308 B2 | 9/2004 | Balasubramanian et al. |
| 6,825,921 B1 | 11/2004 | Modlin et al. |
| 6,917,726 B2 | 7/2005 | Levene et al. |
| 6,936,702 B2 | 8/2005 | Williams et al. |
| 7,033,762 B2 | 4/2006 | Nelson et al. |
| 7,052,847 B2 | 5/2006 | Korlach et al. |
| 7,057,026 B2 | 6/2006 | Barnes et al. |
| 7,153,672 B1 | 12/2006 | Eickbush et al. |
| 7,158,224 B2 | 1/2007 | Montagu |
| 7,170,050 B2 | 1/2007 | Turner et al. |
| 7,175,811 B2 | 2/2007 | Bach et al. |
| 7,179,654 B2 | 2/2007 | Verdonk et al. |
| 7,270,951 B1 | 9/2007 | Stemple et al. |
| 7,277,166 B2 | 10/2007 | Padmanabhan et al. |
| 7,345,764 B2 | 3/2008 | Bulovic et al. |
| 7,393,640 B2 | 7/2008 | Kumar et al. |
| 7,405,281 B2 | 7/2008 | Xu et al. |

(Continued)

FOREIGN PATENT DOCUMENTS

| | | |
|---|---|---|
| CN | 1480724 A | 3/2004 |
| CN | 102713572 A | 10/2012 |

(Continued)

OTHER PUBLICATIONS

[No Author Listed] 5.2 Megapixels, 1-inch, 250fps, global-shutter CMOS image sensor, Anafocus, Oct. 2012, 4 pages, Sevilla, Spain.

(Continued)

*Primary Examiner* — Natalia Levkovich
(74) *Attorney, Agent, or Firm* — Wolf, Greenfield & Sacks, P.C.

(57) ABSTRACT

A hand-held bioanalytic instrument is described that can perform massively parallel sample analysis including single-molecule gene sequencing. The instrument includes a pulsed optical source that produces ultrashort excitation pulses and a compact beam-steering assembly. The beam-steering assembly provides automated alignment of excitation pulses to an interchangeable bio-optoelectronic chip that contains tens of thousands of reaction chambers or more. The optical source, beam-steering assembly, bio-optoelectronic chip, and coupling optics register to an alignment structure in the instrument that can form at least one wall of an enclosure and dissipate heat.

36 Claims, 23 Drawing Sheets

(56) References Cited

U.S. PATENT DOCUMENTS

| | | |
|---|---|---|
| 7,426,322 B2 | 9/2008 | Hyde |
| 7,462,452 B2 | 12/2008 | Williams et al. |
| 7,595,883 B1 | 9/2009 | El Gamal et al. |
| 7,630,073 B2 | 12/2009 | Lundquist et al. |
| 7,738,086 B2 | 6/2010 | Shepard et al. |
| 7,745,116 B2 | 6/2010 | Williams |
| 7,820,983 B2 | 10/2010 | Lundquist et al. |
| 7,834,329 B2 | 11/2010 | Lundquist et al. |
| 7,838,847 B2 | 11/2010 | Lundquist et al. |
| 7,871,777 B2 | 1/2011 | Schneider et al. |
| 7,873,085 B2 | 1/2011 | Babushkin et al. |
| 7,875,440 B2 | 1/2011 | Williams et al. |
| 7,968,702 B2 | 6/2011 | Wegener et al. |
| 7,973,146 B2 | 7/2011 | Shen et al. |
| 7,981,604 B2 | 7/2011 | Quake |
| 8,053,742 B2 | 11/2011 | Lundquist et al. |
| 8,058,030 B2 | 11/2011 | Smith et al. |
| 8,133,672 B2 | 3/2012 | Bjornson et al. |
| 8,153,375 B2 | 4/2012 | Travers et al. |
| 8,174,696 B2 | 5/2012 | Ebbesen et al. |
| 8,207,509 B2 | 6/2012 | Lundquist et al. |
| 8,274,034 B2 | 9/2012 | Vogel et al. |
| 8,274,040 B2 | 9/2012 | Zhong et al. |
| 8,278,728 B2 | 10/2012 | Murshid |
| 8,323,939 B2 | 12/2012 | Hanzel et al. |
| 8,343,746 B2 | 1/2013 | Rank et al. |
| 8,465,699 B2 | 6/2013 | Fehr et al. |
| 8,471,219 B2 | 6/2013 | Lundquist et al. |
| 8,471,230 B2 | 6/2013 | Zhong et al. |
| 8,481,264 B2 | 7/2013 | Bjornson et al. |
| 8,501,406 B1 | 8/2013 | Gray et al. |
| 8,501,922 B2 | 8/2013 | Otto et al. |
| 8,502,169 B2 | 8/2013 | Rigneault et al. |
| 8,580,539 B2 | 11/2013 | Korlach |
| 8,618,507 B1 | 12/2013 | Lundquist et al. |
| 8,654,427 B1 | 2/2014 | DeAngelo |
| 8,865,077 B2 | 10/2014 | Chiou et al. |
| 8,921,086 B2 | 12/2014 | Hanzel et al. |
| 9,029,802 B2 | 5/2015 | Lundquist et al. |
| 9,062,091 B2 | 6/2015 | Bjornson et al. |
| 9,127,259 B2 | 9/2015 | Bjornson et al. |
| 9,157,864 B2 | 10/2015 | Fehr et al. |
| 9,222,123 B2 | 12/2015 | Zhong et al. |
| 9,222,133 B2 | 12/2015 | Lundquist et al. |
| 9,223,084 B2 | 12/2015 | Grot et al. |
| 9,372,308 B1 | 6/2016 | Saxena et al. |
| 9,587,276 B2 | 3/2017 | Lundquist et al. |
| 9,606,060 B2 | 3/2017 | Chen et al. |
| 9,654,680 B2 | 5/2017 | Kimoto |
| 9,658,161 B2 | 5/2017 | Saxena et al. |
| 9,666,748 B2 | 5/2017 | Leobandung |
| 9,719,138 B2 | 8/2017 | Zhong et al. |
| 9,765,395 B2 | 9/2017 | Goldsmith |
| 9,946,017 B2 | 4/2018 | Saxena et al. |
| 9,983,135 B2 | 5/2018 | Rothberg et al. |
| 10,018,764 B2 | 7/2018 | Grot et al. |
| 10,090,429 B2 | 10/2018 | Leobandung |
| 10,138,515 B2 | 11/2018 | Fehr et al. |
| 10,280,457 B2 | 5/2019 | Zhong et al. |
| 10,310,178 B2 | 6/2019 | Saxena et al. |
| 10,487,356 B2 | 11/2019 | Lundquist et al. |
| 10,578,788 B2 | 3/2020 | Grot et al. |
| 10,655,172 B2 | 5/2020 | Rank et al. |
| 10,712,273 B2 | 7/2020 | Rothberg et al. |
| 10,712,274 B2 | 7/2020 | Rothberg et al. |
| 10,724,090 B2 | 7/2020 | McCaffrey et al. |
| 2002/0031836 A1 | 3/2002 | Feldstein |
| 2002/0182631 A1 | 12/2002 | Schurmann-Mader et al. |
| 2002/0182716 A1 | 12/2002 | Weisbuch et al. |
| 2003/0174992 A1 | 9/2003 | Levene et al. |
| 2003/0223059 A1 | 12/2003 | Li |
| 2004/0169842 A1 | 9/2004 | Dosluoglu et al. |
| 2005/0079102 A1* | 4/2005 | Staton ............... G01N 21/6456 422/82.05 |
| 2006/0238767 A1 | 10/2006 | Chen et al. |
| 2006/0284774 A1 | 12/2006 | Salsman |
| 2007/0054280 A1 | 3/2007 | Li et al. |
| 2007/0281288 A1 | 12/2007 | Belkin et al. |
| 2008/0050747 A1 | 2/2008 | Korlach et al. |
| 2008/0102001 A1 | 5/2008 | Chandrachood et al. |
| 2009/0140128 A1 | 6/2009 | Oldham et al. |
| 2009/0243584 A1 | 10/2009 | Zhang et al. |
| 2010/0009872 A1 | 1/2010 | Eid et al. |
| 2010/0065726 A1 | 3/2010 | Zhong et al. |
| 2010/0173394 A1 | 7/2010 | Colston et al. |
| 2010/0255461 A1 | 10/2010 | Callenbach et al. |
| 2010/0255487 A1 | 10/2010 | Beechem et al. |
| 2010/0256016 A1 | 10/2010 | Blair et al. |
| 2010/0323406 A1 | 12/2010 | Vatta et al. |
| 2011/0136201 A1 | 6/2011 | Mao et al. |
| 2011/0165652 A1 | 7/2011 | Hardin et al. |
| 2011/0236983 A1 | 9/2011 | Beechem et al. |
| 2012/0014837 A1 | 1/2012 | Fehr et al. |
| 2012/0021525 A1 | 1/2012 | Fehr et al. |
| 2012/0094332 A1 | 4/2012 | Lee et al. |
| 2012/0322692 A1 | 12/2012 | Pham et al. |
| 2013/0023039 A1 | 1/2013 | Zaccarin et al. |
| 2013/0040231 A1 | 2/2013 | Chandrachood et al. |
| 2013/0071849 A1 | 3/2013 | Kong et al. |
| 2013/0116153 A1 | 5/2013 | Bowen et al. |
| 2013/0177903 A1 | 7/2013 | Thomas et al. |
| 2013/0214391 A1 | 8/2013 | Choi et al. |
| 2013/0217007 A1 | 8/2013 | Kamtekar et al. |
| 2014/0206562 A1 | 7/2014 | Mccormack et al. |
| 2014/0335527 A1 | 11/2014 | Goel |
| 2015/0141267 A1 | 5/2015 | Rothberg et al. |
| 2015/0141268 A1 | 5/2015 | Rothberg et al. |
| 2016/0041095 A1 | 2/2016 | Rothberg et al. |
| 2016/0084761 A1* | 3/2016 | Rothberg ............. C12Q 1/6874 506/4 |
| 2016/0133668 A1 | 5/2016 | Rothberg et al. |
| 2016/0334618 A1 | 11/2016 | Hargis et al. |
| 2016/0341664 A1 | 11/2016 | Rothberg et al. |
| 2016/0355869 A1 | 12/2016 | Blair et al. |
| 2016/0369332 A1 | 12/2016 | Rothberg et al. |
| 2017/0146479 A1 | 5/2017 | Levine et al. |
| 2017/0219492 A1 | 8/2017 | Lundquist et al. |
| 2017/0322156 A1 | 11/2017 | Saxena et al. |
| 2018/0348132 A1 | 12/2018 | Rothberg et al. |
| 2018/0348133 A1 | 12/2018 | Rothberg et al. |
| 2019/0292590 A1 | 9/2019 | Zhong et al. |
| 2020/0371034 A1 | 11/2020 | Rothberg et al. |

FOREIGN PATENT DOCUMENTS

| | | |
|---|---|---|
| CN | 105039147 A | 11/2015 |
| CN | 106796175 | 5/2017 |
| EP | 1681356 A1 | 7/2006 |
| EP | 2182523 A1 | 5/2010 |
| EP | 2339632 A1 | 6/2011 |
| EP | 2391639 | 12/2011 |
| EP | 2134871 B1 | 3/2012 |
| EP | 2439512 A1 | 4/2012 |
| JP | 2009-045057 A | 3/2009 |
| JP | 2010-000048 A | 1/2010 |
| JP | 2010-243223 A | 10/2010 |
| JP | 2011-038932 A | 2/2011 |
| JP | 2011-530832 A | 12/2011 |
| JP | 2013-522605 | 6/2013 |
| JP | 2016-522676 | 8/2016 |
| WO | WO 91/06678 A1 | 5/1991 |
| WO | WO 00/58715 A2 | 10/2000 |
| WO | WO 01/03833 A1 | 1/2001 |
| WO | WO 2005/073407 A1 | 8/2005 |
| WO | WO 2007/015168 A2 | 2/2007 |
| WO | WO 2011/153962 A1 | 12/2011 |
| WO | WO 2013/060989 A1 | 5/2013 |
| WO | WO 2013/154770 A1 | 10/2013 |

(56) References Cited

FOREIGN PATENT DOCUMENTS

| WO | WO 2013/171197 A1 | 11/2013 |
|---|---|---|
| WO | WO 2015/141873 A1 | 9/2015 |

OTHER PUBLICATIONS

[No Author Listed] Description of our technology, CrackerBio, 4 pages, Taiwan.

[No Author Listed] Detect Cancer with our 4 Picos ICCD camera, Stanford Computer Optics, 2013, 2 pages, http://www.stanfordcomputeroptics.com/applications/life-science/time-resolved-flim.html [last accessed May 9, 2014].

[No Author Listed] Iccd camera applications in the field of Life Science, Stanford Computer Optics, 2013, 2 pages, http://www.stanfordcomputeroptics.com/applications/life-science.html [last accessed May 9, 2014].

[No Author Listed] OLED-on-CMOS for Sensors and Microdisplays, IPMS Fraunhofer Institut Photonische Mikrosysteme, 2 pages, Dresden, Germany.

Achermann, Exciton—Plasmon Interactions in Metal—Semiconductor Nanostructures, The Journal Physical Chemistry Letters, Sep. 13, 2010, 1(19):2837-43.

Akselrod et al, Twenty-fold enhancement of molecular fluorescence by coupling to a J-aggregate critically coupled resonator. ACS Nano. Jan. 24, 2012;6(1):467-71. doi: 10.1021/nn203789t. Epub Dec. 1, 2011.

Algar et al., Interfacial Chemistry and the Design of Solid-Phase Nucleic Acid Hybridization Assays Using Immobilized Quantum Dots as Donors in Fluorescence Resonance Energy Transfer, Sensors, Jun. 2011, 11(6):6214-36.

Aouani et al., Bright unidirectional fluorescence emission of molecules in a nanoaperture with plasmonic corrugations. Nano Lett. Feb. 9, 2011;11(2):637-44. doi: 10.1021/nl103738d. Epub Jan. 19, 2011.

Aouani et al., Plasmonic Antennas for Directional Sorting of Fluorescence Emission, Nano Letters, May 18, 2011, 11(6):2400-6.

Aouani et al., Saturated excitation of fluorescence to quantify excitation enhancement in aperture antennas, Optics Express, Jul. 30, 2012, 20(16):18085-90.

Aouani et al., Supporting Information for Bright unidirectional fluorescence emission of molecules in a nanoaperture with plasmonic corrugations. Nano Lett. Feb. 9, 2011;11(2):19 pages.

Aouani et al., Supporting Information for Plasmonic Antennas for Directional Sorting of Fluorescence Emission, Nano Letters, May 18, 2011, 11(6):9 pages.

Bergman et al., Surface Plasmon Amplification by Stimulated Emission of Radiation: Quantum Generation of Coherent Surface Plasmons in Nanosystems, Physical Review Letters, Jan. 17, 2013, 90(2):027402-1-4.

Bogaerts et al., High speed 36 Gbps 12Mpixel global pipelined shutter CMOS image sensor with CDS, 2011 International Image Sensor Workshop, Jun. 8-11, 2011, 4 pages, Hokkaido, Japan.

Carretero-Palacious et al., Mechanisms for extraordinary optical transmission through bull's eye structures, Optics Express, May 23, 2011, 19(11):10429-42.

Chanyawadee et al., Nonradiative exciton energy transfer in hybrid organic-inorganic heterostructures, Phys. Rev. B., May 14, 2008, 77(19): 193402-1-4.

Daldosso et al., Fabrication and optical characterization of thin two-dimensional Si3N4 waveguides, Materials Science in Semiconductor Processing, Oct. 18, 2004, 7(4-6): 453-8.

Davies et al., Plasmonic Nanogap Tilings: Light-Concentrating Surfaces for Low-Loss Photonic Integration, ACS Nano, Jul. 4, 2013, 7(8):7093-100, arXiv:1305.2839v2, http://arxiv.org/abs/1305.2839v2.

Deshpande et al., Electrically driven polarized single-photon emission from an InGaN quantum dot in a GaN nanowire, Nature Communcations, Apr. 9, 2013, 8 pages.

Deutsch et al., Luminescence upconversion in colloidal double quantum dots, Nature Nanotechnology Letter, Sep. 2013, 8(9):649-53.

Edel et al., Accurate Single Molecule FRET Efficiency Determination for Surface Immobilized DNA Using Maximum Likelihood Calculated Lifetimes, J. Phys. Chem, Mar. 22, 2007, 111(11):2986-90.

Eid et al., Real-time DNA sequencing from single polymerase molecules. Science. Jan. 2, 2009;323(5910):133-8. doi: 10.1126/science.1162986. Epub Nov. 20, 2008.

Eid et al., Supporting Online Material for Real-time DNA sequencing from single polymerase molecules. Science. Jan. 2, 2009;323(5910):21 pages.

Feldman et al., Wafer-Level Camera Technologies Shrink Camera Phone Handsets, Photonics.com, Aug. 1, 2007, 3 pages, http://www.photonics.com/Article.aspx?AID=30459 . [last accessed Dec. 17, 2013].

Fu et al., A microfabricated fluorescence-activated cell sorter. Nature Biotechnology. Nov. 1999; 17(11): 1109-1111.

Gorin et al., Fabrication of silicon nitride waveguides for visible-light using PECVD: a study of the effect of plasma frequency on optical properties, Optics Express, Sep. 1, 2008, 16(18):13509-16.

Gryczynski et al., Two-photon excitation by the evanescent wave from total internal reflection. Anal Biochem., Apr. 5, 1997;247(1):69-76.

Haase et al., Upconverting Nanoparticles, Angewandte Chemie International Edition, Jun. 20, 2011, 50(26):5808-29.

Hallman et al., 3 nJ, 100 ps laser pulses generated with an asymmetric waveguide laser diode for a single-photon avalanche diode time-of-flight (SPAD TOF) rangefinder application, Measurement Science and Technology, Jan. 5, 2012, 23(2): 8 pages.

Hansard et al., Time-of-Flight Cameras: Principles, Methods and Applications, Nov. 2012, 102 pages, Springer-Verlag, London, UK.

He et al., DNA Sequencing by Capillary Electrophoresis with Four-Decay Fluorescence Detection, Anal. Chem., Dec. 15, 2000, 72(24):5865-73.

Herold et al., OLED-on-CMOS Integration for Augmented-Reality Systems, IEEE 2008 International Students and Young Scientists Workshop Photonics and Microsystems, Jun. 20-22, 2008, 19-22, Wroclaw—Szlarska Poreba, Poland.

Heucke et al., Placing Individual Molecules in the Center of Nanoapertures, Nano Letters, Feb. 12, 2014, 14(2):391-5.

Inoue et al., CMOS active pixel image sensor with in-pixel CDS for high-speed cameras, Proc. SPIE, Sensors and Camera Systems for Scientific, Industrial, and Digital Photography Applications V, 250, Jun. 7, 2004, 5301(4):8 pages.

Ishii et al., Self-matched high-voltage rectangular wave pulse generator, Rev. Sci. Instrum, Nov. 1985, 56(11):2116-8.

Jun et al., Plasmonic beaming and active control over fluorescent emission, Nature Communications, Apr. 19, 2011, 6 pages.

Juodawlkis et al., High-Power, Low-Noise Slab-Coupled Optical Waveguide (SCOW) Amplifiers and Lasers, IEEE Optical Society of America Optical Fiber Communication Conference and Exposition and the National FiberOptic Engineers Conference, Mar. 6-10, 2011, 3 pages, Los Angeles, CA.

Juodawlkis et al., High-Power, Ultralow-Noise Semiconductor External Cavity Lasers Based on Low-Confinement Optical Waveguide Gain Media, Proc. of SPIE Novel In-Plane Semiconductor Lasers IX, Feb. 12, 2010, vol. 7616:76160X-1-9.

Kano et al., Two-photon-excited fluorescence enhanced by a surface plasmon. Opt Lett. Nov. 15, 1996;21(22):1848-50.

Karow, PacBio Aims to Boost Throughput of SMRT Technology with Microchip Co-development Deal, In Sequence and Clinical Sequencing News, Jul. 24, 2012, 3 pages, GenomeWeb.

Klein et al., Controlling plasmonic hot spots by interfering Airy beams, Optics Letters, Aug. 15, 2012, 37(16): 3402-4.

Korlach et al., Real-time DNA sequencing from single polymerase molecules. Methods Enzymol. May 2010;472:431-55. doi:10.1016/S0076-6879(10)72001-2.

Kreye et al, P-200: Evaluation of different OLED-Stacks for Active-Matrix OLED Microdisplays on CMOS-Substrates, SID 06 Digest, Jun. 2006, 37(1); 979-81.

(56) References Cited

OTHER PUBLICATIONS

Kumar et al., Terminal phosphate labeled nucleotides: synthesis, applications, and linker effect on incorporation by DNA polymerases. Nucleosides Nucleotides Nucleic Acids. Nov. 2005;24(5-7):401-8.

Lenne et al., Fluorescence fluctuations analysis in nanoapertures: physical concepts and biological applications, Histochem Cell Biol, Sep. 2008, 130:795-805.

Leslie et al., Convex Lens-Induced Confinement for Imaging Single Molecules, Anal. Chem., Jul. 15, 2010, 82(14):6224-9.

Levy et al., An 852x600 Pixel OLED-on-Silicon Color Microdisplay Using CMOS Subthreshold-Voltage-Scaling Current Drivers, IEEE Journal of Solid-State Circuits, Dec. 2002, 37(12): 1879-89.

Lezec et al., Beaming Light from a Subwavelength Aperture, Science, Aug. 2, 2002, 297(5582):820-2.

Li et al., Employing ~100% Excitons in OLEDs by Utilizing a Fluorescent Molecule with Hybridized Local and Charge-Transfer Excited State, Advanced Functional Materials, Mar. 19, 2014, 24(11):1609-14.

Lin et al., Cosine-Gauss Plasmon Beam: A Localized Long-Range Nondiffracting Surface Wave, Physical Review Letters, Aug. 31, 2012, 109(9):093904-1-5.

McGinty et al., Wide-field fluorescence lifetime imaging of cancer, Biomedical Optics Express, Sep. 1, 2010, 1(2): 627-40.

Misra et al., White organic LEDs and their recent advancements, Semiconductor Science and Technology, Apr. 25, 2006, 21(7):R35-47.

Mitchell et al., Nanosecond Fluorescence Lifetime Imaging with gated CCD detection and pulsed laser excitation, Photonic Research Systems Ltd., May 1, 2013, 13 pages, Newhaven East Sussex UK.

Murshid et al., Array of concentric CMOS photodiodes for detection and de-multiplexing of spatially modulated optical channels, Optics & Laser Technology, Sep. 2009, 41(6):764-9.

Murshid et al., CMOS Detectors: Concentric photodiode array enables spatial-domain multiplexing, Laser Focus World, Apr. 1, 2009, 10 pages, http://www.laserfocusworld.com/articles/print/volume-45/issue-4/features/cmos-detectors-concentric-photodiode-array-enables-spatial-domain-multiplexing.html , [last accessed Dec. 12, 2013].

Murshid et al., Concentric octagonal CMOS photodiodes for direct detection of spatially multiplexed optical fiber channels, Optical Society of America, Oct. 2008, 1 page.

Nozik, Multiple exciton generation in semiconductor quantum dots, Chemical Physics Letters, May 20, 2008, 457(1-3):3-11.

Park et al., A dual-modality optical coherence tomography and fluorescence lifetime imaging microscopy system for simultaneous morphological and biochemical tissue characterization, Biochemical Optics Express, Aug. 2, 2010, 1(1):186-200.

Pfeifer et al., Improved optical outcoupling of OLED microdisplays by nanostructured substrates, IEEE Semiconductor Conference Dresden, Sep. 27-18, 2011, 4 pages, Dresden, Germany.

Poddubny et al., Photonic quasicrystalline and aperiodic structures, Physica E: Low-dimensional Systems and Nanostructures, May 2010, 42(7): 1871-95.

Pons et al., Solution-phase single quantum dot fluorescence resonance energy transfer. J Am Chem Soc., Nov. 29, 2006;128(47):15324-31.

Pudavar, Fluorescence Lifetime Imaging (FILM), Leica Microsystems Inc., Oct. 25, 2009, 60 pages, Exton, PA.

Punj et al., Plasmonic antennas and zero-mode waveguides to enhance single molecule fluorescence detection and fluorescence correlation spectroscopy toward physiological concentrations. Wiley Interdiscip Rev Nanomed Nanobiotechnol. May-Jun. 2014;6(3):268-82. doi: 10.1002/wnan.1261. Epub Feb. 24, 2014.

Ramuz et al., Coupling light from an organic light emitting diode (OLED) into a single-mode waveguide: Toward monolithically integrated optical sensors, Journal of Applied Physics, Apr. 2009, 105(8):084508-1-7.

Ran et al., Design of a 16 gray scales 320 x 240 pixels OLED-on-silicon driving circuit, Journal of Semiconductors, Jan. 2009, 30(1):015010-1-4.

Reckziegel et al., Optical sensors based on monlithic integrated organic light-emitting diodes (OLEDs), Proceedings of SPIE Optical Sensors, Apr. 28, 2008, vol. 7003: 8 pages.

Richter et al., Bidirectional OLED microdisplay: Combining display and image sensor functionality into a monolithic CMOS chip, 2011 IEEE International Solid-State Circuits Conference Digest of Technical Papers (ISSCC), Feb. 20-24, 2011, 3 pages, San Francisco, CA.

Richter et al., OLED-on-CMOS based bidirectional microdisplay for near-to-eye and sensor applications, IEEE Semiconductor Conference Dresden, Sep. 27-28, 2011, 3 pages, Dresden, Germany.

Rigneault et al., Enhancement of Single-Molecule Fluorescence Detection in Subwavelength Apertures, Physical Review Letters, Sep. 9, 2005, 95(11): 117401-1-4.

Romero-Garcia et al., Silicon nitride back-end optics for biosensor applications, Proc. of SPIE Integrated Optics: Physics and Simulations, May 7, 2013, vol. 8781: 87810W-1-11.

Romero-Garcia et al., Visible wavelength silicon nitride focusing grating coupler with AlCu/TiN reflector. Optics Letters. Jul. 15, 2013, 38(14):2521-3.

Rui et al., Demonstration of beam steering via dipole-coupled plasmonic spiral antenna, Scientific Reports, Jul. 19, 2013, 7 pages.

Sakadzic et al., Multi-photon microscopy with a low-cost and highly efficient Cr:LiCAF laser, Optics Express, Dec. 8, 2008, 16(25):20848-63.

Salthouse et al., Development of a Time Domain Fluorimeter for Fluorescent Lifetime Multiplexing Analysis, IEEE Biomed Circuits Syst., Sep. 1, 2008, 2(3): 204-11.

Schalberger et al., 60.4: Distinguished Paper: A Fully Integrated 1 AMOLED Display Using Current Feedback Based on a Five Mask LTPS CMOS Process, SID 10 Digest, May 2010, 41(1): 905-8.

Schmidt, Direct Encapsulation of OLED on CMOS, Bio and Nano Packaging Techniques for Electron Devices, Jul. 17, 2012, Chapter 29, 581-99, Springer-Verlag Berling Heidelberg.

Siegfried et al., Gap Plasmons and Near-Field Enhancement in Closely Packed Sub-10 nm Gap Resonators, Nano Lett., Oct. 10, 2013, 13(11):5449-53.

Sorokina et al., Fluorescent Lifetime Trajectories of a Single Fluorophore Reveal Reaction Intermediates During Transcription Initiation, J. Am. Chem. Soc., Jul. 22, 2009, 131(28):9630-31.

Sorokina et al., Supporting Information for Fluorescent Lifetime Trajectories of a Single Fluorophore Reveal Reaction Intermediates During Transcription Initiation, J. Am. Chem. Soc., Jul. 22, 2009, 131(28):4 pages.

Sun et al., Fluorescence lifetime imaging microscopy (FLIM) for image guided surgery, Stanford Computer Optics, 2013, 2 pages, http://www.stanfordcomputeroptics.com/applications/life-science/flim-guided-surgery.html , [last accessed May 9, 2014].

Taitt et al., Evanescent wave fluorescence biosensors. Biosens Bioelectron. Jun. 2005;20(12):2470-87. Epub Dec. 8, 2004.

Takkellapati et al., Synthesis of aminomethyl- and bis-aminomethyl-fluorescein energy transfer terminators. Nucleosides Nucleotides Nucleic Acids. Dec. 2007;26(10-12):1467-70.

Toerker et al., Integration of Top-Emitting Organic Light Emitting Diodes on CMOS Substrates, Proc. of SPIE Organic Optoelectronics and Photonics III, Apr. 16, 2008, vol. 6999, 4 pages.

Toma et al., Compact surface plasmon-enhanced fluorescence biochip, Opt. Express Apr. 22, 2013, 21(8): 10121-10132.

Toma et al., Surface plasmon-coupled emission on plasmonic Bragg gratings, Optics Express, Jun. 18, 2012, 20(13):14042-53.

Uhring et al., 200 ps FWHM and 100 MHz Repetition Rate Ultrafast Gated Camera for Optical Medical Functional Imaging, Proc. of SPIE Optical Sensing and Detection II, May 9, 2012, vol. 8439, 10 pages.

Unfricht et al., Grating-coupled surface plasmon resonance: a cell and protein microarray platform. Proteomics. Nov. 2005;5(17):4432-42.

Vogel et al., OLED-on-CMOS Integration for Optoelectronic Sensor Applications, Proc. of SPIE Silicon Photonics II, Mar. 1, 2007, vol. 6477:8 pages.

Vogel et al., Optoelectronic Sensors based on OLED-on-CMOS, 2008 2nd European Conference & Exhibition on Integration Issues

(56) References Cited

OTHER PUBLICATIONS of Minaturized Systems—MOMS, MOEMS, ICS, and Electronic Components (SSI), Apr. 9-10, 2008, 3 pages, Barcelona, Spain.
Von Ketteler et al., Fluorescence Lifetime-Based Glucose Sensing using NADH, Proc. of SPIE Optical Diagnostics and Sensing XII: Toward Point-of-Care Diagnostics; and Design and Performance Validation of Phantoms Used in Conjunction with Optical Measurement of Tissue IV, Feb. 1, 2012, vol. 8229, 8 pages.
Walpole, Slab-coupled optical waveguide lasers: a review, Proc. SPIE Novel In-Plane Semiconductor Lasers III, May 11, 2004, vol. 5365, 124-32.
Wenger et al., Emission and excitation contributions to enhanced single molecule fluorescence by gold nanometric apertures, Optics Express, Mar. 3, 2008, 16(5):3008-20.
Wenger et al., Enhanced fluorescence from metal nanoapertures: physical characterizations and biophotonic applications, Proc. SPIE Plasmonics in Biology and Medicine VII, Feb. 16, 2010, 8 pages.
Wenger, Aperture optical antennas, Optical Antennas, Feb. 2013, 25pages, Cambridge University Press, Cambridge, UK.
Willoughby, Elastically Averaged Precision Alignment, Massachusetts Institute of Technology, Jun. 2005, 158 pages, Cambridge, MA.
Xiong et al., Aluminum nitrade as a new material for chip-scale optomechanics and nonlinear optics, New Journal of Physics, Sep. 17, 2012, 14: 21 pages.
Yan-Yan et al., OLED-on-silicon chip with new pixel circuit, J. Cent. South Univ., May 2012 19(5):1276-82.
Yu et al., Light Propagation with Phase Discontinuities: Generalized Laws of Reflection and Refraction, Science, Oct. 21, 2011, 334 (6054):333-7.
Yuk et al. Analysis of immunoarrays using a gold grating-based dual mode surface plasmon-coupled emission (SPCE) sensor chip. Analyst. Jun. 7, 2012;137(11):2574-81. doi: 10.1039/c2an35143a. Epub Apr. 13, 2012.
Zhang et al., Continuous metal plasmonic frequency selective surfaces, Optics Express, Nov. 7, 2011, 19(23):23279-85.
Zhao et al., Plasmonic demultiplexer and guiding. ACS Nano. Nov. 23, 2010;4(11):6433-8. doi: 10.1021/nn101334a. Epub Oct. 6, 2010.
Zhu et al., Zero-Mode Waveguides for Single-Molecule Analysis, Annu. Rev. Biophys., Jun. 2012, 41:269-93.
Zong et al., Equivalent Circuit Model of Top-emitting OLED for the Designing of OLED-on-Silicon Microdisplay, Advanced Materials Research, Nov. 2011, 383-90:7037-42.
Hale, Fibre Optic Sensors using Adiabatically Tapered Single Mode Fibres. Dissertation submitted to the University of Cambridge. Feb. 1994. 209 pages.
Mogensen et al., A Microfluidic Device with an Integrated Waveguide Beam Splitter for Velocity Measurements of Flowing Particles by Fourier Transformation. Analytical Chemistry. Sep. 15, 2003;75(18):4931-4936.
Extended European Search Report for European Application No. 18838913.4 dated Apr. 14, 2021.
Tseng et al., Simultaneous piston position and tilt angle sensing for large vertical displacement micromirrors by frequency detection inductive sensing. Applied Physics Letters. Nov. 23, 2015;107(21):214102: 5 pages.
European Communication for European Application No. 14809194.5 dated Nov. 22, 2018.
Invitation to Pay Additional Fees for International Application No. PCT/US2014/066014 mailed Jan. 28, 2015.
International Search Report and Written Opinion for International Application No. PCT/US2014/066014 mailed Apr. 7, 2015.
International Preliminary Report on Patentability for International Application No. PCT/US2014/066014 mailed May 26, 2016.
Invitation to Pay Additional Fees for International Application No. PCT/US2015/044360 mailed Nov. 20, 2015.
International Search Report and Written Opinion for International Application No. PCT/US2015/044360 mailed Feb. 3, 2016.
Invitation to Pay Additional Fees for International Application No. PCT/US2015/044378 mailed Oct. 30, 2015.
International Search Report and Written Opinion for International Application No. PCT/US2015/044378 mailed Jan. 15, 2016.
Invitation to Pay Additional Fees for International Application No. PCT/US2015/044379 mailed Nov. 2, 2015.
International Search Report and Written Opinion for International Application No. PCT/US2015/044379 mailed Jan. 15, 2016.
Invitation to Pay Additional Fees for International Application No. PCT/US2014/066013 mailed Jan. 28, 2015.
International Search Report and Written Opinion for International Application No. PCT/US2014/066013 mailed Apr. 7, 2015.
International Preliminary Report on Patentability for International Application No. PCT/US2014/066013 mailed May 26, 2016.
Invitation to Pay Additional Fees for International Application No. PCT/US2014/066010 mailed Jan. 28, 2015.
International Search Report and Written Opinion for International Application No. PCT/US2014/066010 mailed Apr. 7, 2015 .
International Preliminary Report on Patentability for International Application No. PCT/US2014/066010 mailed May 26, 2016.
International Search Report and Written Opinion for International Application No. PCT/US18/43390 dated Oct. 23, 2018.
Extended European Search Report for European Application No. 20150539.3 dated Aug. 12, 2020.
[No Author Listed], Beam steering. Wikipedia. 2023. 2 pages. https://en.wikipedia.org/wiki/Beam_steering [Last accessed Feb. 28, 2023].
[No Author Listed], Well. Merriam Webster Dictionary. 2024. 22 pages. https://www.merriam-webster.com/dictionary/well [Last accessed Mar. 25, 2024].
Chamberland, The chemical and physical properties of CrO2 and tetravalent chromium oxide derivatives. Critical Reviews in Solid State and Material Sciences. Nov. 1, 1977;7(1):1-31. https://www.tandfonline.com/doi/abs/10.1080/10408437708243431.

\* cited by examiner

HAND-HELD, MASSIVELY-PARALLEL, BIO-OPTOELECTRONIC INSTRUMENT

This application claims priority to U.S. provisional application No. 62/536,330, filed Jul. 24, 2017 and titled "Hand-Held, Massively-Parallel, Bio-Optoelectronic Instrument," which application is incorporated by reference in its entirety.

FIELD

The present application relates to a hand-held, bio-optoelectronic instrument that can perform massively-parallel analyses of samples by providing short optical pulses to tens of thousands of reaction chambers or more simultaneously and receive fluorescent signals in parallel from the reaction chambers for sample analyses.

BACKGROUND

Instruments that are capable of massively-parallel analyses of biological or chemical specimens are typically limited to laboratory settings because of several factors that can include their large size, lack of portability, requirement of a skilled technician to operate the instrument, power need, need for a controlled operating environment, and cost. When a sample is to be analyzed using such equipment, a common paradigm is to extract a sample at a point of care or in the field, send the sample to the lab, and wait for results of the analysis. The wait time for results can range from hours to days.

SUMMARY

The technology described herein relates to a hand-held, bio-optoelectronic instrument for massively-parallel sample analyses. The hand-held instrument may be useful for point-of-care genetic sequencing and for personalized medicine. The instrument can be used for other applications (e.g., drug or protein detection, virus detection, tracking of virus or bacteria mutations, proteomics, and metabolic assays) that involve analyses of samples.

In embodiments, the instrument includes an optical source and circuitry for producing optical pulses that can turn off to at least 40 dB below a peak value in sub-600-ps time scales, a receptacle for receiving a user-interchangeable, packaged bio-optoelectronic chip that contains at least 30,000 sample analysis pixels and micron scale optical waveguides, a compact beam shaping and steering assembly, and coupling optics to guide optical pulses from the optical source to the optical waveguides and sample analysis pixels. The instrument can further include an on-board power source, control, diagnostic, and data processing electronics. In some embodiments, the instrument may weigh less than two kilograms and be easily held in one hand. For example, the instrument may have a maximum edge length no larger than 25 centimeters.

An alignment structure within the instrument aids in providing precise alignment of the optical source, beam-steering assembly, coupling optics and user-interchangeable, bio-optoelectronic chip. The alignment structure can provide mechanical stability of the relative locations of the optical source, beam-steering assembly, coupling optics and user-interchangeable, bio-optoelectronic chip. The alignment structure can also provide heat dissipative functionality for the optical source and the bio-optoelectronic chip, and other components. Additionally in some cases, the alignment structure can form part of the instrument's enclosure.

Each sample analysis pixel can comprise a reaction chamber arranged to hold a sample and receive light from an optical waveguide and an optical detector arranged to receive light from the reaction chamber. The instrument electronically and optically interfaces with a bio-optoelectronic chip, when placed in the receptacle, to provide short optical pulses to the tens of thousands of reaction chambers, or more, simultaneously and receive electronic signals for sample analyses resulting from fluorescent emission at the reaction chambers. In some embodiments, the instrument may be used for genetic sequencing.

Some embodiments relate to a hand-held bioanalytic instrument comprising an alignment structure, a pulsed optical source registered to the alignment structure, a chip receptacle formed in the alignment structure and adapted to receive a packaged bio-optoelectronic chip, and a beam-steering assembly registered to the alignment structure and adapted to steer a beam of optical pulses from the pulsed optical source to the packaged bio-optoelectronic chip, wherein the alignment structure forms a majority of at least one enclosing wall in or on the hand-held bioanalytic instrument.

Some embodiments relate to a system for identifying different biochemical specimens within a sample. The system may comprise a hand-held bioanalytic instrument that contains a laser diode configured to operate at a single characteristic wavelength, a driving circuit connected to the laser diode that causes the laser diode to output optical pulses having the single characteristic wavelength, and a chip receptacle adapted to receive a packaged bio-optoelectronic chip having a plurality of reaction chambers in which a plurality of the samples are contained and to make electrical contact to a plurality of pins on the packaged chip so as to receive a plurality of electrical signals generated by photodetectors at the plurality of reaction chambers. The instrument may further include a compact beam-steering assembly configured to steer the optical pulses from the laser diode to the bio-optoelectronic chip and to automatically maintain alignment of the optical pulses to an optical coupler on the bio-optoelectronic chip. The instrument may further include an alignment structure that enables accurate alignment of optical and electronic components within the instrument as well as accurate alignment and registration of the bio-optoelectronic chip to optical components in the instrument.

The foregoing and other aspects, implementations, acts, functionalities, features and, embodiments of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the invention may be shown exaggerated or enlarged to facilitate an understanding of the invention. In the drawings, like reference characters generally refer to like features, functionally similar and/or structurally similar elements throughout the various figures. The drawings are not necessarily to scale, emphasis instead being placed upon illustrating the principles of the teachings. The drawings are not intended to limit the scope of the present teachings in any way.

FIG. 1-2 depicts a train of optical pulses, according to some embodiments.

FIG. 1-3 depicts an example of parallel reaction chambers that may be excited optically by a pulsed laser via one or more waveguides and corresponding detectors for each chamber, according to some embodiments.

FIG. 1-4 illustrates optical excitation of a reaction chamber from a waveguide, according to some embodiments.

FIG. 1-5 depicts further details of an integrated reaction chamber, optical waveguide, and time-binning photodetector, according to some embodiments.

FIG. 1-6 depicts an example of a biological reaction that may occur within a reaction chamber, according to some embodiments.

FIG. 1-7 depicts emission probability curves for two different fluorophores having different decay characteristics.

FIG. 1-8 depicts time-binning detection of fluorescent emission, according to some embodiments.

FIG. 1-9 depicts a time-binning photodetector, according to some embodiments.

FIG. 1-10A depicts pulsed excitation and time-binned detection of fluorescent emission from a sample, according to some embodiments.

FIG. 1-10B depicts a histogram of accumulated fluorescent photon counts in various time bins after repeated pulsed excitation of a sample, according to some embodiments.

FIG. 1-11A-1-11D depict different histograms that may correspond to the four nucleotides (T, A, C, G) or nucleotide analogs, according to some embodiments.

FIG. 2-1A illustrates optical pump and output pulses for gain switching, according to some embodiments.

FIG. 2-1B illustrates relaxation oscillations, according to some embodiments.

FIG. 2-1C depicts an optical output pulse showing a tail, according to some embodiments.

FIG. 2-2A depicts a pulsed semiconductor laser diode, according to some embodiments.

FIG. 2-2B depicts a simplified circuit schematic for a gain-switched laser diode, according to one embodiment.

FIG. 2-2C illustrates improvements in current delivered to a laser diode, according to some embodiments.

FIG. 2-3 depicts a pulse-driving circuit, according to some embodiments.

FIG. 2-4A depicts a pulse generator, according to some embodiments.

FIG. 2-4B depicts waveforms that may be received at a logic gate of a pulse generator and an output pulse waveform, according to some embodiments.

FIG. 2-4C depicts a pulse generator, according to some embodiments.

FIG. 2-5A depicts a first stage of a diode-driver circuit, according to some embodiments.

FIG. 2-5B depicts a second stage of a diode-driver circuit, according to some embodiments.

FIG. 2-5C depicts a third stage of a diode-driver circuit, according to some embodiments.

FIG. 2-6 depicts an output pulse of a gain-switched laser diode, according to some embodiments.

FIG. 3-1A depicts a perspective view of an alignment structure for a hand-held bioanalytic instrument, according to some embodiments.

FIG. 3-1B depicts a bottom-side perspective view of an alignment structure for a hand-held bioanalytic instrument, according to some embodiments.

FIG. 3-2A depicts a layout for an optical system of a bioanalytic instrument, according to some embodiments.

FIG. 3-2B depicts examples of a turning mirror mount and lens mount.

FIG. 3-3 depicts a beam-steering assembly for a bioanalytic instrument, according to some embodiments.

FIG. 3-4A depicts a pulsed source board, according to some embodiments.

FIG. 3-4B depicts aspects of a pulsed optical source and thermal conductive element, according to some embodiments.

FIG. 3-5 illustrates an inductive sensor, according to some embodiments.

FIG. 3-6A illustrates Y-to-X coupling of a gimbal mount in a beam-steering assembly, according to some embodiments.

FIG. 3-6B illustrates X-to-Y coupling of a gimbal mount in a beam-steering assembly, according to some embodiments.

FIG. 3-7 depicts a board reinforcing member attached to a printed circuit board, according to some embodiments.

FIG. 3-8 illustrates long-term stability of a beam-steering assembly using inductive sensors, according to some embodiments.

FIG. 3-9A is a close-up view of a chip guide formed in a registration platform of the alignment structure, according to some embodiments.

FIG. 3-9B depicts a bottom-side view of an interposer that is placed into the chip guide of FIG. 3-9A.

FIG. 3-10A depicts an arrangement of components in a hand-held, bio-optoelectronic instrument, according to some embodiments.

FIG. 3-10B depicts another arrangement of components in a hand-held, bio-optoelectronic instrument, according to some embodiments.

FIG. 3-10C depicts an arrangement of components in a hand-held, bio-optoelectronic instrument, according to some embodiments.

FIG. 4-1 depicts alignment of a pulsed-laser beam to an optical coupler on a bio-optoelectronic chip, according to some embodiments.

FIG. 4-2 depicts detection and control circuitry for coupling optical pulses from a pulsed laser diode into multiple waveguides of a bio-optoelectronic chip, according to some embodiments.

FIG. 4-3 depicts acts associated with methods of coupling optical pulses from a pulsed laser diode into multiple waveguides of a bio-optoelectronic chip, according to some embodiments.

Figure 1:
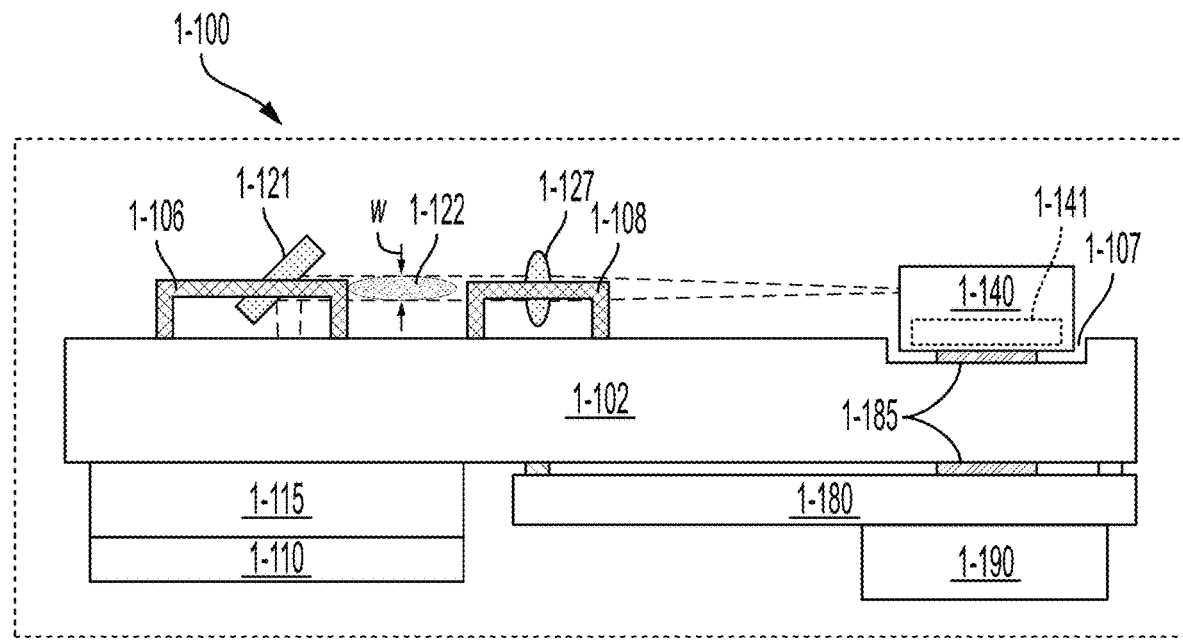
FIG. 1-1 is a simplified depiction of components and their arrangement in a hand-held, bio-optoelectronic instrument, according to some embodiments.

The features and advantages of the present invention will become more apparent from the detailed description set forth below when taken in conjunction with the drawings. When describing embodiments in reference to the drawings, directional references ("above," "below," "top," "bottom," "left," "right," "horizontal," "vertical," etc.) may be used. Such references are intended merely as an aid to the reader viewing the drawings in a normal orientation. These directional references are not intended to describe a preferred or only orientation of features of an embodied device. A device may be embodied using other orientations.

DETAILED DESCRIPTION

I. Introduction

The inventors have recognized and appreciated that a hand-held instrument capable of massively-parallel sample analyses may be highly useful for point-of-care services such as patient specimen analysis or genetic sequencing for viruses or other living organisms. If such an instrument can be compact, easy to carry, and easy to operate, a physician or assistant may readily use one in an office or take the instrument into the field if caring for patients in remote locations. According to some embodiments, a user with minimal training (e.g., video or on-line guidance or guidance by a physician) may operate the hand-held instrument. Results may be interpreted by physician (whether during an office visit or on-line consult) or by an on-line resource. Although a hand-held instrument may facilitate testing and analysis, making a massively-parallel, bioanalytic instrument compact has several significant challenges.

Preferably, an instrument capable of massively-parallel sample analyses should be able to handle tens of thousands of samples simultaneously or more. In some implementations, a hand-held instrument may handle a larger number of samples simultaneously. The inventors have recognized and appreciated that to achieve this number of samples in a compact instrument, the sample wells or reaction chambers should be integrated onto a chip that can be interchanged within the instrument. Additionally, the inventors have recognized and appreciated that excitation light should be delivered to the reaction chambers using integrated optics formed on the chip to improve uniformity of illumination of the reaction chambers and reduce a large number of external optical components that might otherwise be needed. Further, the inventors have recognized and appreciated that fluorescent emissions from the reaction chambers would preferably be detected on the same chip with integrated photodetectors at each reaction chamber to improve detection efficiency and reduce the number of light-collection components that might otherwise be needed. Also, the inventors have recognized and appreciated that it is preferable to have a pulsed excitation source that turns off quickly (e.g., in less than 500 ps from a peak value), so that emission signals from the reaction chambers can be detected at a time after excitation when there is sufficient fluorescent light level to be detected without being overwhelmed (e.g., saturated) by excitation light. For example, it is preferable that detection of fluorescent light occur at a time when a photodetector is not saturated by excitation light. These conditions relating to a bio-optoelectronic chip can impose significant constraints on a hand-held instrument.

Some constraints relate to the optical source. It should be compact, yet capable of delivering enough optical power (e.g., between about 2 mW and about 6 mW) to sufficiently excite specimens in tens of thousands of reaction chambers. At higher power levels with more powerful or multiple optical sources, more reaction chambers may be illuminated in a hand-held instrument, e.g., up to one million reaction chambers. There should also be compact drive circuitry that can produce short optical pulses (e.g., pulse durations not greater than about 100 ps) with turn-off times of at most 500 ps to a level of at least 40 dB below the pulse peak, for example. Additionally, for reasonable data acquisition times, the optical pulses should be provided at repetition rates between about 50 MHz and about 200 MHz, for example. In some embodiments, different power levels, pulse durations, turn-off dynamics, and pulse repetition rates may be used. In some cases, pulse repetition rates as low as 10 MHz may be used.

Additional constraints relate to obtaining and maintaining accurate alignment of output pulses from the optical source to the bio-optoelectronic chip in a compact package that does not require operation by a skilled technician. For example, an output beam from the optical source may need to be aligned to an optical coupler on the bio-optoelectronic chip with micron-level accuracy and maintained at an aligned position with micron-level precision over periods of hours. Additionally, an incident angle of the beam of optical pulses onto the optical coupler may need to be aligned to sub-one-degree accuracy and maintained for hours. Also, the beam spot size on the optical coupler should be stable to less than 5% variations for hours. Further, the excitation wavelength from the optical source should remain stable to within 2 nm for hours.

Further constraints relate to temperature control within the instrument. For example, it may be necessary to dissipate heat generated by drive electronics and the optical source, so that the heat does not adversely affect optical alignment or pulsed operation of the instrument. Also for some specimens, such as genomes, it may be necessary to maintain a desired temperature of the samples in the reaction chambers so that reactions will proceed. In some cases, it may be necessary to control a temperature of the laser diode, e.g., using a thermo-electric cooler and/or a heat dissipating component (such as fins), placed in thermal contact with the laser diode. Thermal control of the laser diode may prolong the laser diode's lifetime and may stabilize and control the emission wavelength from the laser diode. Since the instrument may be used in the field, thermal control and heat dissipation may need to accommodate a wide range of ambient environments.

An additional challenge relates to distinguishing different emissions from the reaction chambers that signal different characteristics of different specimens. For example, in some bioanalytic applications, such as genetic sequencing or massively-parallel assays, optical excitation energy from the optical source is delivered to a plurality of reaction chambers that may contain specimens that undergo multiple biochemical reactions over a period of time. According to some embodiments, the specimens (or molecules interacting with the specimens) may be labeled with one or more fluorophores that fluoresce(s), or the specimens may fluoresce themselves, following excitation. Detection and analysis of fluorescent emission from the reaction chambers provides information about the specimens within the chambers. When there are different types of specimens or reactants that can enter a reaction chamber at different times, there must be some way to distinguish the different types of specimens or reactants that are preferably excited with the same optical source (i.e., optical pulses having a same characteristic wavelength).

The inventors have conceived of apparatus and methods for making and operating a compact, hand-held, bio-optoelectronic instrument capable of massively parallel sample analyses. In overview and according to some embodiments, the instrument comprises a short-wavelength laser diode and associated drive circuitry, a compact beam steering and shaping module, a temperature-controlled receptacle for a packaged bio-optoelectronic chip, and an alignment structure that provides accurate registration for optical and electrical components in the instrument as well as provides heat dissipation functionality. The alignment structure can also form part of the instrument's enclosure, allowing heat to be dissipated directly to the exterior of the instrument.

For applications such as genetic sequencing, the instrument can distinguish at least four different types of specimens or reactants using optical excitation pulses having a same characteristic wavelength. Other applications, such as drug, virus, or pathogen detection, may not require distinguishing at least four different types of specimens, and identification of less than four different types of specimens may be sufficient. The instrument can also be adapted to deliver optical excitation pulses having multiple different characteristic wavelengths to allow for detection of up to four or more different types of specimens.

Before describing details of selected instrument components, an overview is provided of the instrument in the context of genetic sequencing. Although genetic sequencing is used for explanatory purposes, the instrument may be used for various types of biochemical assays in other embodiments.

In overview and referring now to FIG. 1-1, a hand-held, bioanalytic instrument 1-100 may comprise a pulsed source board 1-110, a compact beam-steering and shaping assembly 1-115, and an alignment structure 1-102 having a receptacle guide 1-107 into which a packaged bio-optoelectronic chip 1-140 may be mounted. The instrument may further include a turning mirror 1-121, a focusing lens 1-127, one or more thermal posts 1-185, a control board 1-180, and a heat sinking element 1-190. The turning mirror 1-121 may be mounted in an adjustable mirror mount 1-106 that attaches to the platform 1-102, and the focusing lens 1-127 may also be mounted in an adjustable lens mount 1-108 that attaches to the platform 1-102. The pulsed source board 1-110, compact beam-steering and shaping assembly 1-115, turning mirror 1-121, focusing lens 1-127, and packaged bio-optoelectronic chip 1-140 may all register to the alignment structure 1-102 to provide accurate and stable optical alignment of an optical beam (indicated by dashed lines) from the pulsed source board 1-110 to optical components of the packaged bio-optoelectronic chip 1-140.

In operation, optical pulses 1-122 from the pulsed source board 1-110 may be directed and focused onto an optical coupler (not shown) located on a bio-optoelectronic chip 1-141 contained within the packaged bio-optoelectronic chip 1-140. The chip's package may include features that aid in optical beam alignment (e.g., a turning mirror) and sample retention. Integrated photonic components on the bio-optoelectronic chip 1-141 may divide and deliver excitation radiation from each received optical pulse to tens of thousands of reaction chambers located on the bio-optoelectronic chip 1-141. At the reaction chambers, the excitation radiation may excite fluorophores or specimens to be analyzed, and signals resulting from the excitations may be detected by photodetectors at each reaction chamber. The detected signals may or may not be partially processed on the bio-optoelectronic chip 1-141. The signals may be transmitted to the control board 1-180 for data storage and data processing and/or transmission to an external device. In some implementations, the signals (raw or processed) may be transmitted to a network of computing devices, such as the internet, where the data may be routed to a server that is configured to analyze the data.

Although the optical pulses 1-122 are depicted in FIG. 1-1 as having a single transverse optical mode, in some embodiments the optical output from the pulsed source board 1-110 may have a multimode transverse profile. For example, a transverse intensity profile of the output beam may have multiple intensity peaks and minima. In some embodiments, a transverse multimodal output may be homogenized (e.g., by diffusing optics) when coupled to the bio-optoelectronic chip 1-141. In some implementations, a multimodal output may be coupled to a plurality of waveguides in the bio-optoelectronic chip 1-141. For example, each intensity peak in a multimodal output may be coupled to a separate waveguide or separate group of waveguides on the bio-optoelectronic chip 1-141. Allowing a pulsed laser to operate in a multi-transverse mode state may enable higher output powers from the pulsed laser. Coupling the different transverse modes to different waveguides on the chip 1-141 may avoid optical degradation of the chip that might otherwise occur at higher optical intensities if all the power were coupled into a single waveguide.

Figures 1, 2:
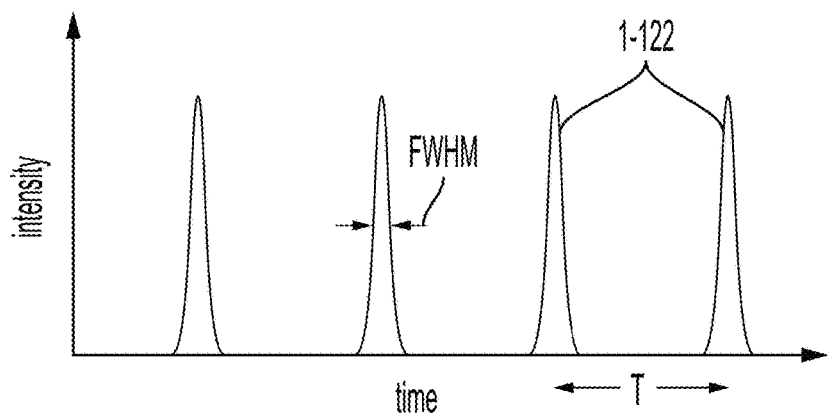

FIG. 1-2 depicts temporal intensity profiles of a train of optical pulses 1-122 that may be produced by the pulsed source board 1-110. In some embodiments, the peak intensity values of the emitted pulses may be approximately equal, and the profiles may have a Gaussian-like temporal profile. In some cases, the pulses 1-122 may not have symmetric temporal profiles and may have other temporal shapes. The duration of each pulse may be characterized by a full-width-half-maximum (FWHM) value, as indicated in FIG. 1-2. According to some embodiments of a pulsed laser, the optical pulses 1-122 may have FWHM values between 50 picoseconds (ps) and 200 ps. In some implementations, pulse durations up to 1 nanosecond may be used, e.g., when fluorophore lifetimes and/or excitation wavelength filtering permit longer excitation periods.

The optical pulses 1-122 may be separated by regular intervals T. According to some embodiments, the pulse-separation interval T may be between about 1 ns and about 100 ns. In some cases, the pulse-separation interval T may be between about 5 ns and about 20 ns. The pulse-separation interval T may be determined by a driving frequency $f_d$ that is used to pulse an optical source on the pulsed source board 1-110.

According to some embodiments, a desired pulse-separation interval T and driving frequency $f_d$ may be determined by a combination of the number of reaction chambers on the chip 1-141, fluorescent emission characteristics, and the speed of data-handling circuitry for reading data from the bio-optoelectronic chip 1-141. The inventors have recognized and appreciated that different fluorophores may be distinguished by their different fluorescent decay rates. Accordingly, there needs to be sufficient pulse-separation interval T to collect adequate statistics for the selected fluorophores to distinguish between their different decay rates. Additionally, if the pulse-separation interval T is too short, the data handling circuitry in the bioanalytic instrument 1-100 cannot keep up with the large amount of data being collected by the large number of reaction chambers. The inventors have recognized and appreciated that a pulse-separation interval T between about 5 ns and about 20 ns is suitable for fluorophores that have decay rates of about 2 ns and for handling data from between about 30,000 and 600,000 reaction chambers. Longer decay rates (e.g., up to about 7 ns) may require longer pulse-separation intervals (e.g., between about 15 ns and about 30 ns), according to some embodiments.

Figures 1, 2, 3:
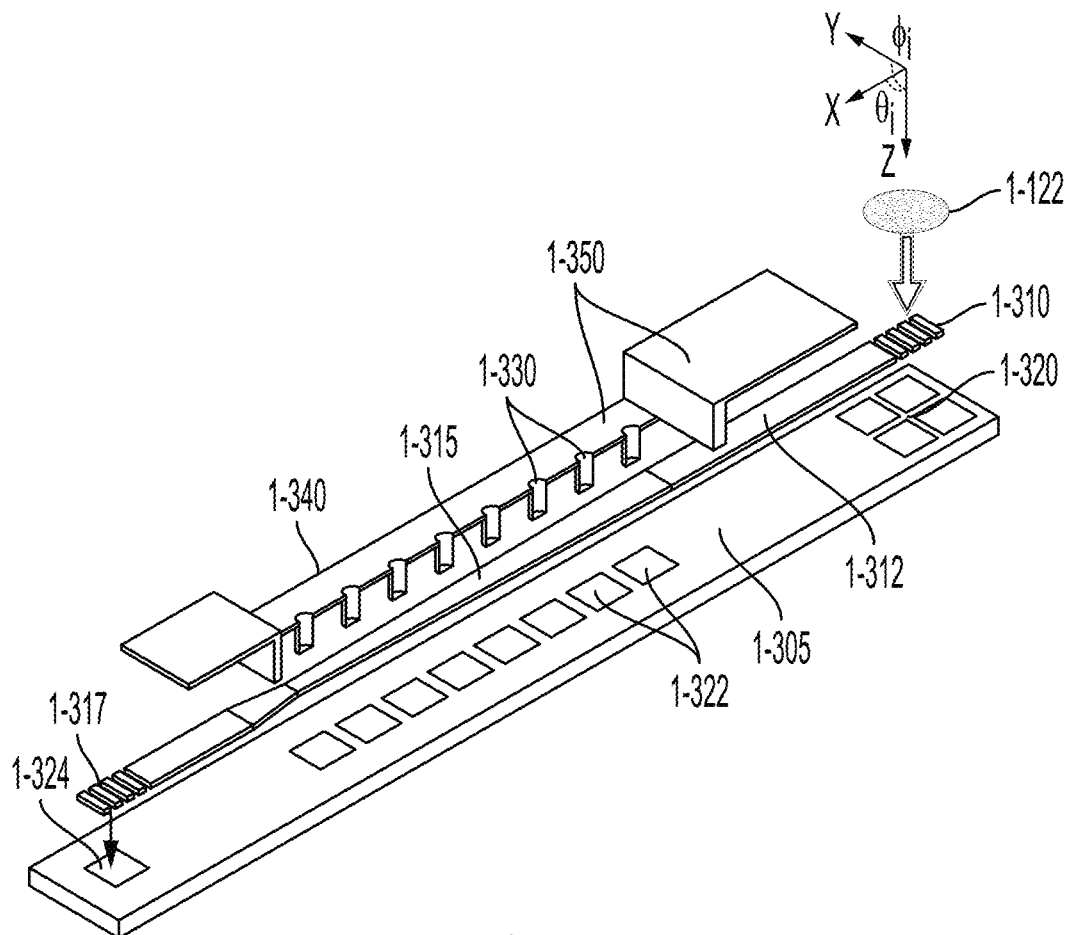

Referring to FIG. 1-3, the optical pulses 1-122 may be coupled into one or more optical waveguides 1-312 on the bio-optoelectronic chip 1-141. The waveguide(s) 1-312 may run adjacent to a plurality of reaction chambers 1-330 and deliver optical excitation energy to the reaction chambers. In some embodiments, the optical pulses 1-122 may be coupled to one or more waveguides 1-312 via a grating coupler 1-310, though coupling to an end of an optical waveguide on the bio-optoelectronic chip may be used in some cases. According to some embodiments, a quad detector 1-320 may be located on a semiconductor substrate 1-305 (e.g., a silicon substrate) near the grating coupler 1-310 for aiding in alignment of the beam of optical pulses 1-122 to the grating coupler 1-310. In some implementations, one or more photodetectors 1-322 may be used to sense excitation radiation and aid in alignment of the beam of optical pulses 1-122 to the grating coupler 1-310. The one or more waveguides 1-312 and reaction chambers 1-330 may be integrated on the same semiconductor substrate with intervening dielectric layers (e.g., silicon dioxide layers, not shown) between the substrate, waveguide, reaction chambers, and photodetectors 1-322.

Each waveguide 1-312 may include a tapered portion 1-315 below the reaction chambers 1-330 to equalize optical power coupled to the reaction chambers along the waveguide. The reducing taper may force more optical energy outside the waveguide's core, increasing coupling to the reaction chambers and compensating for optical losses along the waveguide, including losses for light coupling into the reaction chambers. A second grating coupler 1-317 may be located at an end of each waveguide to direct optical energy to an integrated photodiode 1-324. The integrated photodiode may detect an amount of power coupled down a waveguide and provide an electrical signal to feedback circuitry that controls the beam-steering module 1-115, for example.

The reaction chambers 1-330 may be aligned with the tapered portion 1-315 of the waveguide and recessed in a tub 1-340. There may be photodetectors 1-322 (e.g., time-binning photodetectors or single-photon avalanche photodiodes) located on the semiconductor substrate 1-305 for each reaction chamber 1-330. A sample analysis pixel may comprise a single reaction chamber 1-330 in which a sample is to be analyzed, a portion of waveguide 1-312 that delivers excitation light to the reaction chamber, and a corresponding photodetector 1-322 arranged to receive fluorescent emission from the reaction chamber. A metal coating and/or multilayer coating 1-350 may be formed around the reaction chambers and above the waveguide to prevent optical excitation of fluorophores that are not in the reaction chambers (e.g., dispersed in a solution above the reaction chambers). The metal coating and/or multilayer coating 1-350 may be raised beyond edges of the tub 1-340 to reduce absorptive losses of the optical energy in the waveguide 1-312 at the input and output ends of each waveguide. In some implementations, a multilayer optical structure may be formed above each photodetector 1-322 and configured to preferentially attenuate excitation radiation over emission from the fluorophores.

There may be a plurality of rows of waveguides 1-312, reaction chambers 1-330, and photodetectors 1-322 on the bio-optoelectronic chip 1-141. For example, there may be 64 rows, each having 512 reaction chambers, for a total of 32,768 reaction chambers in some implementations. Other implementations may include fewer or more reaction chambers, and may include other layout configurations. Optical power from the pulsed source board 1-110 may be distributed to the multiple waveguides 1-312 via one or more star couplers or multimode interference couplers (not shown), or by any other means, located between an optical coupler 1-310 and the plurality of waveguides 1-312.

FIG. 1-4 illustrates optical energy coupling from an optical pulse 1-122 within a waveguide 1-315 to a reaction chamber 1-330, according to some embodiments. The drawing has been produced from an electromagnetic field simulation of the optical wave that accounts for waveguide dimensions, reaction chamber dimensions, the different materials' optical properties, and the distance of the waveguide 1-315 from the reaction chamber 1-330. The waveguide may be formed from silicon nitride in a surrounding medium 1-410 of silicon dioxide, for example. The waveguide, surrounding medium, and reaction chamber may be formed by microfabrication processes described in U.S. application Ser. No. 14/821,688, filed Aug. 7, 2015, titled "Integrated Device for Probing, Detecting and Analyzing Molecules". According to some embodiments, an evanescent optical field 1-420 couples optical energy transported by the waveguide to the reaction chamber 1-330.

A non-limiting example of a biological reaction taking place in a reaction chamber 1-330 is depicted in FIG. 1-5, though other reactions or specimens may be used in other applications. In this example, sequential incorporation of nucleotides or nucleotide analogs into a growing strand 1-512 that is complementary to a target nucleic acid 1-510 is taking place in the reaction chamber 1-330. Single-molecule detection can be employed to detect the sequential incorporation and sequence the DNA. Although single-molecule detection is described below in the context of DNA sequencing, single-molecule detection can be employed using the apparatus and methods described herein for other applications, such as the detection of proteins for proteomic studies. Detection of proteins may employ protein-capture, slow off-rate modified aptamer reagents that are constructed with modified nucleotides, as described in a technical white paper titled "SOMAscan™ Proteomic Assay," distributed by SomaLogic, Inc. (2013), Doc. No. SSM-002, DCN 13-038, which document is incorporated herein by reference in its entirety. For example, remaining aptamer reagents from a final elution step in an assay can be quantified using DNA quantification techniques in the reaction chambers 1-330. Additionally or alternatively, the apparatus and methods described herein can be used to carry out massively parallel metabolic assays. For example, in some implementations, a bioanalytic instrument 1-100 can receive data from a packaged bio-optoelectronic chip 1-140 installed in the instrument, and analyze the data to determine information about DNA (e.g., DNA sequence and/or quantification information). In some cases, a bioanalytic instrument 1-100 can receive data from a packaged bio-optoelectronic chip 1-140 installed in the instrument, and analyze the data to determine information about proteins in the reaction chambers 1-330. In some embodiments, a bioanalytic instrument 1-100 can receive data from a packaged bio-optoelectronic chip 1-140 installed in the instrument, and analyze the data to determine information about metabolic reactions.

The reaction chamber may have a depth between about 150 nm and about 250 nm and a diameter between about 80 nm and about 160 nm. A metallization layer 1-540 (e.g., a metallization for an electrical reference potential) may be patterned above the photodetector to provide an aperture that blocks stray light from adjacent reaction chambers and other unwanted, off-axis light sources. According to some embodiments, polymerase 1-520 may be located within the reaction chamber 1-330 (e.g., attached to a base of the chamber). The polymerase may take up a target nucleic acid 1-510 (e.g., a portion of nucleic acid derived from DNA), and sequence a growing strand of complementary nucleic acid to produce a growing strand of DNA 1-512. Nucleotides or nucleotide analogs 1-610 (depicted in FIG. 1.6) labeled with different fluorophores may be dispersed in a solution above the reaction chamber 1-330 and enter the reaction chamber.

When a labeled nucleotide or nucleotide analog 1-610 is incorporated into a growing strand of complementary nucleic acid, as depicted in FIG. 1-6, one or more attached fluorophores 1-630 may be repeatedly excited by pulses of optical energy coupled into the reaction chamber 1-330 from the waveguide 1-315. In some embodiments, the fluorophore or fluorophores 1-630 may be attached to one or more nucleotides or nucleotide analogs 1-610 with any suitable linker 1-620. An incorporation event may last for a period of time up to about 100 ms. During this time, pulses of fluorescent emission resulting from excitation of the fluorophore(s) may be detected with a photodetector 1-322. By attaching fluorophores with different emission characteristics (e.g., fluorescent decay rates, intensity, fluorescent wavelength) to the different nucleotides (A,C,G,T), detecting and distinguishing the different emission characteristics while the strand of DNA 1-512 incorporates each nucleic acid enables determination of the genetic sequence of the growing strand of DNA.

According to some embodiments, a bioanalytic instrument 1-100 configured to analyze samples based on fluorescent emission characteristics may detect differences in fluorescent lifetimes and/or intensities between different fluorescent molecules, and/or differences between lifetimes and/or intensities of the same fluorescent molecules in different environments. By way of explanation, FIG. 1-7 plots two different fluorescent emission probability curves (A and B), which may be representative of fluorescent emission from two different fluorescent molecules, for example. With reference to curve A (dashed line), after being excited by a short or ultrashort optical pulse, a probability $p_A(t)$ of a fluorescent emission from a first molecule may decay with time, as depicted. In some cases, the decrease in the probability of a photon being emitted over time may be represented by an exponential decay function $p_A(t)=P_{Ao}e^{-t/\tau_1}$, where $P_{Ao}$ is an initial emission probability and $\tau_1$ is a temporal parameter associated with the first fluorescent molecule that characterizes the emission decay probability. $\tau_1$ may be referred to as the "fluorescence lifetime," "emission lifetime," or "lifetime" of the first fluorescent molecule. In some cases, the value of $\tau_1$ may be altered by a local environment of the fluorescent molecule. Other fluorescent molecules may have different emission characteristics than that shown in curve A. For example, another fluorescent molecule may have a decay profile that differs from a single exponential decay, and its lifetime may be characterized by a half-life value or some other metric.

A second fluorescent molecule may have a decay profile that is exponential, but has a measurably different lifetime $\tau_2$, as depicted for curve B in FIG. 1-7. In the example shown, the lifetime for the second fluorescent molecule of curve B is shorter than the lifetime for curve A, and the probability of emission is higher sooner after excitation of the second molecule than for curve A. Different fluorescent molecules may have lifetimes or half-life values ranging from about 0.1 ns to about 20 ns, in some embodiments.

The inventors have recognized and appreciated that differences in fluorescent emission lifetimes can be used to discern between the presence or absence of different fluorescent molecules and/or to discern between different environments or conditions to which a fluorescent molecule is subjected. In some cases, discerning fluorescent molecules based on lifetime (rather than emission wavelength, for example) can simplify aspects of a bioanalytic instrument 1-100. As an example, wavelength-discriminating optics (such as wavelength filters, dedicated detectors for each wavelength, dedicated pulsed optical sources at different wavelengths, and/or diffractive optics) may be reduced in number or eliminated when discerning fluorescent molecules based on lifetime. In some cases, a single pulsed optical source operating at a single characteristic wavelength may be used to excite different fluorescent molecules that emit within a same wavelength region of the optical spectrum but have measurably different lifetimes. A bioanalytic system that uses a single pulsed optical source, rather than multiple sources at different wavelengths, to excite and discern multiple different fluorescent molecules emitting in a same wavelength region can be less complex to operate and maintain, more compact, and may be manufactured at lower cost.

Although analytic systems based on fluorescent lifetime analysis may have certain benefits, the amount of information obtained by an analytic system and/or detection accuracy may be increased by allowing for additional detection techniques. For example, some bioanalytic systems 1-100 may additionally be configured to discern one or more properties of a sample based on fluorescent wavelength and/or fluorescent intensity.

Referring again to FIG. 1-7, according to some embodiments, different fluorescent lifetimes may be distinguished with a photodetector 1-322 that is configured to time-bin fluorescent emission events following excitation of a fluorescent molecule. The time binning may occur during a single charge-accumulation cycle for the photodetector 1-322. A charge-accumulation cycle is an interval between read-out events during which photo-generated carriers are accumulated in bins of the time-binning photodetector. The concept of determining fluorescent lifetime by time-binning of emission events is introduced graphically in FIG. 1-8. At an excitation time $t_e$ just prior to time $t_1$, a fluorescent molecule or ensemble of fluorescent molecules of a same type (e.g., the type corresponding to curve B of FIG. 1-7) is (are) excited by a short or ultrashort optical pulse. For a large ensemble of molecules, the intensity of emission may have a time profile similar to curve B, as depicted in FIG. 1-8.

For a single molecule or a small number of molecules, however, the emission of fluorescent photons occurs according to the statistics of curve B in FIG. 1-7, for this example. A time-binning photodetector 1-322 may accumulate carriers generated from emission events into discrete time bins (three indicated in FIG. 1-8) that are temporally resolved with respect to the excitation time of the fluorescent molecule(s). For example, a first bin (bin 1) may record emission events that occur between time $t_1$ and time $t_2$. A second bin (bin 2) may record emission events that occur between time $t_2$ and time $t_3$, and a third bin (bin 3) may record emission events that occur between time $t_3$ and time $t_4$. More or fewer bins can be used in other embodiments.

When a large number of emission events are summed, the resulting time bins may approximate the decaying intensity curve shown in FIG. 1-8, and the binned signals can be used to distinguish between different fluorescent molecules or different environments in which a fluorescent molecule is located. In some embodiments, the binned signals can be used to distinguish between different biochemical and biomechanical degrees of freedom.

Example embodiments of a time-binning photodetector 1-322 are described in U.S. patent application Ser. No. 14/821,656, filed Aug. 7, 2015, titled "Integrated Device for Temporal Binning of Received Photons" and in U.S. patent application Ser. No. 15/852,571, filed Dec. 22, 2017, titled "Integrated Photodetector with Direct Binning Pixel," which are both incorporated herein by reference in their entirety. For explanation purposes, a non-limiting embodiment of a time-binning photodetector is depicted in FIG. 1-9. A single time-binning photodetector 1-322 can comprise a photon-absorption/carrier-generation region 1-902, a carrier-discharge channel 1-906, and a plurality of carrier-storage bins 1-908a, 1-908b all formed on a semiconductor substrate. Carrier-transport channels 1-907 can connect between the photon-absorption/carrier-generation region 1-902 and carrier-storage bins 1-908a, 1-908b. In the illustrated example, two carrier-storage bins are shown, but there may be more or fewer. There can be a read-out channel 1-910 connected to the carrier-storage bins. The photon-absorption/carrier-generation region 1-902, carrier-discharge channel 1-906, carrier-storage bins 1-908a, 1-908b, and read-out channel 1-910 can be formed by doping the semiconductor locally and/or forming adjacent insulating regions to provide photodetection capability, confinement, and transport of carriers. A time-binning photodetector 1-322 can also include a plurality of electrodes 1-920, 1-921, 1-922, 1-923, 1-924 formed on the substrate that are configured to generate electric fields in the device for transporting carriers through the device.

In operation, a portion of an excitation pulse 1-122 from a pulsed optical source 1-108 (e.g., a mode-locked laser) is delivered to a sample well 1-330 over the time-binning photodetector 1-322. Initially, some excitation radiation photons 1-901 may arrive at the photon-absorption/carrier-generation region 1-902 and produce carriers (shown as light-shaded circles). There can also be some fluorescent emission photons 1-903 that arrive with the excitation radiation photons 1-901 and produce corresponding carriers (shown as dark-shaded circles). Initially, the number of carriers produced by the excitation radiation can too large compared to the number of carriers produced by the fluorescent emission. The initial carriers produced during a time interval $|t_e-t_1|$ can be rejected by gating them into a carrier-discharge channel 1-906 with a first electrode 1-920, for example.

At a later times mostly fluorescent emission photons 1-903 arrive at the photon-absorption/carrier-generation region 1-902 and produce carriers (indicated a dark-shaded circles) that provide useful and detectable signal that is representative of fluorescent emission from the sample well 1-330. According to some detection methods, a second electrode 1-921 and third electrode 1-923 can be gated at a later time to direct carriers produced at a later time (e.g., during a second time interval $|t_1-t_2|$) to a first carrier-storage bin 1-908a. Subsequently, a fourth electrode 1-922 and fifth electrode 1-924 can be gated at a later time (e.g., during a third time interval $|t_2-t_3|$) to direct carriers to a second carrier-storage bin 1-908b. Charge accumulation can continue in this manner after excitation pulses for a large number of excitation pulses to accumulate an appreciable number of carriers and signal level in each carrier-storage bin 1-908a, 1-908b. At a later time, the signal can be read out from the bins. In some implementations, the time intervals corresponding to each storage bin are at the sub-nanosecond time scale, though longer time scales can be used in some embodiments (e.g., in embodiments where fluorophores have longer decay times). In this example, only two time bins are used.

The process of generating and time-binning carriers after an excitation event (e.g., excitation pulse from a pulsed optical source) can occur once after a single excitation pulse or be repeated multiple times after multiple excitation pulses during a single charge-accumulation cycle for the time-binning photodetector 1-322. After charge accumulation is complete, carriers can be read out of the storage bins via the read-out channel 1-910. For example, an appropriate biasing sequence can be applied to electrodes 1-923, 1-924 and at least to electrode 1-940 to remove carriers from the storage bins 1-908a, 1-908b. The charge accumulation and read-out processes can occur in a massively parallel operation on the optoelectronic chip 1-140 resulting in frames of data.

Although the described example in connection with FIG. 1-9 includes multiple charge storage bins 1-908a, 1-908b in some cases a single charge storage bin may be used instead. For example, only bin 1 may be present in a time-binning photodetector 1-322. In such a case, a single storage bins 1-908a can be operated in a variable time-gated manner to look at different time intervals after different excitation events. For example, after pulses in a first series of excitation pulses, electrodes for the storage bin 1-908a can be gated to collect carriers generated during a first time interval (e.g., during the second time interval $|t_1-t_2|$), and the accumulated signal can be read out after a first predetermined number of pulses. After pulses in a subsequent series of excitation pulses at the same sample well, the same electrodes for the storage bin 1-908a can be gated to collect carriers generated during a different interval (e.g., during the third time interval $|t_2-t_3|$), and the accumulated signal can be read out after a second predetermined number of pulses. Carriers could be collected during later time intervals in a similar manner if needed. In this manner, signal levels corresponding to fluorescent emission during different time periods after arrival of an excitation pulse at a sample well can be produced using a single carrier-storage bin.

In some implementations, each photodetector 1-322 may comprise a single-photon avalanche photodiode (SPAD) in an array of such photodiodes. A SPAD can sense the arrival of a single photon and operate at high speeds (e.g., sub-nanosecond time scales). In some embodiments, each SPAD may signal the arrival of individual fluorescent photons, and indicate a time of occurrence of the emission event (e.g., with respect to the time of the excitation optical pulse). The times of occurrences of emission events may be binned in time bins during data acquisition for comparison with emission statistics or reference values.

After a number of excitation events, the accumulated signal in each time bin may be read out to provide a histogram having corresponding bins that represent the fluorescent emission decay rate and/or intensity, for example. Such a process is illustrated in FIG. 1-10A and FIG. 1-10B. The histogram's bins may indicate a number of photons detected during each time interval after excitation of the fluorophore(s) in a reaction chamber. In some embodiments, signals for the bins will be accumulated following a large number of optical excitation pulses, as depicted in FIG. 1-10A. The excitation pulses may occur at times $t_{e1}$, $t_{e2}$, $t_{e3}$, ... $t_{eN}$ which are separated by the pulse interval time T. There may be between $10^5$ and $10^7$ optical excitation pulses applied to the reaction chamber during an accumulation of signals in the electron-storage bins. In some embodiments, one bin (bin 0) may be configured to detect an amplitude of excitation energy delivered with each optical pulse, and be used as a reference signal (e.g., to normalize data). In some implementations, a reference bin (bin 0) may not be used.

In some implementations, only a single photon on average may be emitted from a fluorophore following an excitation event, as depicted in FIG. 1-10A. After a first excitation event at time $t_{e1}$, the emitted photon at time $t_{f1}$ may occur within a first time interval, so that the resulting electron signal is accumulated in a first electron-storage bin, for example (contributes to bin 1). In a subsequent excitation event at time $t_{e2}$, the emitted photon at time $t_{f2}$ may occur within a second time interval, so that the resulting electron signal contributes to bin 2.

After a large number of excitation events and signal accumulations, the electron-storage bins of a time-binning photodetector 1-322, for example, may be read out to provide a multi-valued signal (e.g., a histogram of two or more values, an N-dimensional vector, etc.) for a reaction chamber. The signal values for each bin may depend in part upon the decay rate of the fluorophore and may also depend upon the impulse response of the relevant photodetector 1-322. For example and referring again to FIG. 1-8, a fluorophore having a decay curve B will have a higher ratio of signal in bin 1 to bin 2 than a fluorophore having a decay curve A. In some embodiments, the signal values for each bin may further depend on the impulse response of the photodetector. The values from the bins may be analyzed and compared against calibration values, threshold values, and/or each other, to determine an identity of the particular fluorophore, which in turn identifies the nucleotide or nucleotide analog (or any other molecule or specimen of interest) linked to the fluorophore when in the reaction chamber. For single-photon avalanche photodiodes, binned pulse counting (based on pulse arrival times) may be used to generate two or more bins corresponding to fluorescent emissions.

To further aid in understanding the signal analysis, the accumulated, multi-bin values may be plotted as a histogram, as depicted in FIG. 1-10B for example, or may be recorded as a vector or location in N-dimensional space. Calibration runs may be performed separately to acquire calibration values for the multi-valued signals (e.g., calibration histograms) for four different fluorophores linked to the four nucleotides or nucleotide analogs. As an example, the calibration histograms may appear as depicted in FIG. 1-11A (fluorescent label associated with the T nucleotide), FIG. 1-11B (fluorescent label associated with the A nucleotide), FIG. 1-11C (fluorescent label associated with the C nucleotide), and FIG. 1-11D (fluorescent label associated with the G nucleotide). A comparison of the measured multi-valued signal (corresponding to the histogram of FIG. 1-10B) to the calibration multi-valued signals may determine the identity "T" (FIG. 1-11A) of the nucleotide or nucleotide analog being incorporated into the growing strand of DNA. In some cases, boundaries may be established around each fluorescent label based on calibration statistics, so that a histogram, vector, or location in N-dimensional space falling within a boundary may be classified according to the fluorescent label within that boundary. Although three signal bins are depicted in FIG. 1-11A through FIG. 1-11D, in some embodiments only two signal bins may be used to distinguish three, four, or more different fluorophores.

In some implementations, fluorescent intensity may be used additionally or alternatively to distinguish between different fluorophores. For example, some fluorophores may emit at significantly different intensities or have a significant difference in their probabilities of excitation (e.g., at least a difference of about 35%) even though their decay rates may be similar. By referencing binned signals (bins 1-3) to measured excitation energy bin 0, it may be possible to distinguish different fluorophores based on intensity levels.

In some embodiments, different numbers of fluorophores of the same type may be linked to different nucleotides or nucleotide analogs, so that the nucleotides may be identified based on fluorophore intensity. For example, two fluorophores may be linked to a first nucleotide (e.g., "C") or nucleotide analog and four or more fluorophores may be linked to a second nucleotide (e.g., "T") or nucleotide analog. Because of the different numbers of fluorophores, there may be different excitation and fluorophore emission probabilities associated with the different nucleotides. For example, there may be more emission events for the "T" nucleotide or nucleotide analog during a signal accumulation interval, so that the apparent intensity of the bins is significantly higher than for the "C" nucleotide or nucleotide analog.

The inventors have recognized and appreciated that distinguishing nucleotides or any other biological or chemical specimens based on fluorophore decay rates and/or fluorophore intensities enables a simplification of the optical excitation and detection systems in a bioanalytic instrument 1-100. For example, optical excitation may be performed with a single-wavelength source (e.g., a source producing one characteristic wavelength rather than multiple sources or a source operating at multiple different characteristic wavelengths). Additionally, wavelength discriminating optics and filters may not be needed in the detection system as is typically the case when different fluorophores emitting at different wavelengths are used. Also, a single photodetector may be used for each reaction chamber to detect emission from different fluorophores.

The phrase "characteristic wavelength" or "wavelength" is used to refer to a central or predominant wavelength within a limited bandwidth of radiation (e.g., a central or peak wavelength within a 20 nm bandwidth output by a pulsed optical source). In some cases, "characteristic wavelength" or "wavelength" may be used to refer to a peak wavelength within a total bandwidth of radiation output by a source.

The inventors have recognized and appreciated that fluorophores having emission wavelengths in a range between about 560 nm and about 900 nm can provide adequate amounts of fluorescence to be detected by a time-binning photodetector (which may be fabricated on a silicon wafer using CMOS processes) or single-photon avalanche photodiode. These fluorophores can be linked to biological molecules of interest such as nucleotides or nucleotide analogs. Fluorescent emission in this wavelength range may be detected with higher responsivity in a silicon-based photodetector than fluorescence at longer wavelengths. Additionally, fluorophores and associated linkers in this wavelength range may not interfere with incorporation of the nucleotides or nucleotide analogs into growing strands of DNA. The inventors have also recognized and appreciated that fluorophores having emission wavelengths in a range between about 560 nm and about 660 nm may be optically excited with a single-wavelength source. An example fluorophore in this range is Alexa Fluor 647, available from Thermo Fisher Scientific Inc. of Waltham, Massachusetts. In some cases, longer emission wavelengths may be obtained using two different fluorophores that are linked in close proximity to a specimen. One fluorophore may be excited by the pulsed optical source and transfer its energy non-radiatively (e.g., via Forster resonance energy transfer—FRET) to a second fluorophore that will in turn radiate at a wavelength longer than 660 nm, for example. The inventors have also recognized and appreciated that excitation energy at shorter wavelengths (e.g., between about 500 nm and about 650 nm) may be required from a pulsed laser to excite fluorophores that emit at wavelengths between about 560 nm and about 900 nm. In some embodiments, the time-binning photodetectors may efficiently detect longer-wavelength emission from the samples, e.g., by incorporating other materials, such as Ge, into the photodetectors active region.

The inventors have also recognized and appreciated that optical pulses from a pulsed laser should extinguish quickly for the detection schemes described above, so that the excitation energy does not overwhelm or interfere with the subsequently detected fluorescent signal. In some embodiments and referring again to FIG. 1-5, there may be no wavelength filters between the waveguide 1-315 and the time-binning photodetector 1-322. However, in some embodiments, an optical filter may be formed above the photodetector 1-322 to discriminate against radiation from the optical excitation pulses. In some cases, where emission wavelengths are significantly longer than the excitation wavelength, simple optical filters may be incorporated over the photodetectors to further reduce the impact of the excitation pulse on the time-binning photodetectors.

To avoid interference of the optical excitation energy with subsequent fluorescent signal collection, the optical excitation pulse may preferably reduce in intensity by no less than 40 dB within no longer than ±500 ps from the peak of the optical excitation pulse. For example, if a peak value of an excitation optical pulse is 1 Watt, than the pulse intensity should drop to about 0.0001 Watt within no longer than ±500 ps. In some implementations, the excitation pulse may reduce in intensity by no less than 60 dB within no longer than ±500 ps from the peak of the excitation pulse. According to some embodiments, a reduction in intensity of the excitation energy between pulses may be reduced additionally by 20 dB or more if the excitation energy is directed away from the detection apparatus for the fluorescent signal. For example, the excitation energy may be delivered in a waveguide, as depicted in FIG. 1-3, propagating in a different direction (horizontal) from the fluorescent-detection path (vertical). In some implementations, the directions of the two paths may be approximately orthogonal as depicted in the drawing. Reductions in excitation energy between pulses can also be achieved through waveguide material development and device fabrication (e.g., waveguide material that exhibits reduced scattering loss and reduced fluorescence and an etching process that produces smooth waveguide sidewalls). Further, scatter of excitation energy off of the reaction chamber may be reduced by choice of chamber geometry, materials, and geometries of surrounding structures based on results from electromagnetic simulations. If a laser-wavelength rejection filter is incorporated above the photodetectors 1-322, then a slower turn-off time may be tolerated, e.g., a reduction in intensity by no less than 20 dB-30 dB within no longer than ±500 ps from the peak of the optical excitation pulse.

The inventors have also recognized and appreciated that a pulsed laser should provide enough energy per pulse to excite at least one fluorophore in each of the reaction chambers on the bio-optoelectronic chip for each excitation pulse. For a chip that includes about 32,000 reaction chambers and accounting for optical losses throughout the system, the inventors have determined that a pulsed laser should provide about 4 mW or more of average optical power at the excitation wavelength.

The inventors have further recognized and appreciated that a beam quality of the pulsed laser should be high (e.g., an $M^2$ value less than 1.5 and wavefront distortion of at most $\lambda/4$ peak-to-valley), so that efficient coupling to an optical coupler and uniform distribution of energy to multiple waveguides of a bio-optoelectronic chip 1-141 can be achieved. In some implementations, the wavefront distortion may be at most $\lambda/10$ peak-to-valley. For a hand-held instrument, a laser diode may be a preferred optical source. However, a laser diode's emitter area is on the order of microns, and large expansion of the beam (by more than a factor of 20) can be required to adequately couple energy into a plurality of waveguides on the bio-optoelectronic chip 1-141. Achieving such large beam expansion in a compact instrument while maintaining beam quality poses a technical challenge. Additionally, apparatus is needed to adjust and steer the optical beam for improved and stable coupling to the packaged bio-optoelectronic chip 1-140.

Further details of a hand-held bioanalytic system 1-100 that can produce optical pulses from a laser diode with short turn-off times and provide a high-quality, steerable beam for coupling to a packaged bio-optoelectronic chip will next be described.

II. Pulsed Optical Source

In some embodiments, a gain-switched laser diode may be employed as an optical source on the pulsed source board 1-110 for a bioanalytical instrument 1-100. Gain-switched lasers typically cannot achieve the ultrashort pulse durations of mode-locked lasers, but can have less complexity, are typically smaller in size, and may be manufactured at lower cost. Challenges associated with gain-switched laser diodes in the context of lab-on-chip, lifetime-discriminating, massively-parallel bioanalytic applications are obtaining optical pulse durations that are short enough for lifetime analysis and obtaining an adequate beam quality for coupling excitation energy onto a chip and distributing the energy uniformly to a large number of reaction chambers.

The inventors have conceived of pulse-driving circuits and techniques for producing short and ultrashort optical pulses from laser diodes. According to some embodiments, the pulse-driving circuits and laser diode may be assembled on the pulsed source board 1-110. The pulse-driving circuits and laser diode may produce a train of optical pulses having a pulse durations on the order of about 100 ps (FWHM) with an average power of about 4 mW. In some cases, the pulse duration may be between 40 ps and 250 ps. In some implementations, the pulse duration may be between 40 ps and 150 ps. The optical pulses may turn off to at least 40 dB below the pulse peak within no more than 500 ps from the peak of the pulse. In some cases, the optical pulses may turn off to no less than 40 dB below the pulse peak within no more than 600 ps from the peak of the pulse. The repetition rate of the pulses can be selected by a user to be any value between 50 MHz and 200 MHz, for example. In some embodiments, a unipolar current waveform is produced in a pulse-driving circuit and used to drive a laser diode to output optical pulses.

Figures 1A, 2:
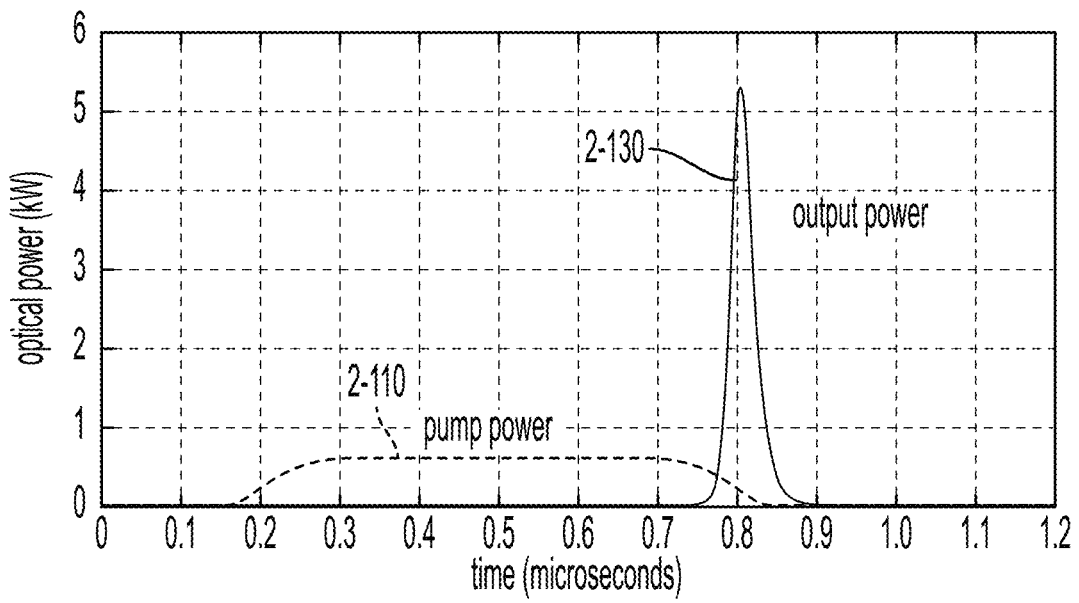
Figures 1B, 2:
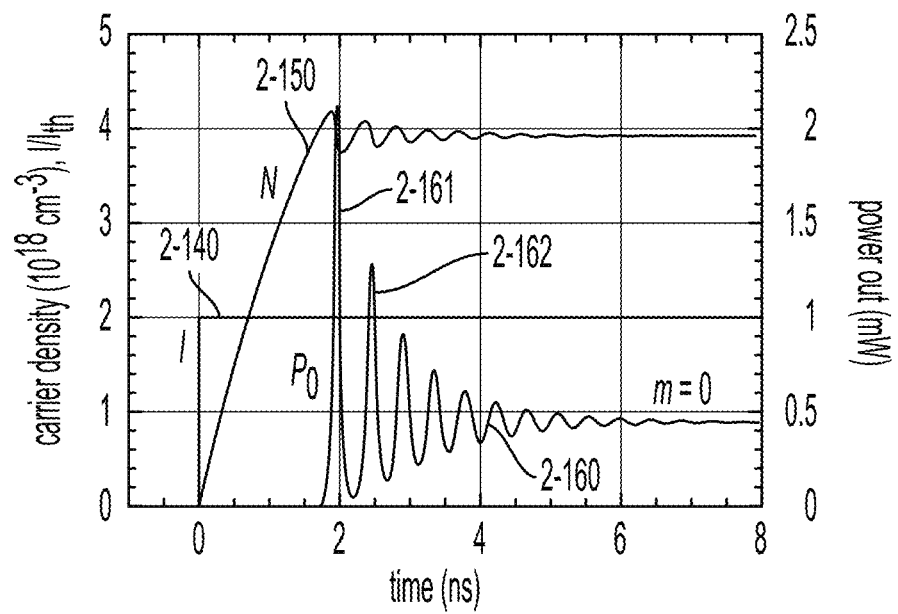
Figures 1C, 2:
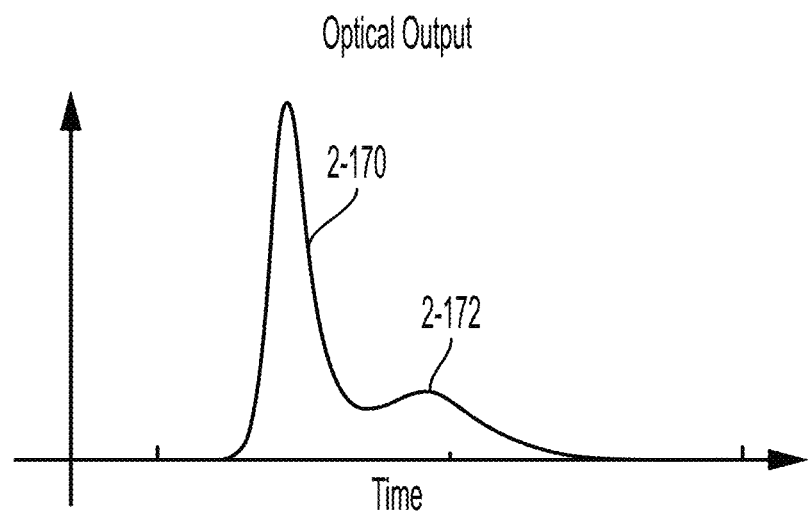

By way of introduction to gain switching, FIGS. 2-1A through 2-1C depict laser dynamics associated with gain switching in lasers. FIG. 2-1A illustrates a pump-power curve 2-110 that is representative of optical pump power applied to a gain medium of an optically-pumped, gain-switched laser, according to some embodiments. As depicted, the pump power may be applied for a brief duration (depicted as approximately 0.6 microseconds) to the gain medium of a laser. The duration may be much shorter in high-speed embodiments, such as gain switching of a laser diode. For a semiconductor laser diode, application of pump power may comprise applying a bias current across a p-n junction or multiple quantum wells (MQWs) in the active region of the laser diode for a duration less than one nanosecond. The pump power pulse may be applied repetitively at regularly-spaced time intervals, for example, at a pulse-separation interval or pulse repetition time T.

During application of a pump power pulse, optical gain in a laser increases until the gain begins to exceed optical losses in the laser's cavity. After this point, the laser may begin to lase (i.e., amplify photons passing through the gain medium by the process of stimulated emission). The amplification process results in a rapid increase in laser light and depletion of excited states in the gain medium to produce at least one output pulse 2-130 as depicted in the graph. In some embodiments, the pump power pulse 2-110 is timed to turn off at approximately the same time that the peak of the output pulse occurs. Turning off the pump power pulse terminates further lasing, so that the output pulse 2-130 quenches. In some embodiments, the output pulse 2-130 may have a shorter duration than the pump pulse 2-110, as depicted in the drawing. For example, an output pulse 2-130 produced by gain switching may be less than ⅕ the duration of the pump pulse 2-110.

If the pump power pulse is not turned off, then the dynamics depicted in FIG. 2-1B may occur. In this case, the pump power curve 2-140 is depicted as a step function of current density I that is applied to a semiconductor laser diode. The pump current density I of about twice a lasing threshold current density $I_{th}$, is applied at time t=0, and is then left on. The graph shows that the gain medium is excited by the applied pumping current density, which produces a carrier density N in the gain region of the laser diode. The graph shows the increase in carrier density N for the semiconductor gain region until the optical gain of the laser exceeds loss in the cavity. After this point, a first pulse 2-161 builds up, depleting the carrier density and optical gain to a value less than the cavity loss, resulting in emission of the first pulse 2-161. Subsequently, a second pulse 2-162 builds up, depletes carrier density N, and is emitted. The build-up and depletion of carrier density repeats for several cycles until the laser stabilizes into continuous wave operation (e.g., after about 7 nanoseconds in this example). The cycle of pulses (pulse 2-161, pulse 2-162, and subsequent pulses) are referred to as relaxation oscillations of the laser.

The inventors have recognized and appreciated that a challenge when gain-switching a laser diode to produce ultrashort-pulses is to avoid deleterious effects of continued relaxation oscillations. For example, if a pump power pulse 2-110 is not terminated quickly enough, at least a second optical pulse 2-162 (due to relaxation oscillation) may begin to build up in the laser cavity and add a tail 2-172 to a gain-switched output pulse 2-170, as depicted in FIG. 2-1C. The inventors have recognized and appreciated that such a tail can be undesirable in some applications, such as applications aimed at distinguishing fluorescent molecules based on fluorescent lifetimes. If the tail of an excitation pulse is not reduced sufficiently quickly, excitation radiation may overwhelm a detector unless wavelength filtering is employed. Alternatively or additionally, a tail on an excitation pulse may continue to excite a fluorescent molecule and may complicate detection of fluorescent lifetime.

If the tail of an excitation pulse is reduced sufficiently quickly (e.g., to at most 40 dB below the pulse peak by no more than 500 ps after the pulse peak), there may be negligible or manageable excitation radiation present during fluorescent emission. In such implementations, filtering of the excitation radiation during detection of fluorescent emission may not be needed to detect the fluorescent emission and distinguish fluorescent molecule lifetimes. In some cases, the elimination of excitation filtering can significantly simplify and reduce the cost of a bio-optoelectronic chip 1-141 as well as allow a more compact configuration for the system. For example, when a filter is not needed to suppress the excitation wavelength during fluorescent emission, the excitation source and fluorescent detector can be located in close proximity (e.g., on a same circuit board or integrated device, and even within microns of each other).

The inventors have also recognized and appreciated that in some cases, an amount of radiation from an excitation pulse may be tolerated and/or can be filtered out by a low-cost wavelength-discriminating thin film or multi-layer stack of thin films deposited between the time-binning photodetector 1-322 and sample well 1-330. For example, a bio-optoelectronic chip 1-141 may have an optical configuration that allows for incorporation of a thin-film wavelength filter into a detection optical path. The wavelength filter may be selected to reject excitation wavelengths in the detection optical path, so that a detector 1-322 receives quantifiable fluorescence from a biological sample. As a result, excitation radiation from the pulsed optical source may not overwhelm the detected fluorescence. In such cases, the wavelength filter may comprise a single or multi-layer optical coating that is formed between the reaction chamber 1-330 and its associated photodetector 1-322.

In some embodiments, a fluorescent molecule's emission lifetime τ may be characterized by a 1/e intensity value, though other metrics may be used in some embodiments (e.g., $1/e^2$, emission half-life, etc.). The accuracy of determining a fluorescent molecule's lifetime is improved when an excitation pulse, used to excite the fluorescent molecule, has a duration that is less than the fluorescent molecule's lifetime. Preferably, the excitation pulse has a FWHM duration that is less than the fluorescent molecule's emission lifetime by at least a factor of three. An excitation pulse that has a longer duration or a tail 2-172 with appreciable energy may continue to excite the fluorescent molecule during a time when decaying emission is being evaluated, and complicate the analysis of fluorescent molecule lifetime. To improve fluorescent lifetime determination in such cases, deconvolution techniques may be used to deconvolve the excitation pulse profile from the detected fluorescence.

According to some embodiments, the pulse-separation interval T (see FIG. 1-2) may also be an important aspect of a pulsed laser system. For example, when using a pulsed laser to evaluate and/or distinguish emission lifetimes of fluorescent molecules, the time between excitation pulses is preferably longer than any emission lifetime of the examined fluorescent species in order to allow for sufficiently accurate determination of an emission lifetime. For example, a subsequent pulse should not arrive before an excited fluorescent molecule or ensemble of fluorescent molecules excited from a previous pulse has (or have) had a reasonable amount of time to fluoresce. In some embodiments, the interval T needs to be long enough to determine a time between an excitation pulse that excites a fluorescent molecule and a subsequent photon emitted by the fluorescent molecule after termination of excitation pulse and before the next excitation pulse.

Although the interval between excitation pulses T should be long enough to determine decay properties of the fluorescent species, it is also desirable that the pulse-separation interval T is short enough to allow many measurements to be made in a short period of time. By way of example and not limitation, emission lifetimes (1/e values) of fluorescent molecules used in some applications may be in the range of about 100 picoseconds to about 10 nanoseconds. Therefore, depending on the fluorescent molecules used, a pulse-separation interval as short as about 200 ps may be used, whereas for longer lifetime fluorescent molecules a pulse-separation interval T greater than about 20 nanoseconds may be used. Accordingly, excitation pulses used to excite fluorescence for fluorescent lifetime analysis may have FWHM durations between about 25 picoseconds and about 2 nanoseconds, according to some embodiments.

Figures 2, 2A:
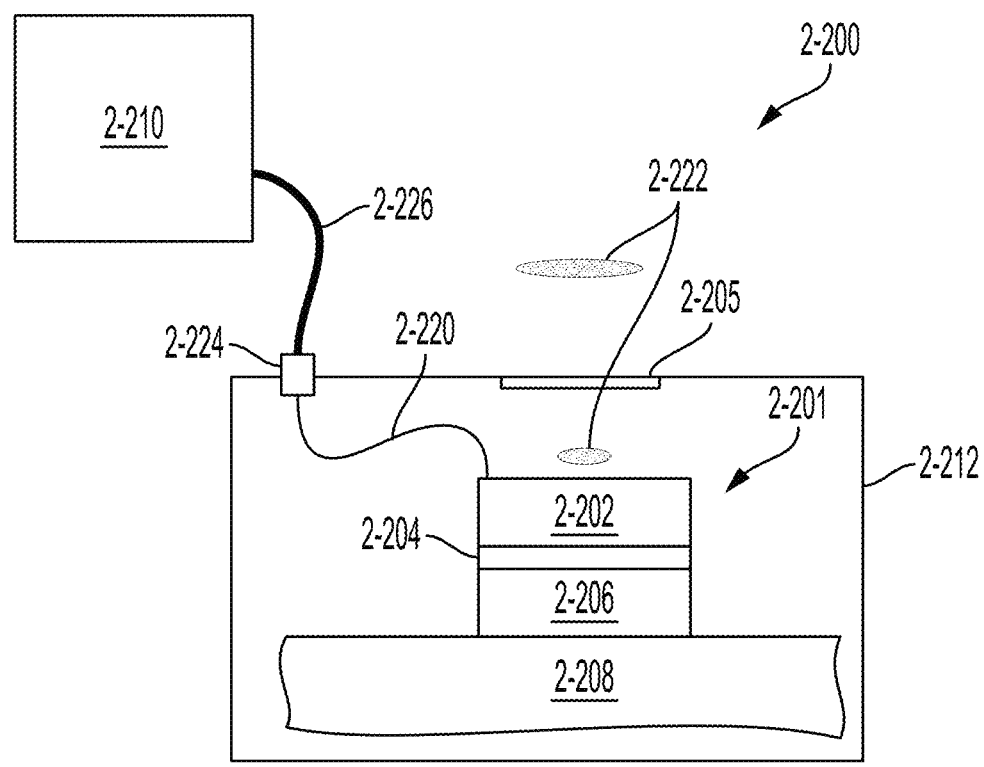

An example of a pulsed laser diode 2-200 is depicted in FIG. 2-2A. According to some embodiments, a pulsed laser diode 2-200 may comprise a commercial or custom semiconductor laser diode 2-201 formed on a substrate 2-208. A laser diode may be packaged in a housing 2-212 that includes an electrical connector or pins 2-224 for applying a drive signal to the laser diode 2-201. There may be one or more optical elements 2-205 (e.g., a window, and/or one or more lenses) included with the package to transmit, reshape and/or change the divergence of an output beam from the laser diode.

The laser diode 2-201 may be driven by a pulse-driving circuit 2-210 which may provide a sequence of current pulses over a cable or conductive interconnect 2-226 and at least one wire 2-220 (e.g., a bond wire in the package) to the laser diode 2-201. In some cases, the pulse-driving circuit may be integrated on a same board as the laser diode 2-201. The drive current from the pulse-driving circuit 2-210 may produce a train of optical pulses 2-222 that are emitted from the laser diode. In some implementations, the optical pulses may expand in size as they travel from the emitting surface of the laser diode 2-201.

According to some embodiments, a laser diode 2-201 may comprise a semiconductor junction comprising a first layer 2-202 having a first conductivity type (e.g., p-type) and a second layer 2-206 having an opposite conductivity type. There may be one or more intermediate layers 2-204 formed between the first and second layers. For example, the intermediate layers may comprise multiple-quantum-well (MQW) layers in which carriers injected from the first and second layers recombine to produce photons. In some embodiments, the intermediate layers may include electron and/or hole blocking layers that help retain electrons and holes in the diode's active region where they can recombine and emit photons. The laser diode may comprise inorganic materials and/or organic semiconductor materials in some implementations. The materials may be selected to obtain a desired emission wavelength. For example and for inorganic semiconductors, III-nitride compositions may be used for lasers emitting at wavelengths less than about 500 nm, and III-nitride, III-arsenide, or III-phosphide compositions may be used for lasers emitting at wavelengths greater than about 500 nm. Any suitable type of laser diode 2-201 may be used including, but not limited to, a vertical cavity surface emitting laser (VCSEL), an edge-emitting laser diode, or a slab-coupled optical waveguide laser (SCOWL).

In some embodiments, a laser diode may be used, such as a green laser diode, model PL 520B available from OSRAM Opto Semiconductors GmbH of Regensburg, Germany, though other laser diodes may be used in other embodiments. The laser diode may emit with a single characteristic wavelength in a range between 515 nm and 530 nm, according to some embodiments, and be provided in a board-mountable package (e.g., a TO metal can package). Such a package may be mounted or soldered directly to the pulsed source board 1-110, according to some embodiments. For example, the electrical connector 2-224 may comprise pins that extend from a bottom of the housing 2-212. The pins may be soldered directly to conductive interconnects on the pulsed source board 1-110 in some embodiments, or may insert into a plug receptacle that is soldered to conductive interconnects on the pulsed source board in other embodiments.

Figures 2, 2B:
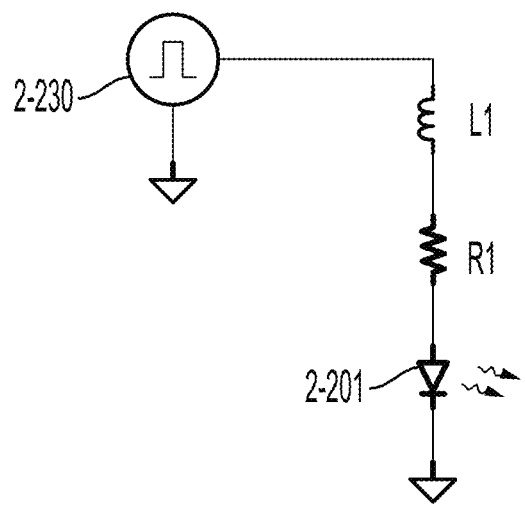

The inventors have recognized and appreciated that some conventional laser diodes and current driver may be modeled as depicted in FIG. 2-2B. For example, the pulse-driving circuit 2-210 may comprise a pulsed voltage source 2-230 configured to deliver current pulses to a laser diode 2-201. Connection to the laser diode may be made, at least in part, through a single bond wire 2-220 that may bonded to a contact pad on the laser diode 2-201. The connection to the laser diode may include a series inductance L1 and series resistance R1. The connection may also include small junction capacitances (not shown) associated with contacts and/or the diode junction. At high driving frequencies, the inductance L1 may limit an amount of current supplied to the laser diode 2-201.

The inventors have recognized and appreciated that increasing the number of wire bonds (e.g., between the connector 2-224 and laser diode 2-201) may reduce the inductance and/or resistance of the connection to a laser diode 2-201. Such a reduction in inductance and/or resistance may enable higher speed current modulation of the laser diode and shorter output pulses. According to some embodiments, a single wire bond 2-220 may be replaced with multiple parallel wire bonds to improve the speed of a laser diode. For example, the number of wire bonds may be increased to three or more. In some implementations, there may be up to 50 wire bonds to a laser diode.

Figures 2, 2C:
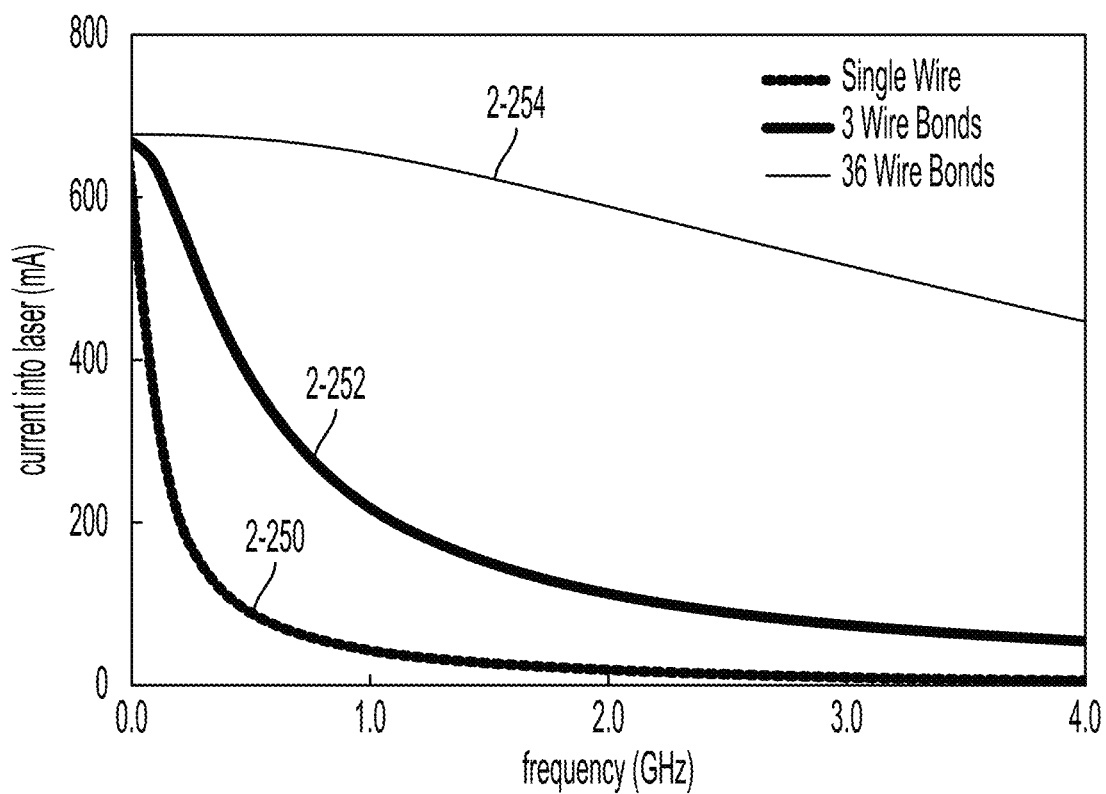
Figures 2, 3:
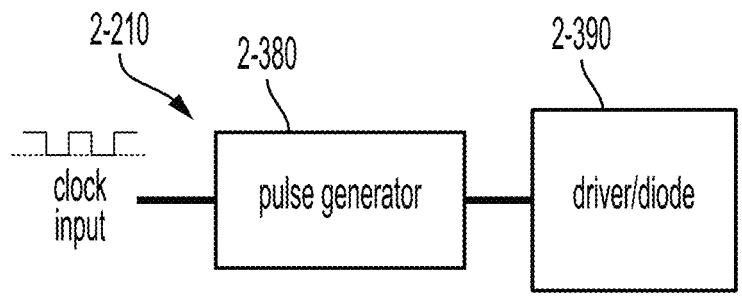

The inventors have investigated the effects of increasing the number of wire bonds 2-220 on a commercial laser diode. Results from numerical simulations of increasing a number of wire bonds are illustrated in FIG. 2-2C. For this simulation, a commercial laser diode was considered (an Oclaro laser diode, model HL63133DG, now available from Ushio, of Cypress, California). The simulation increased the number of wire bonds from a single bond for the commercial device (curve 2-250) to three wire bonds (curve 2-252) and to 36 wire bonds (curve 2-254). The average drive current delivered to the laser diode for a fixed 18V pulse was determined over a range of frequencies for the three different cases. The results indicate that a higher number of wire bonds allows more current to be delivered to the laser diode at higher frequencies. For example, at 1 GHz, the use of just three wire bonds (curve 2-252) allows more than four times as much current to be delivered to the laser diode than for a single wire bond. Since short and ultrashort pulses require higher bandwidth (higher frequency components to form the short pulse), adding multiple wire bonds allows the higher frequency components to drive the laser diode in a shorter pulse than a single wire bond. In some implementations, the multiple wire bonds may extend between a single contact pad or multiple contact pads on a laser diode and an adaptor or connector 2-224 on a laser diode package. The connector may be configured for connection to an external, standardized cable (e.g., to a 50-ohm BNC or SMA cable) or comprise pins for mounting directly to a pulsed source board 1-110.

In some embodiments, the number of wire bonds and the wire bond configuration may be selected to match an impedance of the adaptor and/or circuitry connected to the laser diode. For example, the input impedance to the laser diode comprising the wire bonds may be matched to the impedance of a connector 2-224, cable 2-226, or circuit connected to the laser diode to reduce power reflections from the laser diode to the current driver, according to some embodiments. In other embodiments, the impedance of the wire bonds may intentionally mismatch the laser diode's input impedance. The mismatch may generate a negative pulse between positive current-driving pulses. Selecting a packaging method for a laser diode (e.g., selecting a number of wire bonds that connect to a laser diode) may improve the current modulation supplied to the laser diode at higher frequencies. This can make the laser diode more responsive to high-speed gain-switching signals, and may enable shorter optical pulses, faster reduction of optical power after the pulse peak, and/or increased pulse repetition rates.

An example of a pulse-driving 2-210 circuit is depicted in FIG. 2-3, according to some embodiments. A pulse-driving circuit may comprise a pulse generator 2-380 and a diode-driver circuit 2-390. The pulse generator 2-380 may receive one or more clock signals from, or derived from, a system clock, for example, and output a train of electrical pulses to the diode-driver circuit 2-390. The electrical pulses in the train of pulses may be unipolar pulses that, apart from any transient and low-level ringing (e.g., less than 10% of the pulse amplitude), extend from a base level signal in a single direction. The diode-driver circuit 2-390 may operate on the electrical pulses from the pulse generator 2-380 and inject corresponding current pulses into a laser diode. The current pulses are converted to optical pulses by the laser diode. Accordingly, the output optical pulses from the laser diode may be synchronized to the system clock. The system clock, or a clock derived therefrom, may also be provided to and used to operate data-acquisition electronics on the bio-optoelectronic chip 1-141. In this manner, optical excitation of samples and data acquisition can be synchronized.

According to some embodiments, the pulse generator 2-380 may be formed from a combination of passive and digital electronic components. In some cases, a pulse generator 2-380 may include analog circuit components. The pulse generator 2-380 may be formed on the pulsed source board 1-110, or on a separate board. In other embodiments, a portion of the pulse generator 2-380 may be formed on a same board as the diode-driver circuit 2-390, and a portion of the pulse generator 2-380 may be formed on a separate board remote from the diode-driver circuit 2-390. The diode-driver circuit 2-390 may be formed from passive, analog, and digital electronic components, and may be formed on a same or different circuit board as the pulse generator 2-380 or portion of the pulse generator. In some implementations, the pulse generator 2-380 and/or diode-driver circuit 2-390 may include emitter-coupled logic elements. An optical source (laser diode) may be included on a circuit board with the diode-driver circuit 2-390, or may be located in a system and connected to the diode-driver circuit 2-390 by high-speed cabling (e.g., SMA cables). According to some embodiments, the pulse generator 2-380, diode-driver circuit 2-390, and laser diode 2-201 may be integrated onto a same printed circuit board, laminate, or integrated circuit. For example, the pulse generator 2-380, diode-driver circuit 2-390, and laser diode 2-201 may be integrated onto the pulsed source board 1-110, which may be a user-replaceable board in the bioanalytic instrument 1-100.

Further details of a pulse generator 2-380, 2-381 are depicted in FIG. 2-4A and FIG. 2-4C, according to some embodiments. According to embodiments, a pulse generator 2-380 can include a first stage that produces two differential clock outputs, one delayed with respect to the other. The first stage may receive a clock input and comprise a fan-out chip 2-481 and signal delay 2-483. The fan-out may comprise logic drivers and logic inverters arranged to produce two copies of the clock signal and two inverted copies of the clock signal. According to embodiments, the clock may have a symmetric duty cycle, though asymmetric duty cycles may be used in some cases. One copy and one inverted copy may form a differential clock output (CK1, $\overline{CK1}$) and may be delayed by a delay element 2-483 with respect to a second copy and second inverted copy (CK2, $\overline{CK2}$). The delay element may comprise any suitable variable or fixed delay element. Examples of delay elements include RF delay lines and logic gate delays. In some implementations, the first pair of clock signals (CK1, $\overline{CK1}$) is delayed at least a fraction of a clock cycle with respect to the second pair of clock signals (CK2, $\overline{CK2}$). A delay may include one or more full cycles in addition to a fractional cycle. Within each pair of clock signals, the inverted signal may be synchronized to its counterpart so that rising and falling edges of the clocks occur at essentially the same time.

The inventors have found that ultrashort pulsing of a laser diode can be controlled more reliably by adjusting a duration of a current-driving electrical pulse from the pulse generator 2-380 and maintaining a fixed amplitude of the pulse rather than adjusting an amplitude of an ultrashort current-driving pulse. Adjusting the length of the current-driving pulse adjusts an amount of energy delivered to the laser diode per pulse. In some embodiments, high-speed circuits allow for high-resolution control of signal phase (e.g., by adjusting a delay or phase with an analog or digital delay element 2-483), which can be used to obtain high-resolution control of pulse length, according to some implementations.

According to some embodiments, the delayed clock signals CK1, CK2 and their inverses may be transmitted over high-speed transmission lines to a high-speed logic gate 2-485. For signal transmission over cables between boards, the clock pulses may deteriorate due to cabling. For example, limited bandwidth of transmission lines may distort the clock pulses differently and result in unequal timing. In some implementations, a same type of cabling or transmission line may be used for all the clock signals, so that transmission distortions affect the four clock signals equally. For example, when signal distortions and timing offsets are essentially the same for the four clock signals, a resulting driving pulse produced by the receiving logic gate 2-485 will be essentially the same as it would be if there were no signal distortions from transmission of the clock signals. Accordingly, transmission of clock signals over distances of a foot or more may be tolerated without affecting the driving-pulse duration. This can be useful for producing ultrashort driving pulses that are synchronized to a system clock and have finely adjustable pulse duration (e.g., adjustable in increments of about 3 ps).

If the clock signals for the diode-driver circuit 2-390 are produced locally near the driver circuit (e.g., on a same board as the diode-driver circuit 2-390), signal distortions associated with transmission of the clock signals may not be significant and the transmission lines may differ to some extent. In this case, two differential clock signals may not be needed and the pulse generator 2-380 may have a different circuit structure.

According to some embodiments, the two differential clock signals may be AC coupled with capacitors $C_1$ and provided to data inputs of a high-speed logic gate 2-485. AC coupling may be used in cases where there is a difference between the output logic standard of the clock 2-430 and input logic standard of the logic gate 2-485. Capacitors $C_1$ may have a capacitance between about 10 nF and about 1 µF. According to some embodiments, the logic gate may comprise an emitter-coupled logic (ECL), two-input, differential AND/NAND gate. An example of logic gate 2-485 includes model MC100EP05 available from ON Semiconductor of East Greenwich, Rhode Island. In some embodiments, there may not be AC coupling between the clock 2-430 and the logic gate 2-485, e.g., if the output logic standard of the clock matches the input logic standard of the logic gate.

AC-coupled signals of the differential clock signals that are provided to the data inputs (D1, $\overline{D1}$, D2, $\overline{D2}$) of a logic gate 2-485 may appear as depicted in FIG. 2-4B, where the horizontal dashed line indicates a zero voltage level. The depictions in FIG. 2-4B do not include distortions introduced by transmission lines. The distortions may round and alter the shapes of the signal profiles, but may not affect the relative phases of the clock signals when a same type and length of cabling is used for each clock signal. Delay element 2-483 may provide a delay Δt indicated by the vertical dashed lines in FIG. 2-4B, which may be adjustable in increments as small as 3 ps. In some implementations, a delay element 2-483 may provide an adjustable delay in increments having a value between 1 ps and 10 ps. The logic gate 2-485 may process the received clock signals and produce an output signal at an output port Q corresponding to the delay introduced by delay element 2-483.

With a small delay Δt, the output signal from a non-inverting output of the logic gate 2-485 may comprise a sequence of short or ultrashort pulses, as depicted in the lower trace of FIG. 2-4B. With a high-speed logic gate 2-485, the pulse durations may be between about 50 ps and about 2 ns (FWHM) in some embodiments, between about 50 ps and about 0.5 ns in some embodiments, between about 50 ps and about 200 ps in some embodiments, and yet between about 50 ps and about 100 ps in some embodiments. The driving pulses from port Q may have a substantially square profile due to high-speed slew rates of the ECL logic gate 2-485. In some embodiments, a biasing circuit 2-487 may be connected to the output port Q, and a voltage $V_1$ applied for positive emitter-coupled logic. The biasing circuit 2-487 can comprise voltage-dividing resistors $R_1$ and $R_2$ connected in series between a voltage source $V_1$ and a reference potential (e.g., ground). Output pulses provided from an output terminal $P_{out}$ of the pulse generator 2-380 may include a DC offset, according to some embodiments.

In some cases, the first stage of a pulse generator 2-381 may comprise a dual-output clock 2-430 instead of the fan-out 2-481 and delay 2-483, as depicted in FIG. 2-4C. A dual-output clock 2-430 may generate two differential clock signals, and provide adjustable phase delay between the two differential clock signals. In some implementations, the adjustable phase delay may have a corresponding time resolution as little as 3 ps. Referring to FIG. 2-4B, this adjustment increment for Δt provides a fine temporal control of the duration of the output electrical pulses.

In some implementations, the two differential clock signals may be provided in parallel to data inputs of two high-speed logic gates 2-485 arranged in parallel, as depicted in FIG. 2-4C. When two or more high-speed logic gates 2-485 are connected in parallel, the logic gates may be the same and operate in parallel to provide greater current driving capability at an output $P_{out}$ of the pulse generator. The inventors have recognized and appreciated that the logic gate 2-485, or gates, need to provide high speed switching (i.e., fast rise and fall times to produce ultrashort driving pulses), and need to provide enough output current to drive at least one transistor in the diode-driver circuit 2-390. In some implementations, connecting logic gates 2-485 in parallel provides improved performance of the pulse-driving circuit, and allows production of sub-100-ps optical pulses.

Depending on the structure of the diode-driver circuit 2-390, a non-inverting or inverting output may be taken from the logic gate or gates 2-485. For the embodiment shown in FIG. 2-4C, an inverting output is used. In such an embodiment, a pull-down network 2-488 may connect between an output port from the pulse generator and a reference potential (e.g., ground). The inverting output may be subsequently inverted by an amplifier in the diode-driver circuit 2-390.

In some embodiments, a diode-driver circuit 2-390 may comprise multiple amplification stages connected in series. Example stages for a diode-driver circuit 2-390 are depicted in FIG. 2-5A, FIG. 2-5B, and FIG. 2-5C, though a diode-driver circuit is not limited to only the depicted configuration of electrical components. According to some embodiments, a first stage 2-510 (FIG. 2-5A) of a diode driver circuit may comprise a common-source FET amplifier that inverts and provides a voltage gain for a signal $S_1$ received from the pulse generator 2-380. A second stage 2-520 of the diode-driver circuit 2-390 may comprise a source follower, as depicted in FIG. 2-5B. The source follower may provide the voltage and current needed to drive a high power transistor M3 in the third stage 2-530 of the diode-driver circuit 2-390.

According to some implementations and referring to FIG. 2-5A, a first stage of a diode-driver circuit 2-390 may comprise a high-speed transistor M1 connected in a common-source or common-emitter amplifier configuration. In some implementations, transistor M1 may comprise a high electron mobility transistor (HEMT), such as a pHEMT, model ATF-331M-BLK, available from Broadcom® Limited of San Jose, California, though other high-speed transistors may be used. An AC-coupling input network ($C_3$, $R_3$, $R_4$) may connect to a gate of the transistor M1. A value of $C_3$ may be between 0.25 microfarad (µF) and 4 µF, a value of $R_3$ may be between 10 ohms and 200 ohms, and a value of $R_4$ may be between 5 ohms and 100 ohms, according to some embodiments. In some cases, a value of $C_3$ is within 20% of 1 µF, a value of $R_3$ is within 20% of 50 ohms, and a value of $R_4$ is within 20% of 20 ohms. An inductor $L_1$ may be connected in series with a resistor $R_5$ between a supply potential $V_1$ and the transistor's drain. The inductor may have a value between 10 nanoHenries (nH) and 200 nH, and a value of $R_5$ may be between 10 ohms and 200 ohms, according to some embodiments. In some cases, a value of $L_1$ is within 20% of 47 nH, and a value of $R_5$ is within 20% of 50 ohms. In some implementations, the drain of the transistor M1 may be connected to either a 3.3V supply or a 5V supply, though other voltage supplies of approximately these values may be used. A 3.3V supply voltage, for example, may be used to reduce power consumption by the transistor M1, provided the diode-driver circuit provides adequate pulsed operation of the diode. A 5V supply voltage, for example, may be used to provide higher gain from the first stage 2-510 of the diode-driver circuit 2-390. Higher gain may be needed to improve gain-switching performance of the diode laser and/or increased light output. A bypass resistor ($R_6$, $C_4$) may be connected between the transistor's source and a reference potential for stable biasing of the transistor. A value of $R_6$ may be between 2 ohms and 20 ohms, and a value of $C_4$ may be between 0.25 µF and 5 µF, according to some embodiments. In some cases, a value of $R_6$ is within 20% of 5 ohms, and a value of $C_4$ is within 20% of 1 µF. In some aspects, an output network ($C_5$, $R_7$) may connect between an output of the transistor M1 and a reference potential. A value of $C_5$ may be between 0.5 picoFarad (pF) and 10 pF, and a value of $R_7$ may be between 2 ohms and 50 ohms, according to some embodiments. In some cases, a value of $C_5$ is within 20% of 1.8 pF, and a value of $R_7$ is within 20% of 10 ohms. In some implementations, the inductor $L_1$ may assist in rapidly charging capacitor $C_5$ at turn-off of the transistor M1 to increase the output pulse voltage more quickly.

Because the first stage 2-510 inverts and amplifies an input signal $S_1$, an output signal $S_2$ from the first stage may comprise a train of short electrical pulses. These pulses may have a pulse duration of no greater than 500 ps, according to some embodiments. The duration of these pulses may be adjusted electronically by adjusting a delay Δt in the pulse generator circuit 2-380. As explained above, adjusting the duration of these pulses can control an amount of current injected into the laser diode.

A second stage 2-520 of the diode-driver circuit 2-390 may comprise a second transistor M2 connected in a source-follower or emitter-follower configuration, as depicted in FIG. 2-5B for example. An AC-coupling and biasing input network ($C_3$, $R_8$, $R_9$, $C_6$) may connect to a gate of the second transistor. A value of $C_3$ may be between 0.25 µF and 5 µF, a value of $R_8$ may be between 25 ohms and 400 ohms, a value of $R_9$ may be between 2 ohms and 50 ohms, and a value of $C_6$ may be between 0.025 µF and 0.5 µF, according to some embodiments. In some cases, a value of $C_3$ is within 20% of 1 µF, a value of $R_8$ is within 20% of 100 ohms, a value of $R_9$ is within 20% of 10 ohms, and a value of $C_6$ is within 20% of 0.1 µF. A shunt capacitor $C_7$ having a value between 0.025 µF and 0.5 µF may connect to a drain of transistor M2, according to some embodiments, and the drain may connect to a voltage supply $V_2$. In some cases, the shunt capacitor $C_7$ has a value within 20% of 0.1 µF. The shunt capacitor $C_7$ may assist in providing current to the transistor M2 at turn-on. In some embodiments, the supply $V_2$ for M2 in the second stage 2-520 may be a same supply as the supply $V_1$ for the first stage 2-510. A bypass resistor network ($R_{10}$, $R_{11}$, $C_8$) may connect between the source of the second transistor M2 and a reference potential for stable biasing of transistor M2. A value of $R_{10}$ may be between 5 ohms and 100 ohms, a value of $R_{11}$ may be between 10 ohms and 200 ohms, and a value of $C_8$ may be between 0.25 µF and 5 µF, according to some embodiments. In some cases, a value of $R_{10}$ is within 20% of 20 ohms, a value of $R_{11}$ is within 20% of 50 ohms, and a value of $C_8$ is within 20% of 1 µF.

According to some embodiments, a voltage may be applied to a bias pin P1 in the second stage 2-520. Because the second transistor M2 is configured as a voltage follower, the bias voltage, minus a small voltage drop in the transistor, will be passed to the output of M2 in addition to the train of short pulses received from M1. In some embodiments, the bias voltage can be used to bias a laser diode 2-201 in the third stage 2-530 of the diode-driving circuit 2-390 near its lasing threshold. By biasing the laser diode near its threshold, a more rapid turn-on time of optical pulses from the laser diode can be achieved. In some implementations, the bias voltage may be used to bias a transistor M3 in the third stage 2-530 of the diode-driving circuit 2-390 just below its turn-on voltage. Biasing transistor M3 just below its turn-on voltage may provide a faster turn-on of the transistor and subsequently a faster turn-on of the laser diode 2-201.

The output from the second stage 2-520 may be provided directly to the gate of a high-power transistor M3 located in a third stage 2-530 (FIG. 2-5C) of the diode-driver circuit 2-390. One example of a high-power transistor is an enhancement mode GaN power transistor, model EPC2037, available from Efficient Power Conversion Corporation of El Segundo, Calif. The power transistor M3 may be connected to switch current through the laser diode 2-201. For example, the laser diode may be connected between a drain of the transistor M3 and a high-voltage supply $V_{1d}$ (e.g., a supply greater than 12V). A resistor $R_{14}$ may be connected in series with the laser diode to limit current applied to the laser diode 2-201. A value of resistor $R_{14}$ may be between 4 ohms and 60 ohms, according to some embodiments. In some cases, $R_{14}$ has a value within 20% of 15 ohms. To increase the turn-on speed of the laser diode 2-201, a charge-storage capacitor $C_9$ may be connected across the laser diode and transistor M3. A value of the charge-storage capacitor $C_9$ may be between 100 pF and 1200 pF, according to some embodiments. In some cases, $C_9$ has a value within 20% of 440 pF. At turn-on of transistor M3, accumulated charge in capacitor $C_9$ can provide an initial current to the laser diode 2-201.

According to some embodiments, a bypass inductor $L_2$ may be connected in series with a resistor $R_{13}$ across the laser diode 2-201. A value of the bypass inductor $L_2$ may be between 10 nH and 120 nH, and a value of the resistor $R_{13}$ may be between 5 ohms and 100 ohms, according to some embodiments. In some cases, a value of $L_2$ is within 20% of 30 nH and a value of $R_{13}$ is within 20% of 25 ohms. The bypass inductor $L_2$ may reduce a turn-off time of the laser diode 2-201 by providing a transient reverse bias to the laser diode when the power transistor M3 turns off (ceases to conduct).

In some implementations, a monitor port may connect to a drain of the power transistor M3 via a high impedance resistor $R_{12}$. A value of $R_{12}$ may be approximately 5 kilo-ohms, according to some embodiments. The monitor port may be used to monitor electrical pulse durations applied to the laser diode 2-201. The inventors have also recognized and appreciated that the monitor port and bias port of the second stage 2-520 may be used to evaluate the health of the laser diode 2-201. For example, a bias voltage may be swept at the bias input to the second stage 2-250 when a pulsed signal is not applied to the laser diode. A voltage of the drain of transistor M3 can be measured, from which an applied voltage across the laser diode 2-201 and a current through the laser diode can be determined. In some implementations, additionally a photodiode (not shown) may be used to monitor an optical output from the laser diode 2-201 to assess the health of the laser diode.

A temporal profile of an output optical pulse from a laser diode 2-201 (model PL520B available from OSRAM Opto Semiconductors GmbH of Regensburg, Germany) that is driven with the pulse generator 2-380 circuit like that depicted in FIG. 2-4C and pulse-driving circuit 2-390 like that depicted in FIG. 2-5A-2-5C is plotted in FIG. 2-6. For this demonstration, the laser diode is biased at 20 V and the average output optical power is about 2.8 mW. The optical power falls from a peak value of about 62 dB by 40 dB in about 550 ps. Reducing the average output optical power (by shorting the duration of the applied electrical pulse) shortens the turn-off time of the laser diode 2-201. For example, when the average optical power is reduced to about 1 mW at the same bias of 20 V, the turn-off time reduces to about 490 ps. For the drive circuitry shown, the turn-off time is highly stable over a broad range of output powers (nearly a factor of three change in output power).

If desired, a laser diode 2-201 may be modified to further reduce the turn-off time of the optical pulse. One modification may comprise adding additional parallel wire bonds between a circuit board's conductive interconnect or pin and the laser diode chip, as described in connection with FIG. 2-2C above. Another modification may comprise providing an output from the laser diode to a saturable absorber, which is a nonlinear optical element that attenuates low levels of radiation more than high levels of radiation. In some implementations, a saturable absorber may comprise a semiconductor device that is integrated onto a same chip as the laser diode. According to some embodiments, the saturable absorber may be formed as a saturable absorber mirror formed at one end of the laser diode's optical cavity.

According to some embodiments, a saturable absorber may comprise a semiconductor p-n junction and include a biasing supply configured to apply a bias across the junction.

The biasing supply may be used to sweep carriers out of the active region after each optical pulse and improve the response of the saturable absorber. In some embodiments, the bias may be modulated (e.g., at the pulse repetition rate) to make the saturable recovery time be time-dependent. This modulation may further improve pulse characteristics. For example, a saturable absorber can suppress a pulse tail by differentially higher absorption at low intensity, if the recovery time of the saturable absorber is sufficient. Such differential absorption can also reduce the pulse length. The recovery time of a saturable absorber may be adjusted by applying or increasing a reverse bias to the saturable absorber.

III. Coupling Optical Pulses to a Bio-Optoelectronic Chip

The inventors have recognized and appreciated that it is challenging optically and mechanically to reliably couple output pulses 1-122 from the laser diode 2-201 to tens of thousands of reaction chambers 1-330, or more, located within a packaged bio-optoelectronic chip 1-140 that a user can insert and remove from the hand-held bioanalytic instrument 1-100. It is important that the optical power, when coupled to the chip, be coupled efficiently and be distributed uniformly among the tens of thousands of reaction chambers. Such optical coupling may require micron-level or sub-micron-level positioning accuracy of the laser diode's output beam on an optical coupler 1-310 of the bio-optoelectronic chip for periods up to hours, e.g., during a gene sequencing run. Also, the hand-held instrument 1-100 must be able to reliably locate the optical beam from the laser diode 2-201 on the optical coupler 1-310 after each installation of a packaged bio-optoelectronic chip 1-140 with minimal or no user intervention. This can require long-range and coarse (tenth of one millimeter and tenth of one degree) positioning control and angular adjustment of the optical beam to orient the beam correctly at the location of the optical coupler 1-130.

The inventors have devised an opto-electromechanical system that enables reliable locating of the optical beam from the laser diode 2-201 on an optical coupler 1-310 of the bio-optoelectronic chip 1-141 after each installation of a packaged chip 1-140, and provides for fine positioning control of the beam to maintain stable alignment for hours of instrument operation. Referring again to FIG. 1-1, an opto-electromechanical system for the bioanalytic instrument 1-100 may comprise a combination of an alignment structure 1-102, a compact beam-steering assembly 1-115, and one or more adjustable optical components (1-121, 1-127) mounted on the alignment structure 1-102. The alignment structure 1-102 can provide a registration structure for accurate alignment of optical and electronic components of the bioanalytic instrument 1-100. Further, sensors (e.g., one or more photodiodes, a quad detector, etc.) may be located on the bio-optoelectronic chip 1-141 and provide feedback signals for controlling the beam-steering assembly 1-115 to maintain accurate alignment of the optical beam to an optical coupler 1-310 on the bio-optoelectronic chip 1-141. Such a feedback loop can be embodied in hardware, software, or a combination thereof as a proportional-integral-derivative (PID) control loop.

An example of an alignment structure 1-102 is depicted in FIG. 3-1A, though an alignment structure may be manufactured to have other shapes and features than those shown. According to some embodiments, an alignment structure 1-102 comprises a solid material that is formed to provide structural support and registered alignment for optical and electronic components (such as the packaged bio-optoelectronic chip 1-140) in the hand-held bioanalytic instrument 1-100. For example and referring again to FIG. 1-1, an alignment structure 1-102 may be adapted to have mounted thereto, with accurate alignment, the beam-steering assembly 1-115, pulsed source board 1-110, and optical components (e.g., turning mirror 1-121 and focus lens 1-127) that operate on the optical beam from the pulsed source board 1-110. These optical components and beam-steering assembly 1-115 may direct an output beam from the laser diode 2-201 to the packaged bio-optoelectronic chip 1-140.

An alignment structure 1-102 can further include features for registering the packaged bio-optoelectronic chip 1-140 to the alignment structure, which aides in reproducible and stable optical alignment of the beam from the laser diode 2-201 to an optical coupler 1-310 and micron-scale waveguides on the bio-optoelectronic chip 1-141 after insertion of a packaged chip 1-140 into the instrument by a user. For example, alignment features may be formed on the alignment structure that engage with features on a packaged bio-optoelectronic chip 1-140 and/or intervening component such as an interposer. The alignment features may help reliably register each packaged bio-optoelectronic chip 1-140 to a same position with respect to the alignment structure 1-102 when mounted in the bioanalytic instrument 1-100. The bio-optoelectronic chip 1-141 may be mounted with high precision within the package such that each bio-optoelectronic chip 1-141 registers to approximately a same orientation when the packaged bio-optoelectronic chip 1-140 is placed in the instrument 1-100. In this manner, the beam from the laser diode, which is also registered to the alignment structure, can be reliably and reproducibly located to within 10's of microns of an aligned position to the optical coupler 1-310 after each packaged chip 1-140 is inserted in the bioanalytic instrument 1-100. When located within 10's of microns of an aligned position, an automated alignment routine on the bioanalytic instrument 1-100 can achieve final alignment to the micron or sub-micron level without the need for user intervention. The alignment structure 1-102 can provide mechanical stability for maintaining the laser diode 2-201, beam-steering assembly 1-115, coupling optical components (e.g., turning mirror 1-121 and focus lens 1-127), and packaged chip 1-140 in an aligned configuration relative to each other during operation of the instrument.

According to some implementations, the alignment structure 1-102 can also provide heat dissipation functionality to aid in removing heat from the optical source and the bio-optoelectronic chip 1-141. In some cases, the alignment structure 1-102 can also form at least a portion of the enclosure for the bioanalytic instrument 1-100. By forming part of the instrument's enclosure, the alignment structure 1-102 can dissipate heat directly to the exterior of the instrument.

In further detail and referring now to FIG. 3-1A, an alignment structure 1-102 may comprise a registration platform 3-102, in some implementations. FIG. 3-1A shows a top-side perspective photo of an alignment structure 1-102. The registration platform 3-102 may be machined, cast, or molded from any suitable material and comprise a portion of the alignment structure 1-102 to which optical components and the packaged bio-optoelectronic chip 1-140 are mounted. For example, the registration platform 3-102 can comprise a plate-like portion of the alignment structure 1-102. In some cases, an alignment structure 1-102 may be machined or cast from aluminum, an aluminum alloy, or any suitable metal. In other embodiments, an alignment structure may be molded from a rigid plastic. In some embodiments, the alignment structure may be formed from a thermally conductive material (such as aluminum or an aluminum alloy) that aids in dissipating heat from components mounted to the alignment structure. For example, heat can travel through the alignment structure 1-102 to exterior walls 3-150, where the heat can be dissipated exterior to the instrument. In some cases, the registration platform 3-102 and/or additional features on the alignment structure 1-102 (e.g., walls, ribs) comprise at least part of a baffle when mounted in the bioanalytic instrument 1-100 that aids in directing or blocking airflow within the instrument.

There may be a plurality of features formed in an alignment structure 1-102 that can be used to register optical and electronic components to the platform and to each other. For example there may be first kinematic recesses 3-140 (e.g., conical holes) that can be used to align a turning mirror mount 1-106 to the alignment structure 1-102. Additionally, there may be an optical adjustment rail 3-130 formed in the registration platform. A lens mount 1-108 may mount into the optical rail and be adjustable manually. An alignment structure 1-102 may further include mounting holes 3-142 so that the alignment structure can be mounted to other components of the bioanalytic instrument 1-100 (e.g., fastened to a base shell).

An alignment structure 1-102 may include a chip opening 3-120 and a recessed chip guide 3-110 formed in the registration platform 3-102. The chip opening and recessed chip guide may provide an aligning receptacle that receives and aligns the packaged bio-optoelectronic chip 1-140 to the registration platform 3-102, according to some embodiments. Within the chip guide 3-110, there may be retaining holes 3-112 that can accommodate chip-retaining components, such as magnets in some cases.

Additional details of an underside of an alignment structure 1-102, according to some embodiments, can be seen in FIG. 3-1B. In some cases, there may be second kinematic recesses 3-160 located on an underside of the registration platform. The second kinematic recesses 3-160 may be used to reproducibly align the beam-steering assembly 1-115 to registration platform 3-102 when mounted to the platform. There may be an optical through-hole 3-170 passing through the registration platform 3-102 so that an optical beam from the pulsed source board 1-110 can pass through the platform to a top side of the registration platform 3-102.

According to some embodiments, an alignment structure 1-102 may include walls 3-150 that can provide stiffness to the registration platform 3-102. The walls 3-150 may be at a periphery of the platform 1-102, though some implementations may include walls that run to and/or across an interior region of the platform. The walls 3-150 can extend away from (e.g., vertically or at an angle from) the registration platform 3-102. In some embodiments, an alignment structure may additionally or alternatively include reinforcing ribs 3-155 that may run into and/or across interior regions of the registration platform 3-102.

In some implementations, optical components that direct an optical beam from the laser diode 2-201 to the packaged bio-optoelectronic chip 1-140 may be located centrally along the registration platform 3-102 at a location that is substantially neutral to warping or twisting modes or thermal expansion of the alignment structure. Locating optical components centrally along the registration platform 3-102 may reduce the influences of temperature change, stress changes, and twisting vibrations on beam alignment.

An example optical system 3-205 for a bioanalytic instrument 1-100 is depicted in FIG. 3-2A. In some cases, an optical system 3-205 comprises three lenses and one turning mirror, though in some embodiments fewer or more optical components may be used. For example, there may be a first lens 3-210 mounted by a board lens mount 3-205 to the pulsed source board 1-110. The first lens 3-210 may be mounted in the board lens mount 3-205, aligned carefully over the laser diode 2-201, and adhered or otherwise attached to the pulsed source board 1-110 via the board lens mount 3-205. A second lens 3-220 can be mounted to a tip-tilt gimbal mount within the beam-steering assembly 1-115. In some implementations, instead of a second lens 3-220 mounted in the gimbal, an optical flat (not shown) may be used instead. In such implementations, only two lenses may be needed between the pulsed source board 1-110 and the packaged bio-optoelectronic chip 1-140. The beam-steering assembly 1-115 and pulsed source board 1-110 may align and mount to an underside of the alignment structure 1-102 using the kinematic recesses 3-160. A turning mirror 1-121 and focusing lens 1-127 may align and mount to a top side of the registration platform 3-102, according to embodiments.

Although FIG. 3-2A shows a laser diode 2-201 mounted on the pulsed source board 1-110, other embodiments can have one or more laser diodes or light-emitting diodes mounted elsewhere internal or external to the bioanalytic instrument 1-100, and optical fiber can be used to deliver excitation radiation to the location of the laser diode 2-201 depicted in FIG. 3-2A. For example, one or more laser diodes (having same or different wavelengths) can be coupled to one or more optical fibers. Outputs from the fibers can be combined onto a single optical fiber. An end of the single optical fiber can be mounted at the location of the laser diode 2-201 and pointing towards the first lens 3-210. In some cases, a graded-refractive index lens may be coupled to the end of the single optical fiber and used instead of the first lens 3-210.

One or more fiber-coupled lasers can be located external to the bioanalytic instrument 1-100 in some implementations. In such cases, a clock signal(s) can be derived from drive electronics for the fiber-coupled laser(s) or from the optical pulses output from the fiber-coupled laser(s). The clock signal(s) can be provided to the bio-optoelectronic chip 1-141 and used to trigger data acquisition on the chip 1-141. For example, the clock signal(s) can be used to determine the timing of charge accumulation bins of the time-binning photodetectors 1-322 on the chip 1-141.

In some implementations, the first lens 3-210 may comprise an aspherical lens of short focal length (no more than 10 mm) that collects radiation from the laser diode 2-201 and partially collimates the radiation. The focal length may be between 2 mm and 5 mm According to some implementations, the first lens 3-210 may have a focal length of approximately 3 mm. The first lens 3-210 may be mounted a distance from the emitting surface of the laser diode 2-201 that is within 5% of the focal length of the first lens. The optical beam after the first lens may diverge. In some embodiments, the first lens 3-210 has a large numerical aperture (NA), e.g., no less than 0.5. In some cases, the NA is between 0.5 and 0.9. In some aspects, the NA of the first lens 3-210 may be selected to approximately match an NA of the laser diode 2-201. The first lens 3-210 may be anti-reflection coated for the lasing wavelength $\lambda$ of the laser diode 2-201, and may provide a wavefront distortion no greater than $\lambda/4$ peak-to-valley. In some cases, the first lens 3-210 may provide a wavefront distortion no greater than $\lambda/10$ peak-to-valley.

A second lens 3-220 (or in some embodiments an optical flat) of the optical system 3-205 may be mounted in a tip-tilt gimbal mount of the beam-steering assembly 1-115 a short distance from the first lens 3-210. The second lens 3-220 (or optical flat) may be rotatable about two axes (about the X and Y axes in FIG. 3-2) to shift the outgoing beam 3-201 laterally causing Y and X translations, respectively, on the bio-optoelectronic chip 1-141. The optical beam 3-201 after the second lens may be nearly collimated (e.g., within 3 degrees of being collimated). In some cases, the second lens may be a plano-convex lens that is anti-reflection coated for the lasing wavelength $\lambda$ of the laser diode 2-201, and contributes a wavefront distortion no greater than $\lambda/4$ peak-to-valley. In some cases, the second lens 3-220 may provide a wavefront distortion no greater than $\lambda/10$ peak-to-valley.

In some embodiments, the second lens 3-220 may have a significantly longer focal length and smaller NA than the first lens 3-210. For example, the second lens 3-220 may have a focal length between 40 mm and 80 mm and an NA between 0.02 and 0.1. According to some embodiments, the second lens 3-220 may be located within 10 mm of the first lens 3-210. For example, the second lens 3-220 can be de-spaced along the optical beam path from a focal-length distance of the second lens from the first lens. The de-spacing of the second lens can be as much as 80% of the focal length of the second lens 3-220. By de-spacing the second lens 3-220, rotation of the second lens can provide essentially a shift in position of the beam at the optical coupler 1-310 on the bio-optoelectronic chip 1-141 with an insignificant amount of change in direction angle of the beam at the optical coupler.

The optical system 3-205 for the bioanalytic instrument 1-100 may further include a first turning mirror 1-121 that is self-aligned and mounted to a top side of the alignment structure 1-102 using the first kinematic recesses 3-140 and a turning mirror mount 1-106. In some embodiments, the turning mirror mount 1-106 is manually adjustable and locks in place using counter-opposing screws. An example of a manually-adjustable turning-mirror mount 3-225 is depicted in FIG. 3-2A. Manually adjustment of the turning mirror 1-121 may be used to provide initial factory alignment for the instrument and field service alignment if needed. According to some embodiments, three screws 3-227 may be adjusted to tip, tilt, raise, and lower the turning mirror 1-121. For example, the three screws may comprise a three-point contact to the registration platform 3-102. The turning mirror 1-121 may be located approximately one focal length of the third lens 1-127 from the third lens. Accordingly, tip and tilt adjustments of the turning mirror 1-121 can change the lateral position of the optical beam from the laser diode on an optical coupler of the bio-optoelectronic chip 1-141. Raising and lowering the turning mirror can change an exit angle of the optical beam from the third lens 1-127 and thereby change a pitch incident angle ($\theta_i$ referring to FIG. 1-3) of the optical beam on an optical coupler of the bio-optoelectronic chip 1-141. Counter-opposing screws (counter to the adjustment screws) may be used to lock the turning mirror mount in place after coarse alignment is obtained. According to some embodiments, the first turning mirror 1-121 is an optical flat oriented at approximately 45 degrees with respect to the incoming beam that contributes a wavefront distortion no greater than $\lambda/4$ peak-to-valley. In some cases, the first turning mirror 1-121 may provide a wavefront distortion no greater than $\lambda/10$ peak-to-valley.

A third focusing lens 1-127 may also be mounted to a top side of the registration platform 3-102 using a manual, single- or multi-axis, adjustable lens mount 1-108 and one or two optical adjustment rails 3-130. FIG. 3-1A depicts an embodiment with a single-axis adjustable lens mount 1-108. FIG. 3-2B depicts an embodiment in which a dual-axis, adjustable lens mount 3-208 is implemented. The third lens 1-127 may slide along optical adjustment rail(s) 3-130 and lock in place with screws. Adjustment of the position of the third lens may be made during an initial factory alignment or during field service, according to some embodiments.

According to some embodiments, a yaw angle of the third lens 1-127 may be adjustable. For example, the lens mount 1-108 may provide for rotation of the third lens. Adjusting the yaw of the third lens may be used to adjust a yaw incident angle ($\phi_i$ referring to FIG. 1-3) of the beam on an optical coupler of the bio-optoelectronic chip 1-141. In other embodiments, as depicted in FIG. 3-2B, a yaw angle of the third lens is not adjustable, and instead lateral motion of the third lens 1-127 is adjustable. Although adjustments for the lens mount 3-208 and turning mirror mount 3-225 are illustrated as manual screw adjustments, the turning mirror 1-121 and/or third lens 1-127 could be adjusted using automated or semi-automated adjustable mounts. In such embodiments, actuators (e.g., linear motion actuators, motorized screw actuators, piezo actuators, voice-coil drivers, etc.) can be used to make adjustments to the turning mirror 1-121 and/or third lens 1-127.

In some implementations, the third lens 1-127 may be of a same design as the second lens 3-220, though the third lens may have a different focal length and NA than the second lens 3-220 in other embodiments. The third lens may be located within 50 mm from the second lens, and such that the distance between the third lens 1-127 and the bio-optoelectronic chip's optical coupler is approximately equal to the focal length of the third lens. In some cases, the third lens 1-127 may be a plano-convex lens that is anti-reflection coated for the lasing wavelength $\lambda$ of the laser diode 2-201, and contributes a wavefront distortion no greater than $\lambda/4$ peak-to-valley. In some cases, the third lens 1-127 may provide a wavefront distortion no greater than $\lambda/10$ peak-to-valley. In some implementations, the third lens 1-127 may be cut to a rectangular or semi-rectangular shape with round short ends, as depicted in FIG. 3-2B, from a circular lens to reduce an amount of height required by the third lens.

According to some embodiments, a second turning mirror 3-240 may be located in the packaged bio-optoelectronic chip 1-140. Accordingly, the second turning mirror 3-240 and packaged bio-optoelectronic chip 1-140 may be inserted into and taken out of the bioanalytic instrument 1-100 with each sample to be analyzed.

In some implementations, the optical system 3-205 magnifies the beam output from the laser diode 2-201. The magnification of a focused beam at the optical coupler 1-310 on the bio-optoelectronic chip 1-141 may be between 10 and 30. Additionally, the magnified beam may have an elliptical transverse intensity profile that is well matched to the optical coupler. In some embodiments, the focal spot at the optical coupler 1-310 may have an aspect ratio of approximately 1:3 (e.g., 25 microns by 70 microns). The long axis of the ellipse may be oriented to distribute radiation uniformly into multiple parallel waveguides located on the surface of the bio-optoelectronic chip 1-141. The long axis of the elliptical beam may have a length between 50 microns and 150 microns on the surface of the bio-optoelectronic chip 1-141, according to some embodiments. In some cases, further elongation of the beam at the bio-optoelectronic chip may be desirable, e.g., to increase an amount of power coupled into an increased number of waveguides. In such cases, one or more cylindrical lenses or prisms may be included in the optical system after the first turning mirror 1-121.

Further details of a beam-steering assembly 1-115 are depicted in FIG. 3-3, according to some embodiments. A beam-steering assembly 1-115 may comprise a beam-steering casing 3-305 that supports a rotatable X-plate 3-320 and a rotatable Y-frame 3-330. The second lens 3-220 may mount to a lens mount 3-360 in the X-plate 3-32. Rotation of the X-plate can shift a beam passing through the second lens in the X-direction, and rotation of the Y-frame 3-330 can shift a beam passing through the second lens in the Y-direction. The X-plate 3-320 may be supported by X-bearings 3-325 that attach to the Y-frame 3-330. The Y-frame 3-330 may be connected to the beam-steering casing 3-305 by Y-bearings 3-335, according to some embodiments. In some cases, the Y-frame 3-330 may be connected to the pulsed source board 110 or another circuit board by Y-bearings 3-335. There may be two X-bearings 3-325 and two Y-bearings 3-335. In some embodiments, the X-plate 3-320 and Y-frame 3-330 are balanced in weight about their rotational axes, so there is negligible or no preferential rotation of either plate due to weight.

There may be two or more voice coils 3-340 located below the X-plate 3-320 that are used to drive rotation of the X-plate 3-320 and the Y-frame 3-330. There may be ferromagnetic material or magnetic rods held in close proximity to the voice coils 3-340 located on the underside of the X-plate 3-320. When activated, the voice coils 3-340 can provide an electromotive force on the ferromagnetic material or magnetic rods to rotate either or both of the X-plate 3-320 and Y-frame 3-330. In some implementations, to sense movement of the X-plate 3-320 and Y-frame 3-330, there may be interdigitated electrodes 3-350 that change capacitance as the X-plate or Y-frame are rotated. Electronically detecting an amount of capacitance in these electrodes (e.g., using a resonant LC circuit) can determine a position of the X-plate 3-320 and Y-frame 3-330 and/or position of a deflected beam 3-201. In other embodiments, inductive sensors can be used to sense rotation of the X-plate or Y-frame, as described further below.

To aid alignment of the beam-steering assembly 1-115 to the alignment structure 1-102, there may be third kinematic recesses 3-310 machined into the beam-steering casing 3-305. The first, second, and third kinematic recesses may comprise conical recesses machined into the surfaces of the respective components. The third kinematic recesses 3-310 may align to the second kinematic recesses 3-160 that are formed on an underside of the alignment structure 1-102 (see FIG. 3-1B). For the example shown, there are three second kinematic recesses 3-160 on the platform 1-102 and three mating third kinematic recesses 3-310 machined on an upper side of the beam-steering casing 3-305. During assembly, three ball bearings may be placed between the mating pairs of kinematic recesses and provide precise alignment of the beam-steering assembly 1-115 to the registration platform 3-102 when the beam-steering assembly is attached to the alignment structure. The turning mirror mount 1-106 may be mounted to an upper side of the registration platform 3-102 using the same method. According to some implementations, the pulsed source board 1-110 may then align and attach (via pins and/or screws) to an underside of the beam-steering casing 3-305, as depicted in FIG. 3-3.

Figures 1, 2, 3, 4:
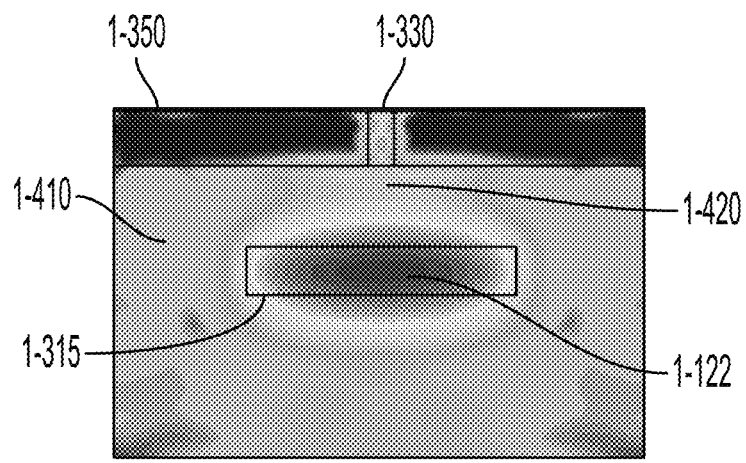
Figures 2, 3, 4, 4A:
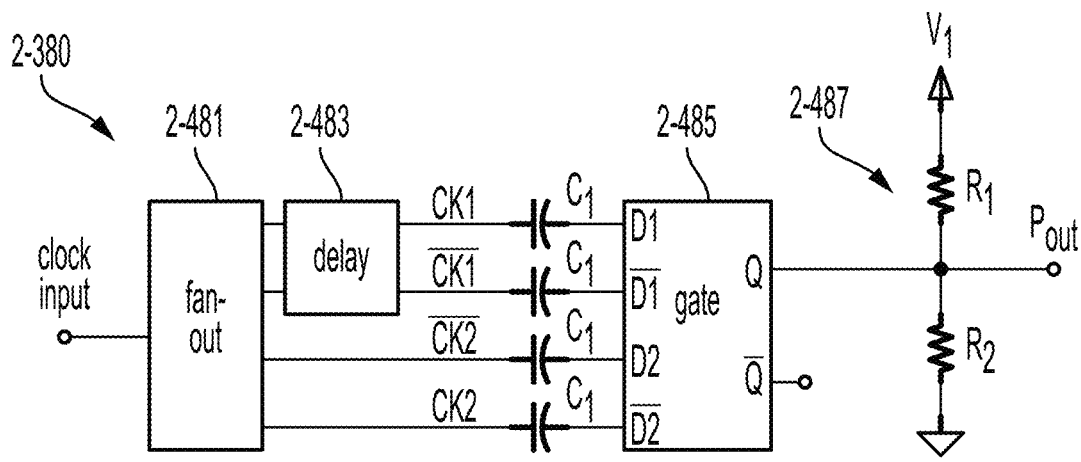

Additional details of a pulsed source board 1-110 are shown in FIG. 3-4A, according to some embodiments. The drawing shows a plan view of a pulsed source board 1-110. According to some embodiments, the board lens mount 3-205 and the voice coils 3-340 may be mounted near the center of the pulsed source board 1-110. For the embodiment depicted in FIG. 3-4A, two inductive sensors comprising inductors 3-450 are used to sense rotation of the X-plate 3-320 and Y-frame 3-330.

In operation, a beam from the laser diode 2-201 (located within the board lens mount 3-205) will be collected by the first lens 3-210 lens that is mounted in the board lens mount 3-205 and directed through a second lens supported by the second lens mount 3-360 in the X-plate 3-320 of the beam-steering assembly 1-115. As the second lens 3-220 tips and tilts through rotation of the X-plate 3-320 and Y-frame 3-330, the beam from the laser diode 2-201 will deflect in the X and Y directions.

Normally, one would not attempt to locate an optical source (e.g., laser diode 2-201) on a same printed circuit board as actuators for the X-plate 3-320 and Y-frame 3-330 of the beam-steering assembly 1-115 where micron-level alignment tolerances are needed, because forces exerted by the drivers or actuators could distort the PCB and adversely affect alignment of the optical beam from the optical source to the bio-optoelectronic chip 1-141. However, locating the drivers on a different PCB would require additional space within the instrument. As described below, the inventors have implemented reinforcing members that can reduce unwanted motion of the PCB due to action of the actuators (e.g., action of voice coils 3-340).

Figures 2, 3, 4, 4B:
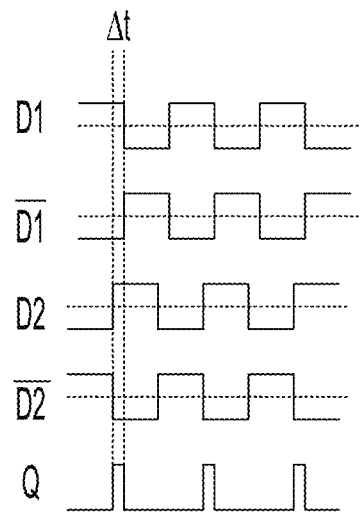
Figures 2, 3, 4, 4C:
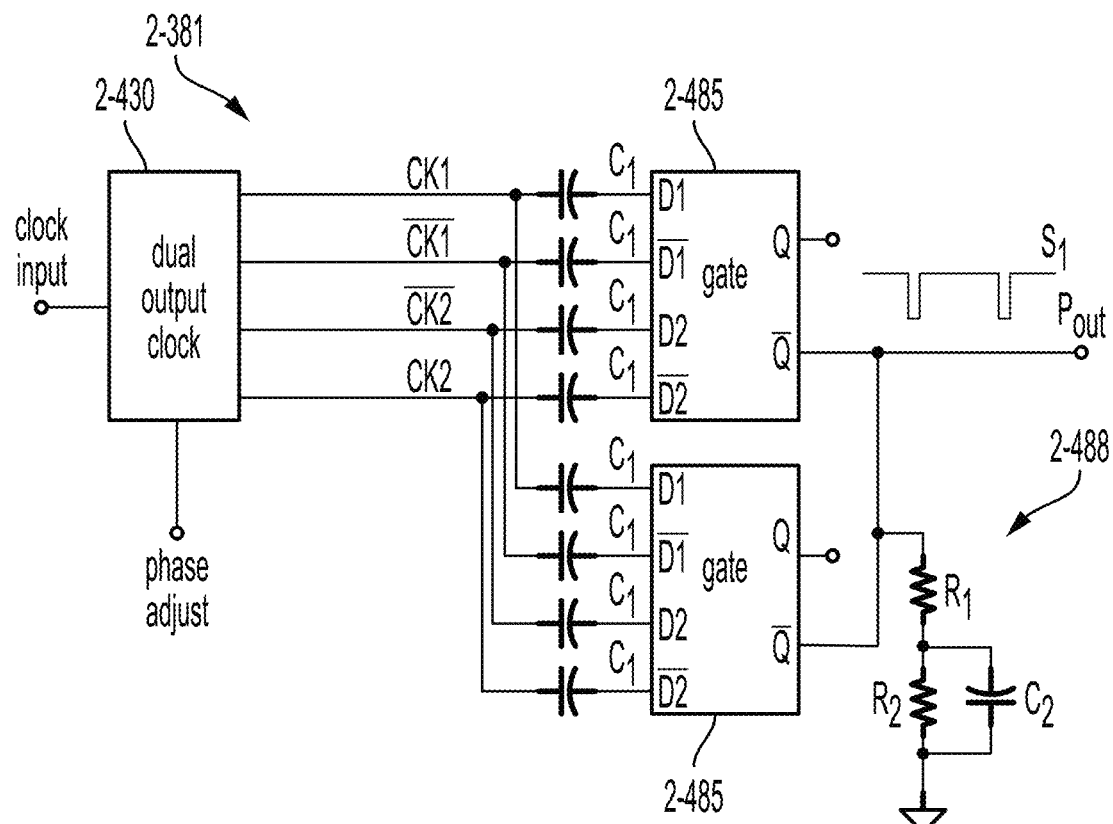
Figures 2, 3, 4, 5, 5A:
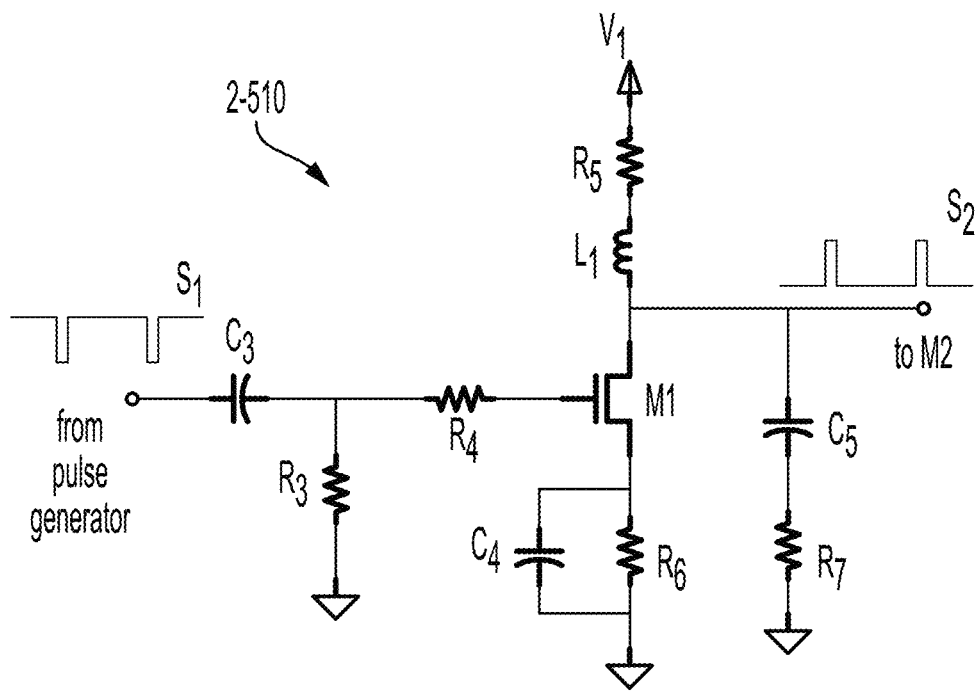
Figures 2, 3, 4, 5, 5B:
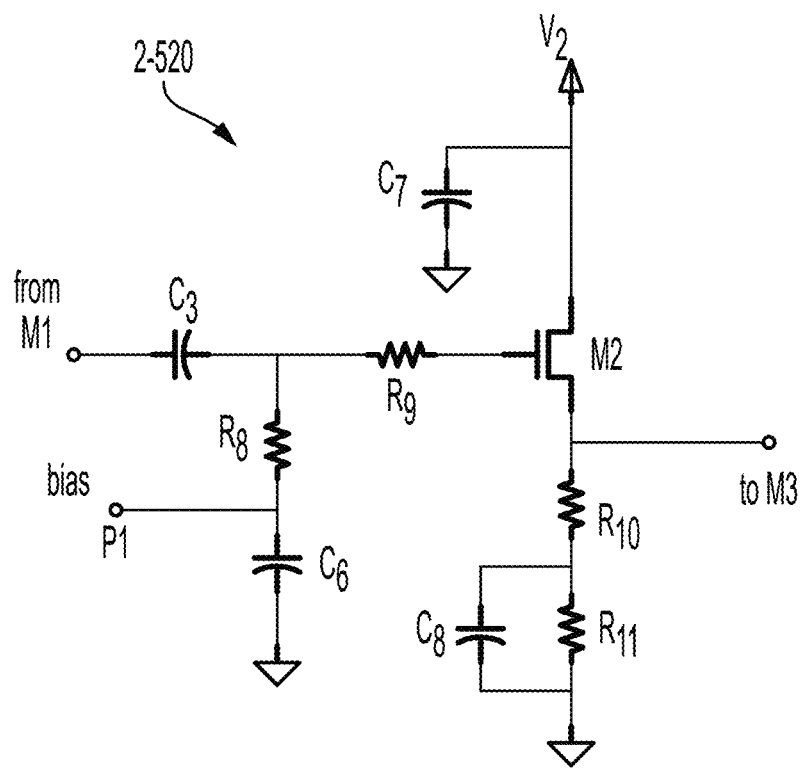
Figures 2, 3, 4, 5, 5C:
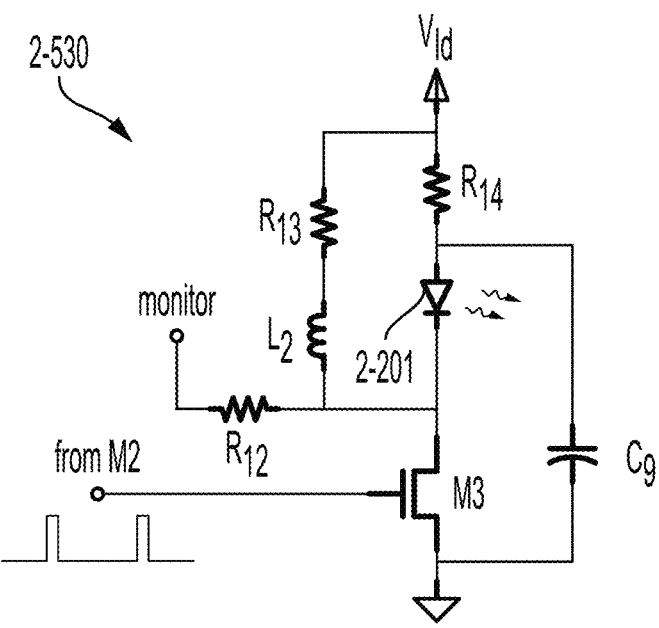
Figures 2, 3, 4, 5, 6:
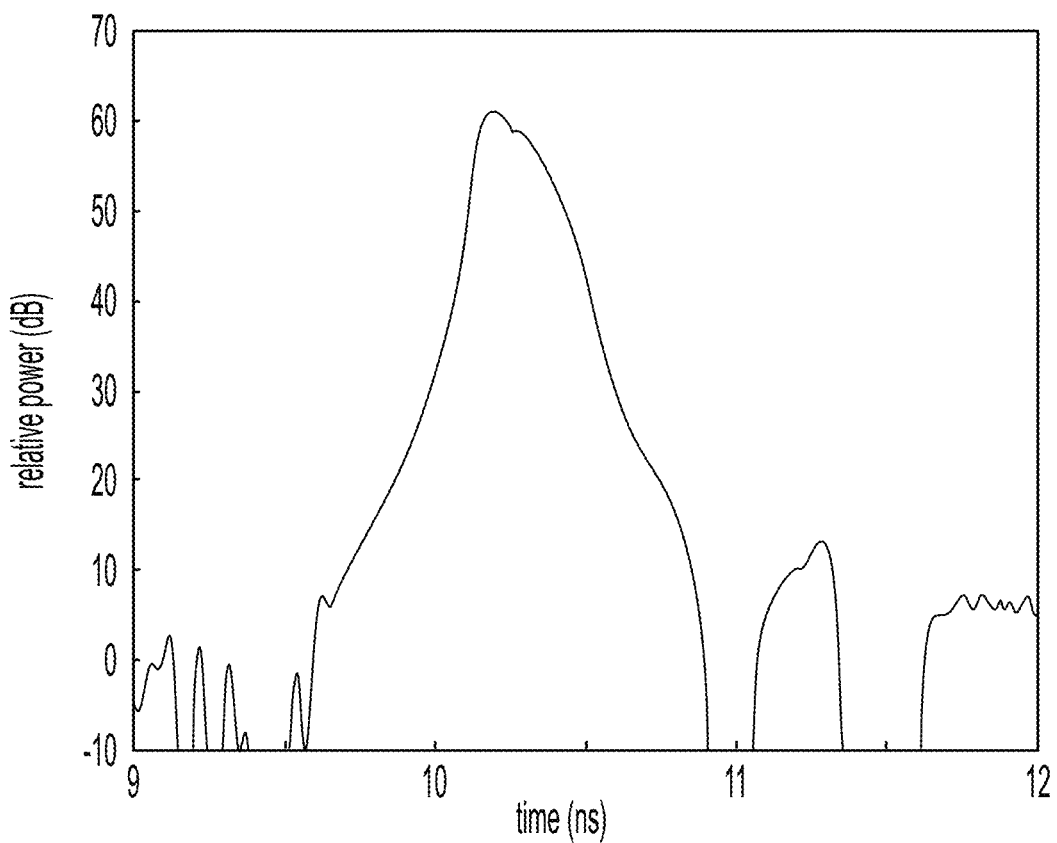
Figures 1A, 3:
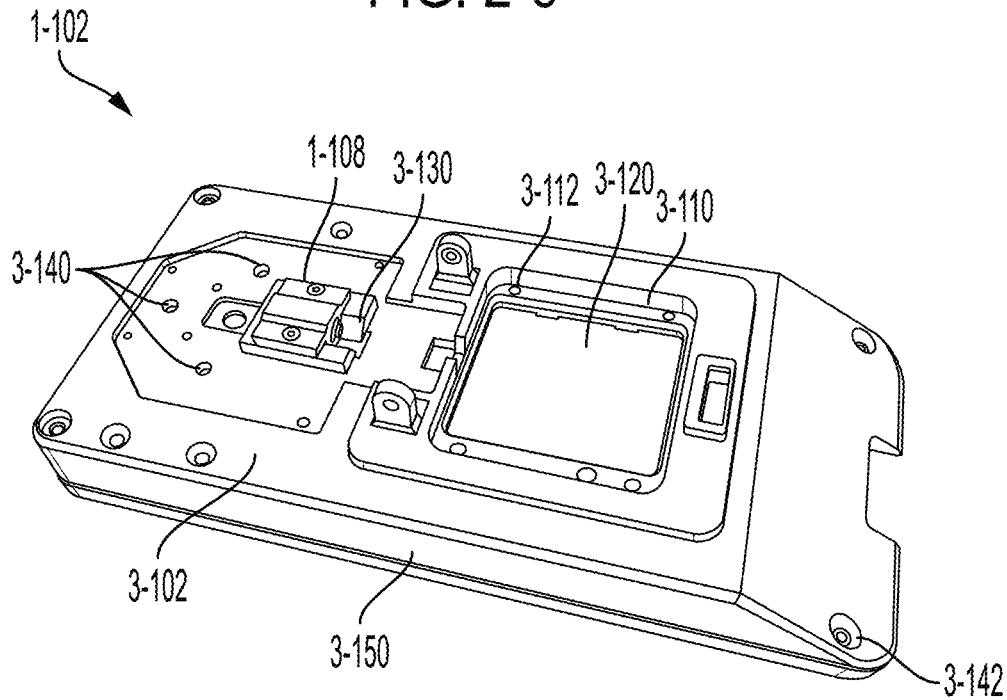
Figures 1B, 3:
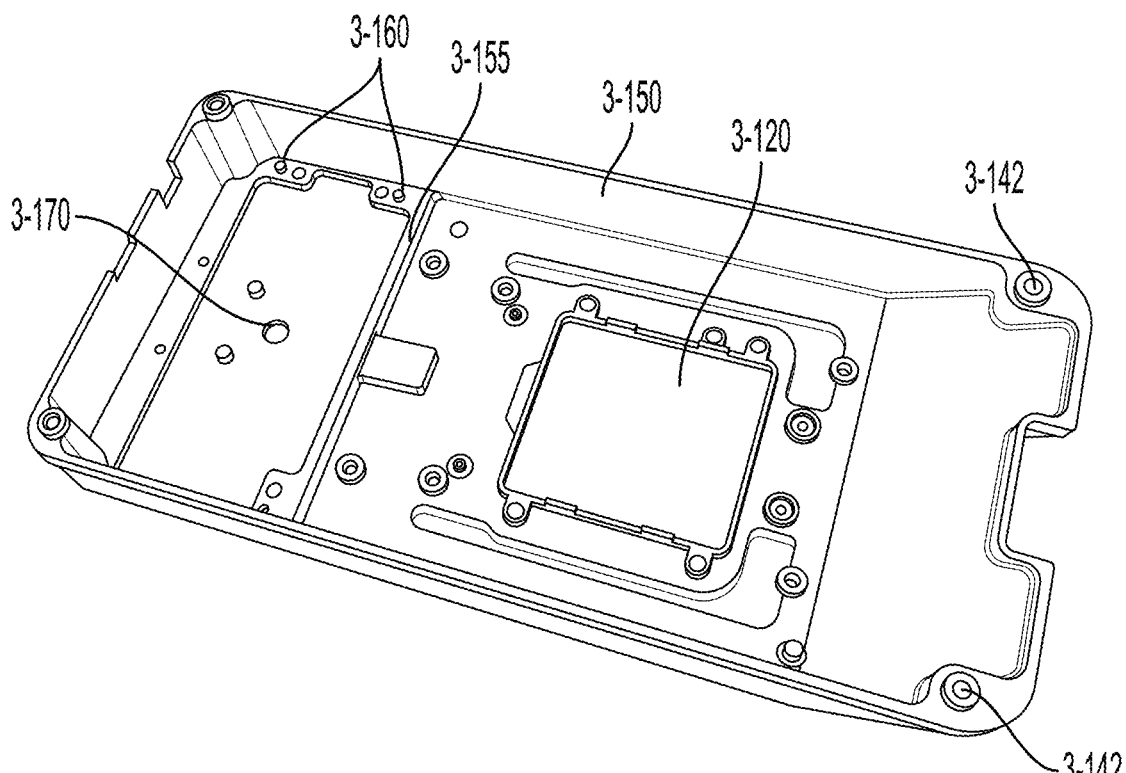
Figures 2A, 3:
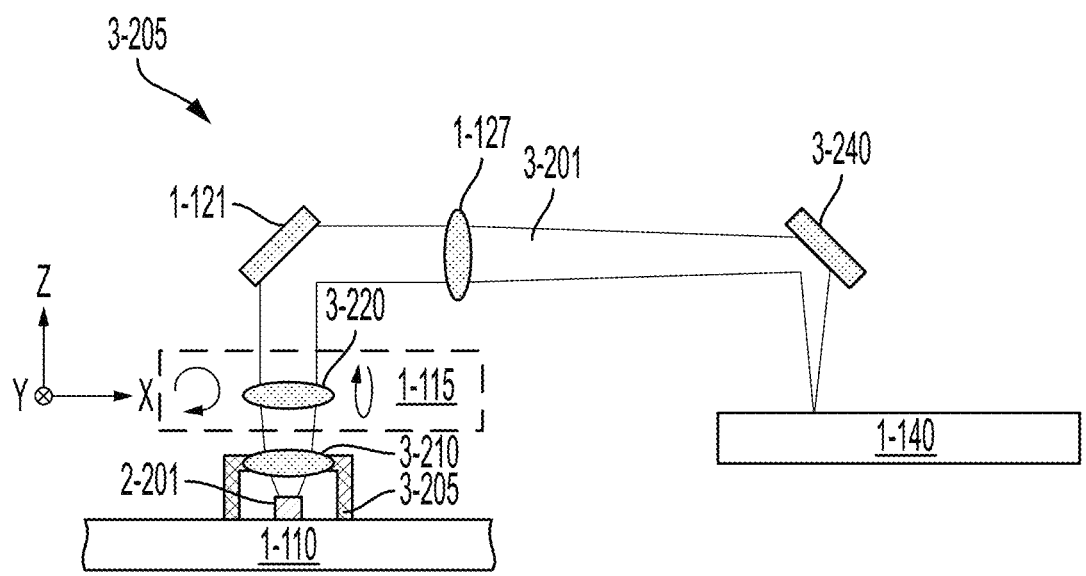
Figures 2B, 3:
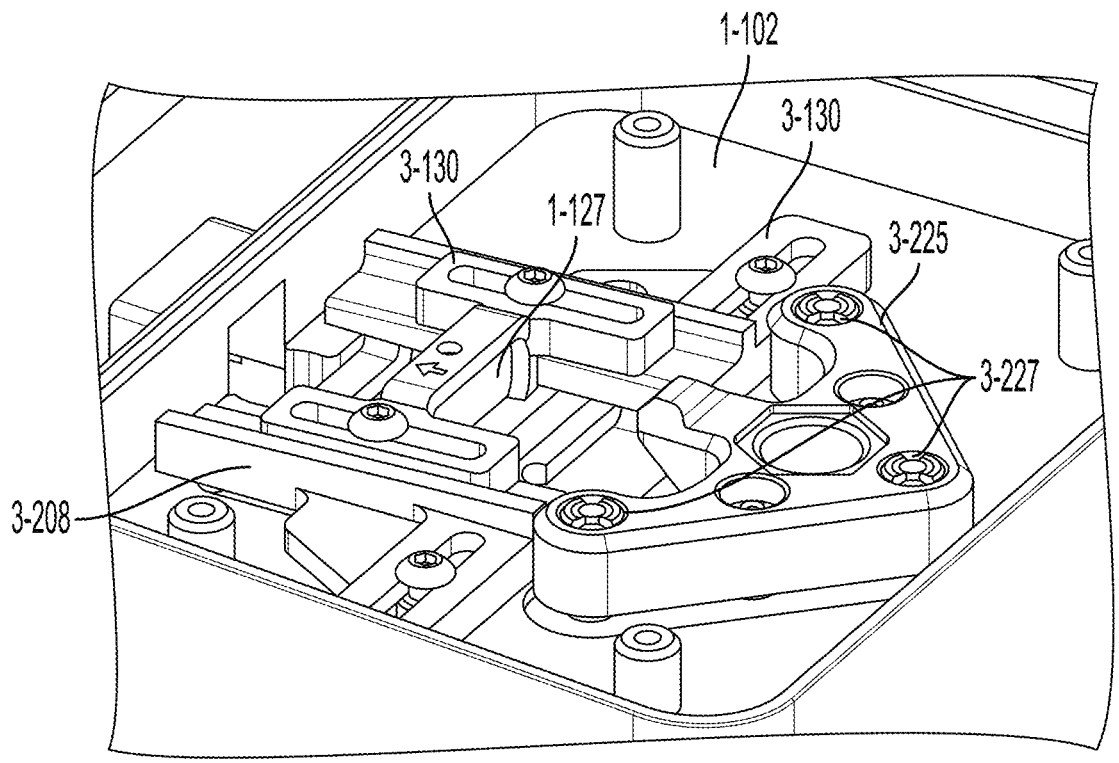
Figure 3:
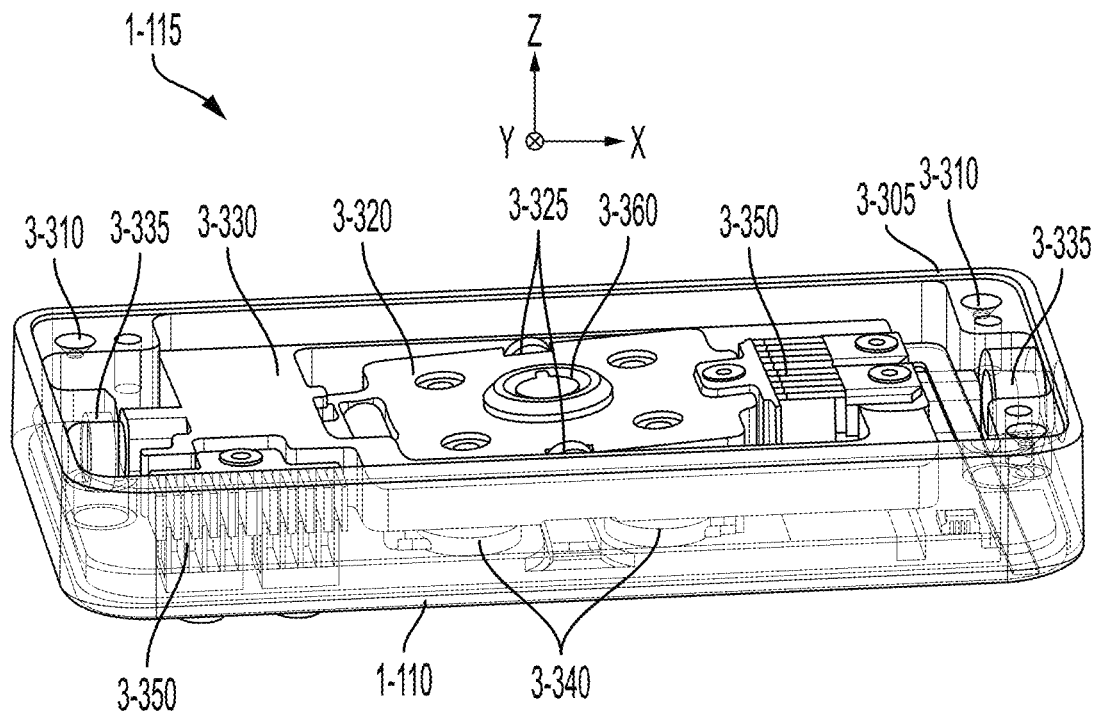
Figures 3, 4, 4A:
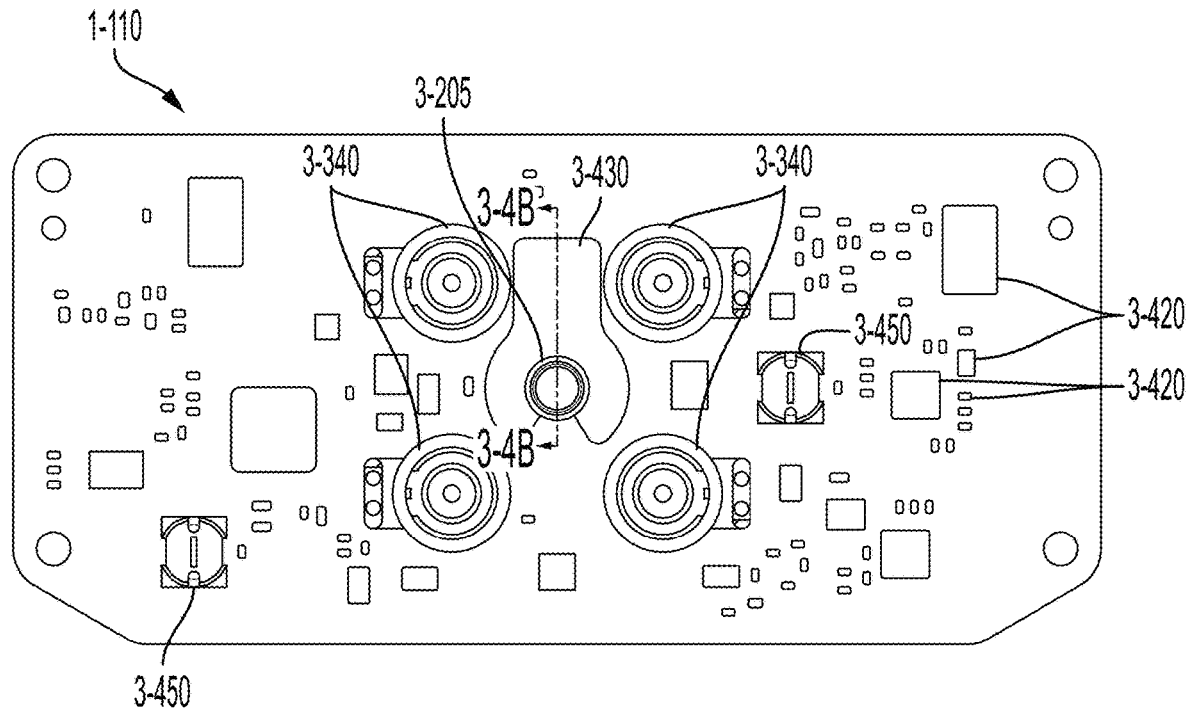
Figures 3, 4, 4B:
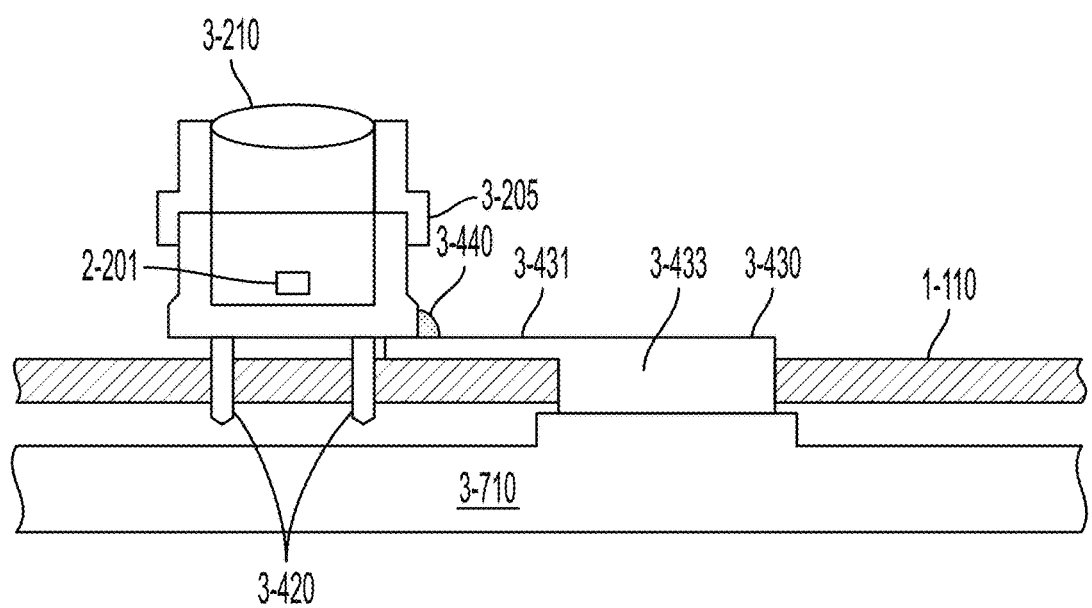
Figures 3, 4, 5:
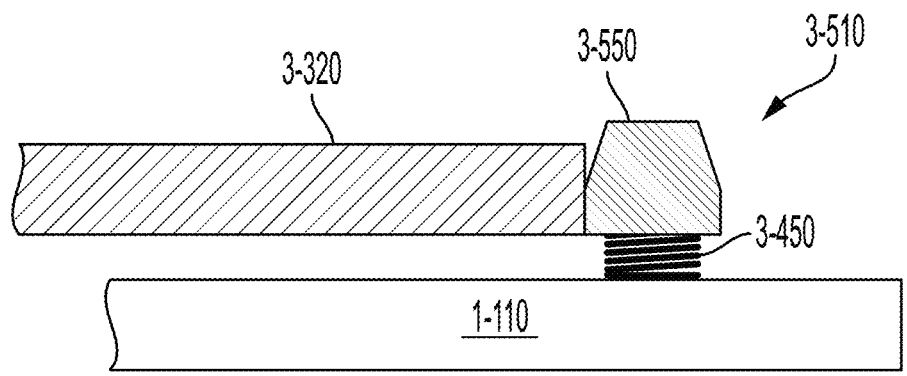
Figures 3, 4, 5, 6, 6A:
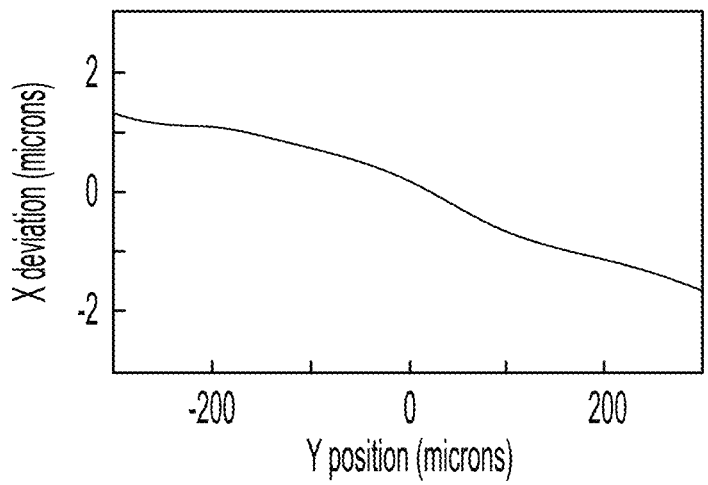
Figures 3, 4, 5, 6, 6B:
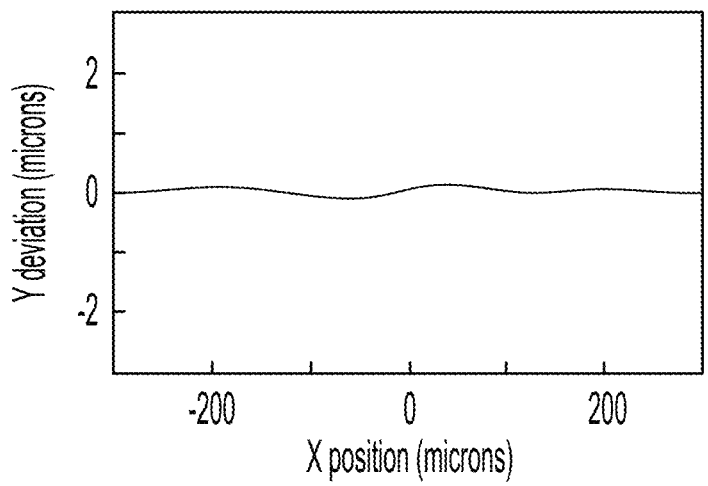
Figures 3, 4, 5, 6, 7:
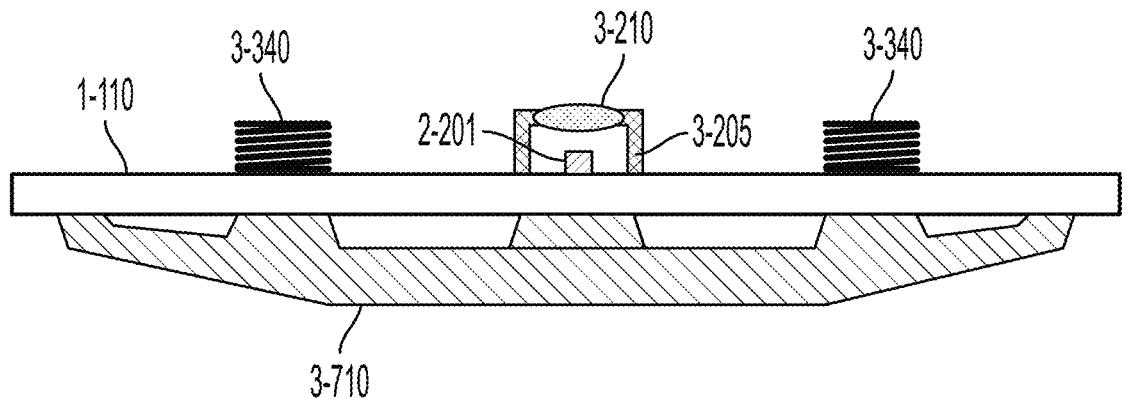
Figures 3, 4, 5, 6, 7, 8:
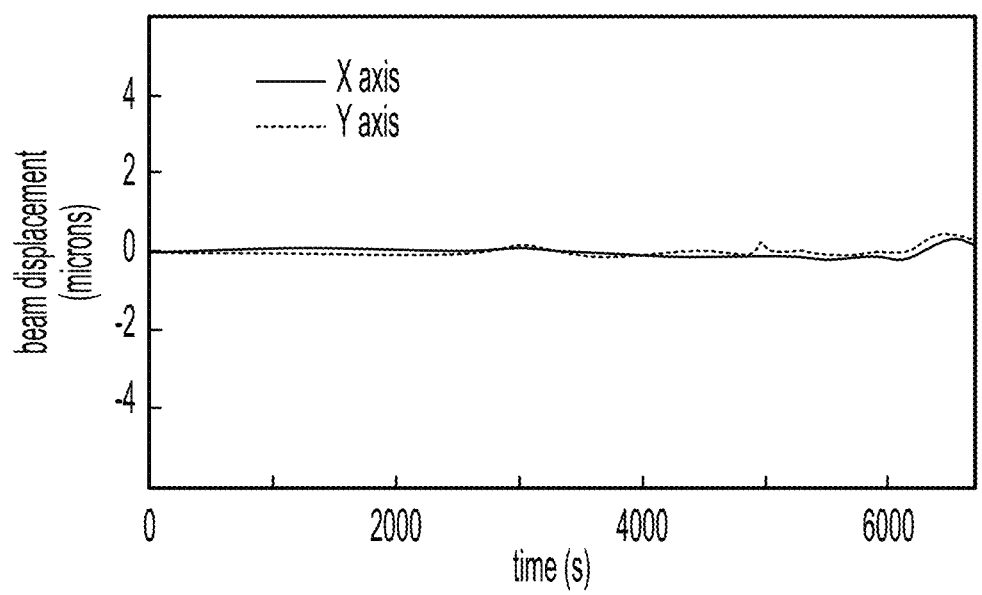
Figures 3, 4, 5, 6, 7, 8, 9, 9A:
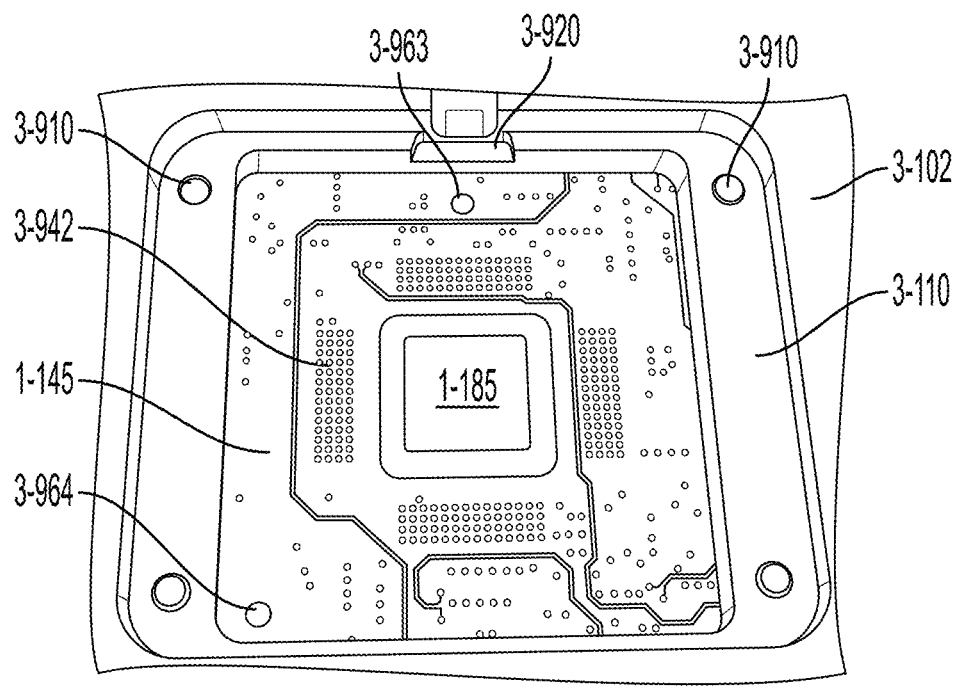
Figures 3, 4, 5, 6, 7, 8, 9, 9B:
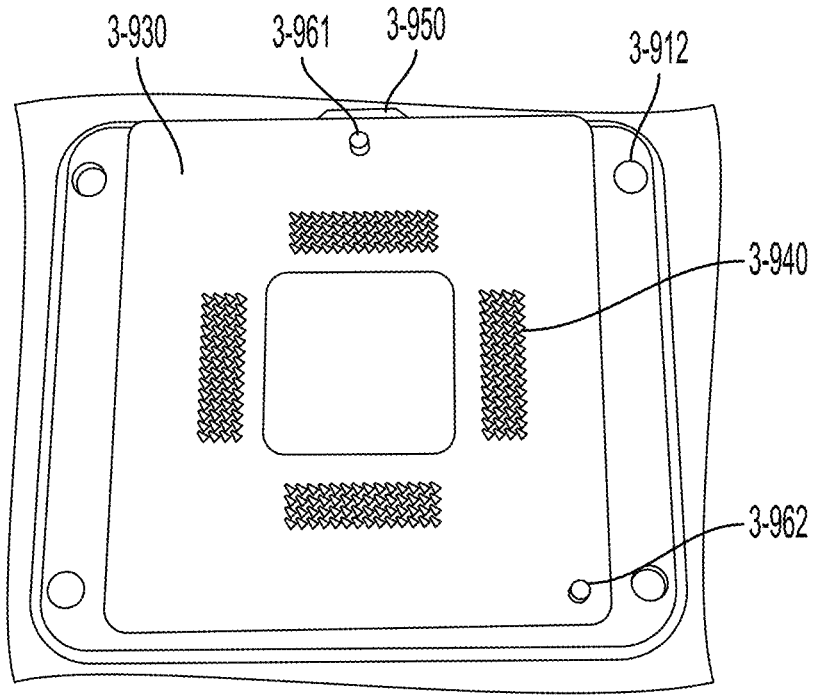
Figures 3, 4, 5, 6, 7, 8, 9, 10, 10A:
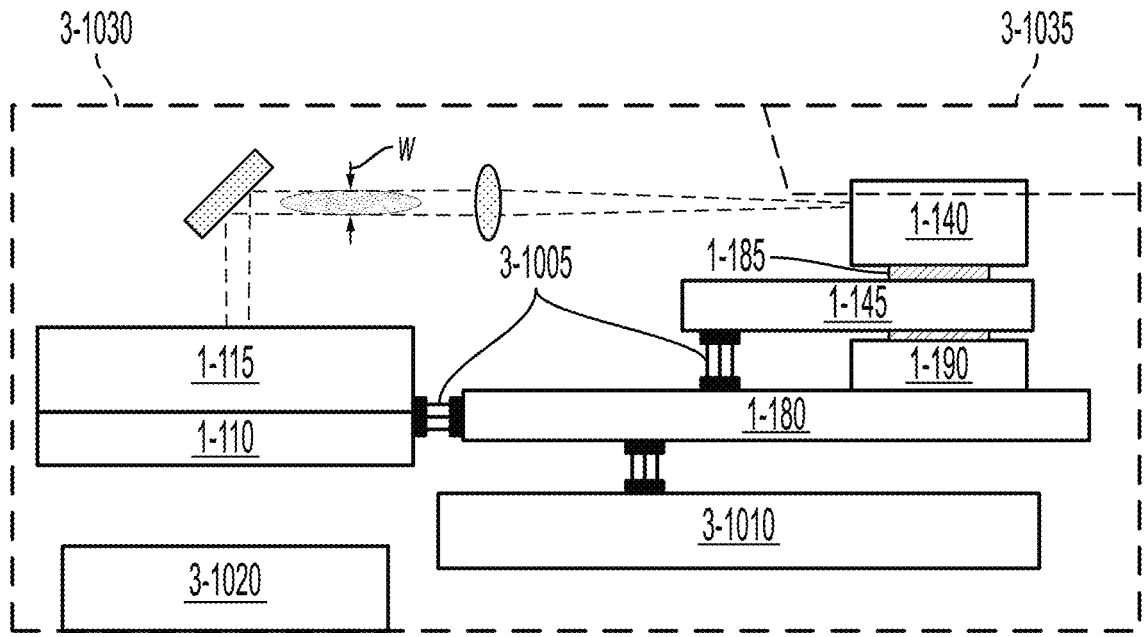
Figures 3, 4, 5, 6, 7, 8, 9, 10, 10B:
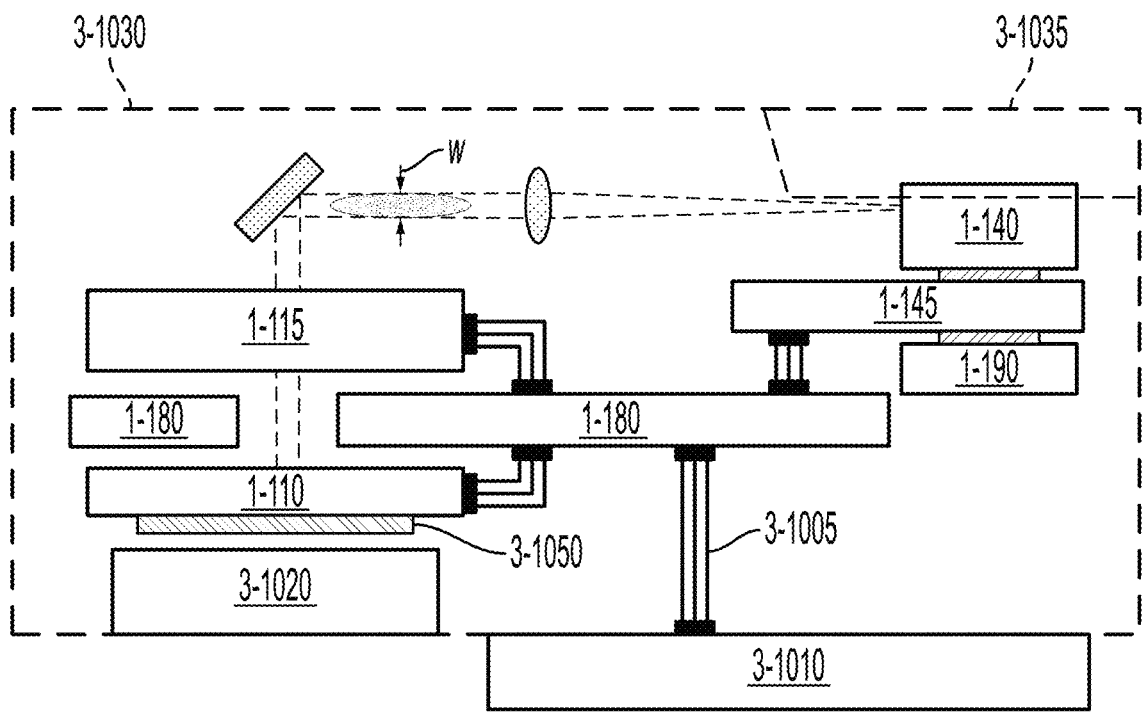
Figures 3, 4, 5, 6, 7, 8, 9, 10, 10C:
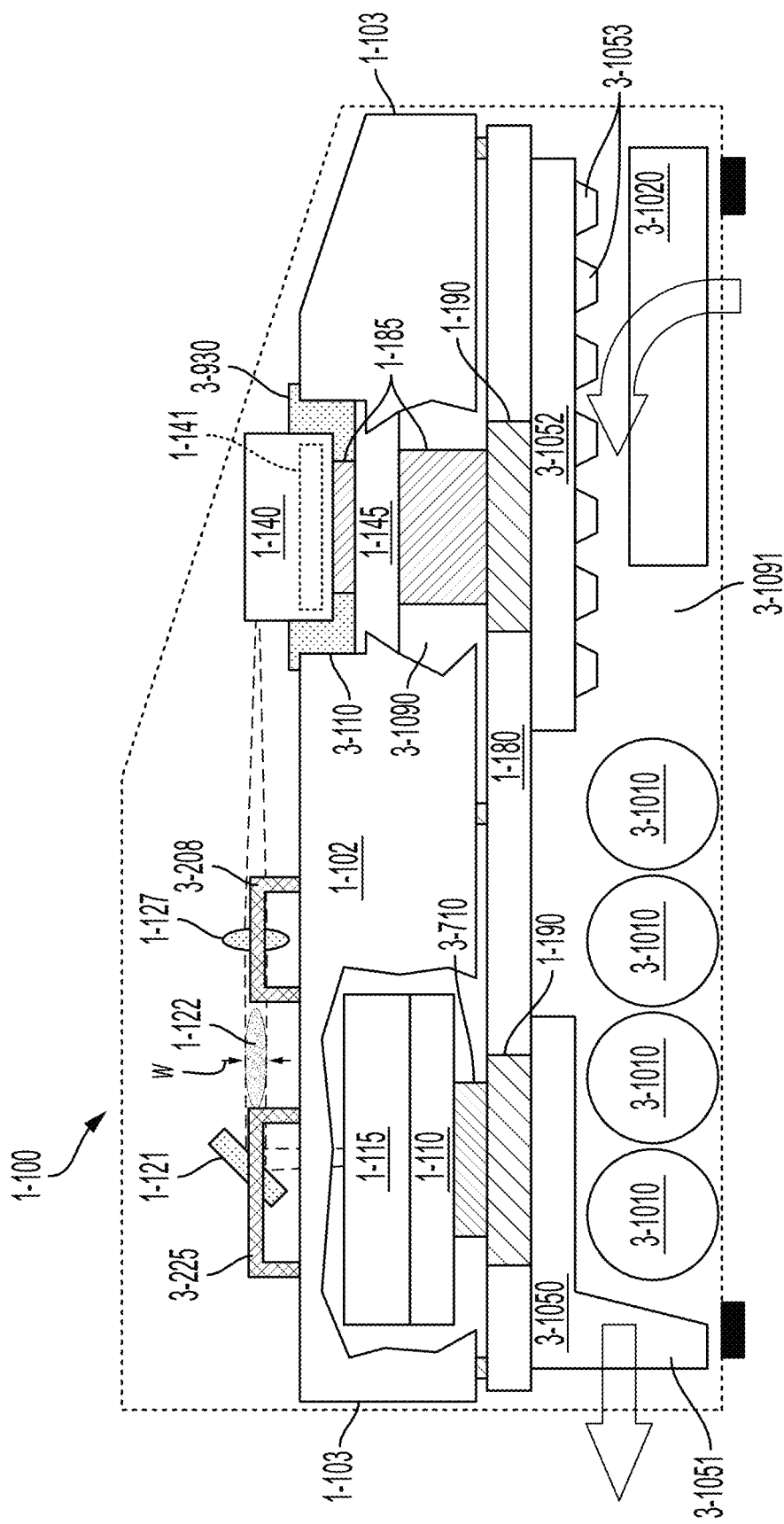
Figures 1, 4:
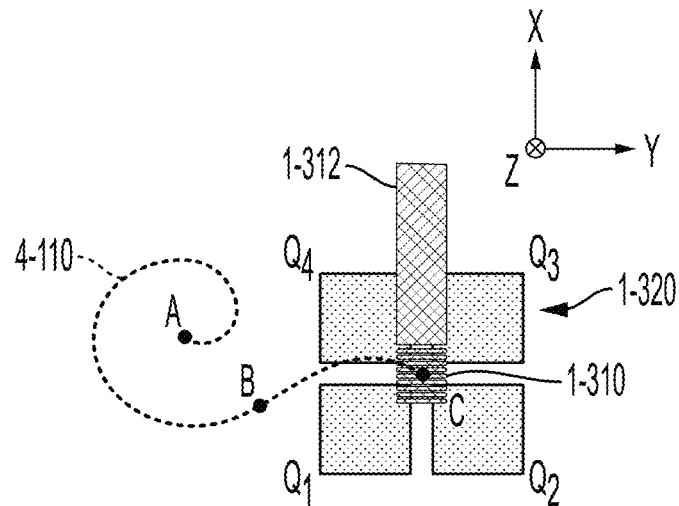
Figures 2, 4:
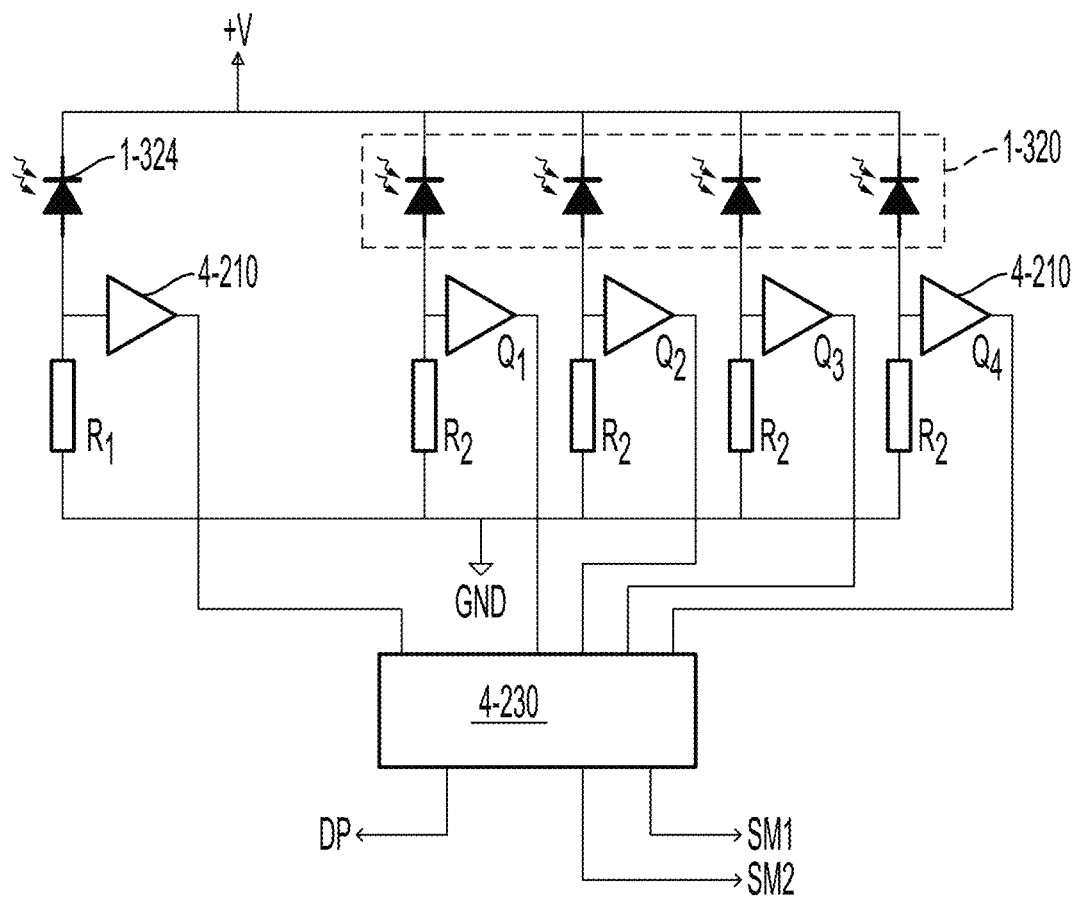
Figures 3, 4:
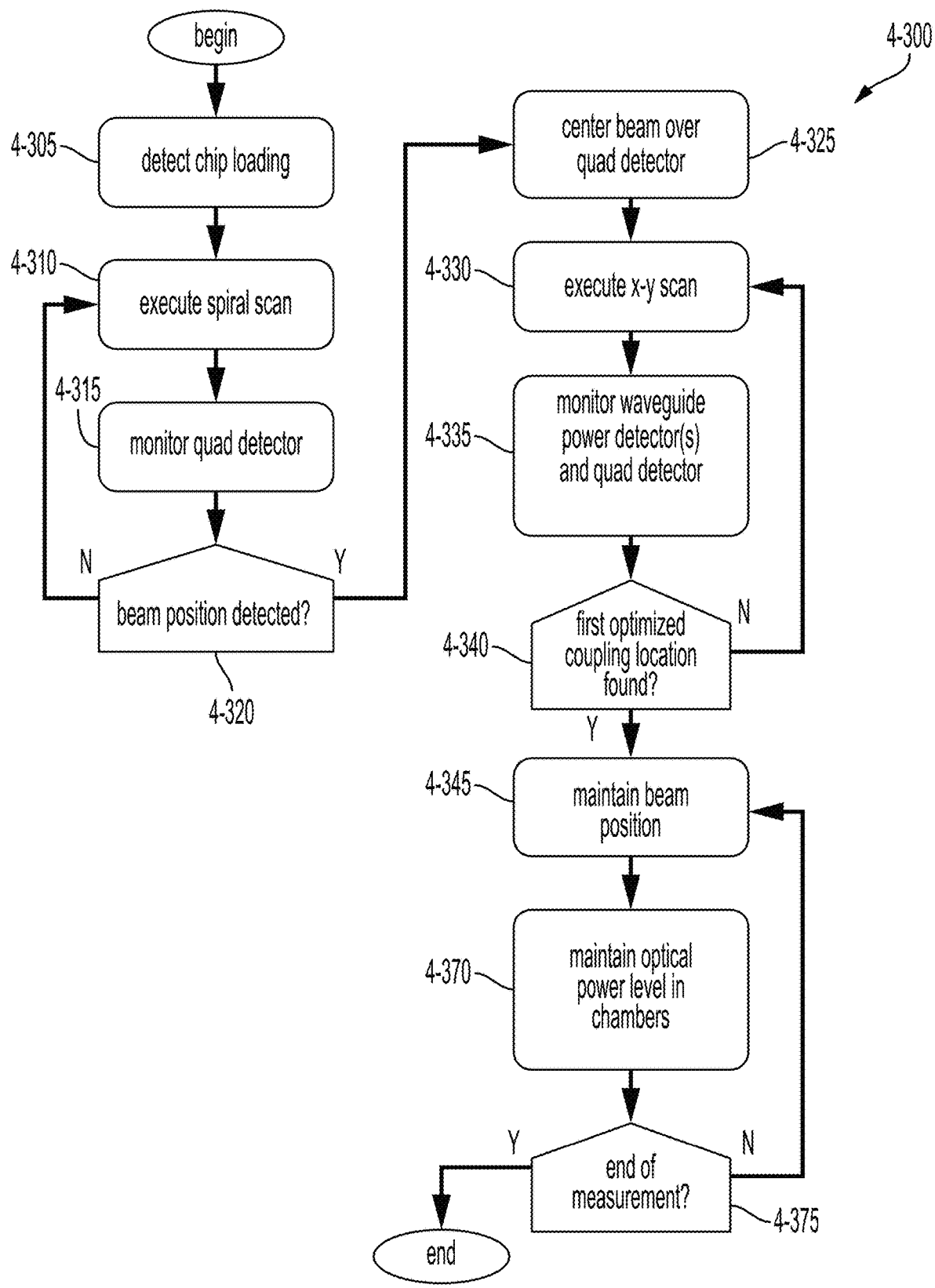

Some embodiments of a pulsed source board 1-110 can include a thermal conductive element 3-430 arranged to couple to and remove heat from the optical source. Additional details of an example thermal conductive element 3-430 are illustrated in FIG. 3-4B. A thermal conductive element 3-430 can be formed from a metal or combination of metals that provide high thermal conductivity. Such metals include, but are not limited to gold, aluminum, and copper. A thermal conductive element 3-430 can attach to the pulsed source board 1-110 by any suitable means (e.g., adhesive, fasteners, press-fit, or a combination thereof). A first portion 3-431 of the thermal conductive element 3-430 can extend across a surface of the pulsed source board 1-110 and contact an assembly in which the laser diode 2-201 is mounted, according to some embodiments. For example, the first portion 3-431 may contact a can package in which the laser diode 2-201 is mounted. A thermal epoxy 3-440 can be applied at a junction of the laser diode assembly and first portion 3-431 of the thermal conductive element 3-430 to improve heat transfer to the thermal conductive element 3-430. In some cases, compression between a package or housing 2-212 containing the laser diode 2-201 and the thermal conductive element 3-430 provides sufficient heat dissipation to the thermal conductive element 3-430, so that a thermal epoxy may not be used. The laser diode package can mount to the pulsed source board via pins 3-420, for example, to provide electrical connection to the laser diode 2-201. In some cases, a case of the laser diode package may comprise an electrical connection to the laser diode 2-201, and the thermal conductive element 3-430 can additionally be used as an electrode for applying a voltage or reference potential to the laser diode 2-201.

A second portion 3-433 of the thermal conductive element 3-430 can extend through the pulsed source board 1-110, so as to provide heat transfer through the board 1-110 to a back-side heat-conductive and reinforcing element 3-710. Features of the reinforcing element 3-710 are described below in connection with FIG. 3-7.

The inventors have recognized and appreciated that position sensing of the laser diode beam, operation of the beam-steering assembly 1-115, and its manufacture can be improved using inductive sensors rather than capacitive interdigitated electrodes 3-350. For example, the inventors found that the change in capacitance over the motion of the rotatable stages was on the order of several picofarads, a change which is difficult to measure with high resolution.

Figures 1, 2, 3, 4, 5:
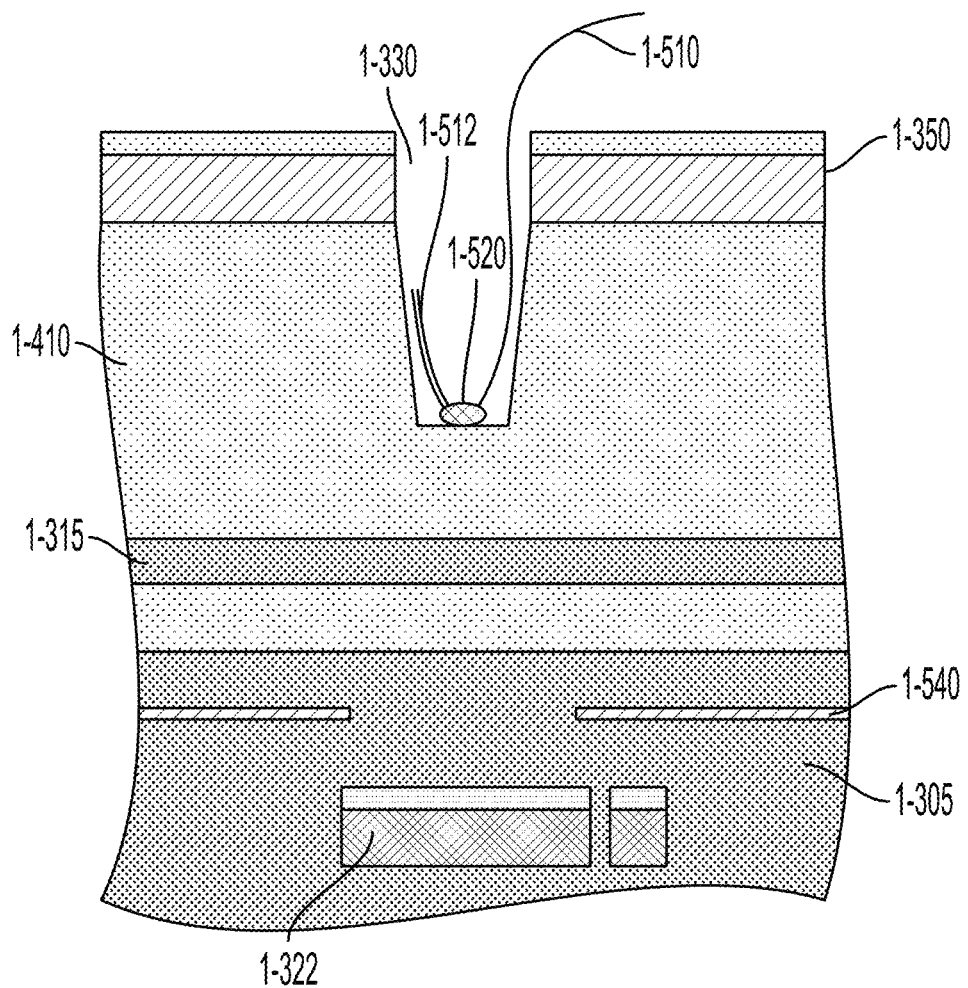
Figures 1, 2, 3, 4, 5, 6:
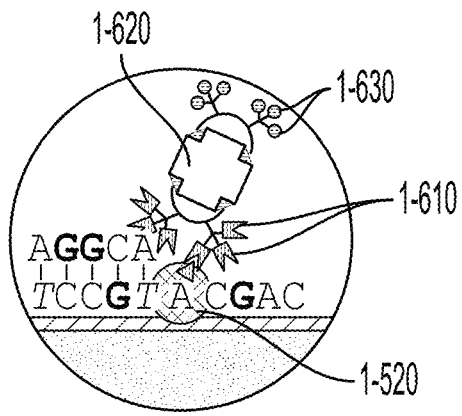
Figures 1, 2, 3, 4, 5, 6, 7:
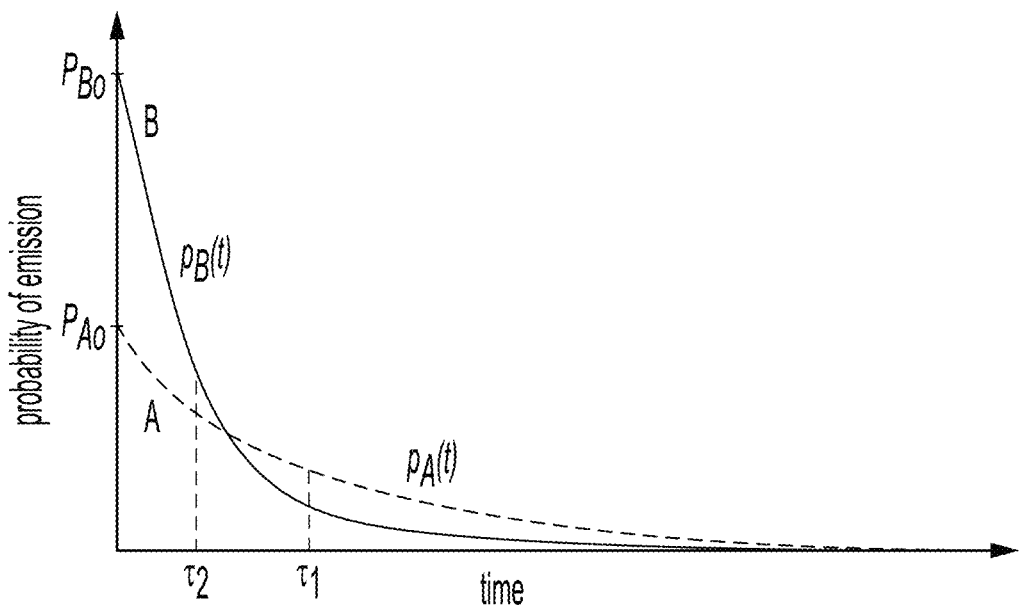
Figures 1, 2, 3, 4, 5, 6, 7, 8:
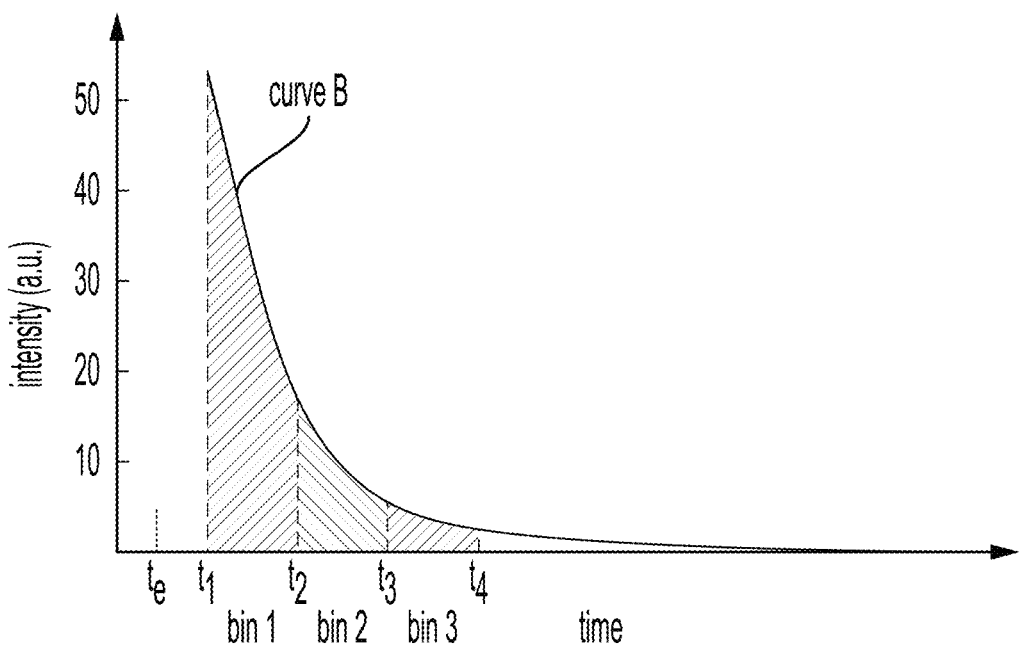
Figures 1, 2, 3, 4, 5, 6, 7, 8, 9:
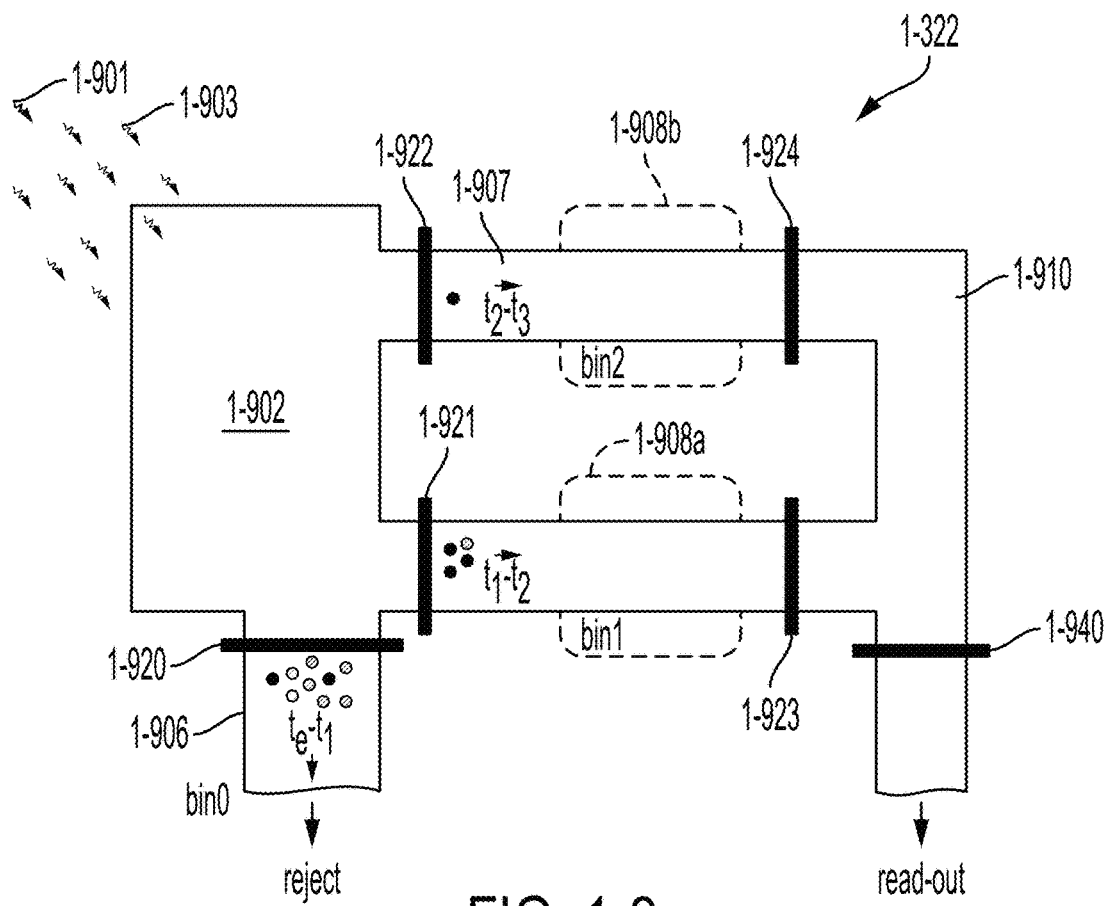
Figures 1, 2, 3, 4, 5, 6, 7, 8, 9, 10, 10A:
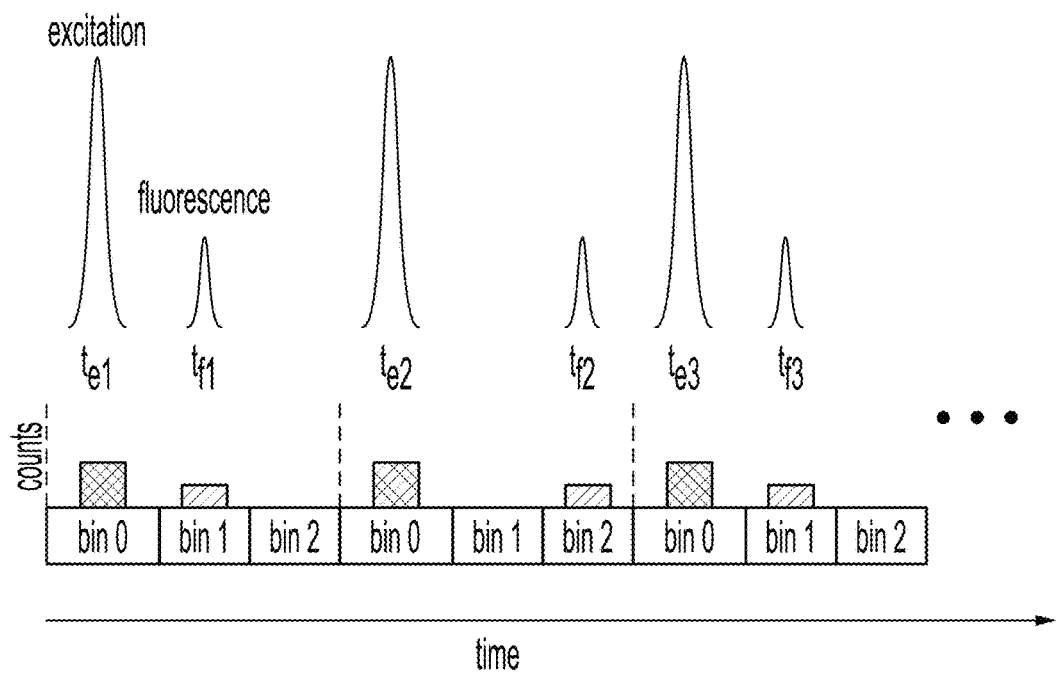
Figures 1, 2, 3, 4, 5, 6, 7, 8, 9, 10, 10B:
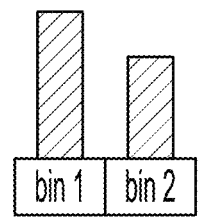
Figures 1, 2, 3, 4, 5, 6, 7, 8, 9, 10, 11, 11A:
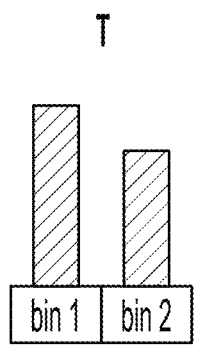
Figures 1, 2, 3, 4, 5, 6, 7, 8, 9, 10, 11, 11B:
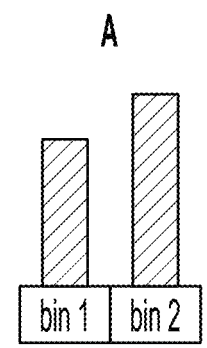
Figures 1, 2, 3, 4, 5, 6, 7, 8, 9, 10, 11, 11C:
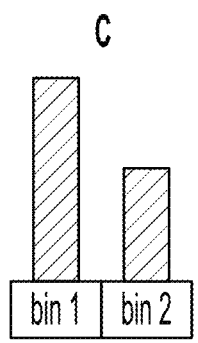
Figures 1, 2, 3, 4, 5, 6, 7, 8, 9, 10, 11, 11D:
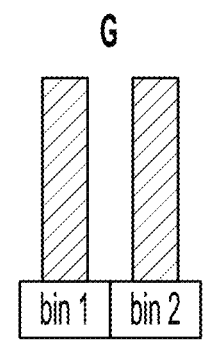

An example of inductive sensing is depicted in FIG. 3-5. In such embodiments, an inductor 3-450 may be placed on the pulsed source board 1-110 for each rotation axis instead of the interdigitated electrodes 3-350. Small inductors 3-450 (e.g., Wurth inductors) can be mounted directly to the pulsed source board 1-110 near movable portions of the X-plate 3-320 and Y-frame 3-330 (shown in FIG. 3-3). Additionally, conductive elements 3-550 (such as conductive cups or ferrous cups) may attach to movable portions of the X-plate 3-320 and Y-frame 3-330. The conductive element 3-550 may move up and down over the inductor 3-450. Referring to FIG. 3-3, a conductive element 3-550 can be mounted within a recess in an underside of the X-plate 3-320 and fit over an X-sensing inductor 3-450 illustrated on the right side of FIG. 3-4A. Similarly, a conductive element 3-550 can be mounted within a recess in an underside of the Y-frame 3-330 and fit over a Y-sensing inductor 3-450 illustrated on the lower left of FIG. 3-4A.

In operation, an alternating electrical signal may be applied to the inductor 3-450. As the conductive element 3-550 moves up and down over the inductor, the changing electromagnetic field can generate eddy currents in the conductive element 3-550 that act back on the inductor 3-450 and change the inductance of the inductor 3-450. The changes in inductance can be sensed by including the inductor 3-450 in a resonant LC circuit and tracking the resonant frequency, for example. The inventors have recognized and appreciated that the change in inductance is significantly more than the change in capacitance for the interdigitated electrodes 3-350, and significantly higher resolution of gimbal movement and beam position can be measured using inductive sensing.

A potential effect with a gimbal mount, as depicted in FIG. 3-3, is that there may be cross-coupling between the axes of motion. For example, instructing the voice coils to rotate the X-plate 3-320 about the Y-axis may cause a small amount of rotation of the Y-frame about the X-axis. Measurements were carried out to determine an amount of such cross coupling. FIG. 3-6A is a plot showing typical Y-to-X coupling for the gimbal beam-steering assembly 1-115 using inductive sensors on each axis as depicted in FIG. 3-5. The plot shows a sensed deviation of a focused laser beam from the laser diode 2-201 in the X direction while the X-plate was held fixed and the Y-frame was moved over its range. The plot shows that the Y-frame can be moved 400 μm while the X-deviation is less than about 2 μm. A plot showing typical X-to-Y coupling is shown in FIG. 3-6B. This plot shows negligible Y-position movement when the X-position of the laser diode beam is moved over 400 μm.

The inventors have found that the pulsed source board 1-110 with activated voice coils 3-340 can be susceptible to resonant vibrations during operation. For example, when the voice coils 3-340 are activated to stabilize the position of the gimbal and laser beam using an active feedback loop, a mechanical resonance can be excited in the pulsed source board 1-110. This can lead to an oscillation in position of the laser beam by several microns at the location of the bio-optoelectronic chip 1-141. According to some embodiments, a board reinforcing member 3-710 may be mounted to a backside of the pulsed source board 1-110 (as depicted in FIG. 3-7) to prevent resonant electro-mechanical vibrations from being excited in the pulsed-source board 1-110.

The board reinforcing member 3-710 maybe formed from aluminum or a rigid plastic, according to some embodiments. In some cases, the board reinforcing member 3-710 may be configured to span an unsupported region of a printed circuit board and attached to several locations on the printed circuit board. For example, the board reinforcing member 3-710 may span a majority of the pulsed source board 1-110 and attach to several unsupported locations on the pulsed source board and to a periphery of the pulsed source board 1-110. In some cases, the board reinforcing member 3-710 may attach to locations near the voice coils 3-340 on a backside of the pulsed source board 1-110. In some embodiments, the board reinforcing member 3-710 may be thermally conductive and also attached to a backside of the pulsed source board 1-110 near the laser diode 2-201. In such embodiments, the board reinforcing member 3-710 may aid in removing heat from the laser diode 2-201 in addition to providing mechanical stability of the pulsed source board 1-110.

Long-term stability of the X, Y gimbal mount in the beam-steering assembly 1-115 has been measured by the inventors for both capacitive and inductive sensors. An example plot of the results for both X-axis drift and Y-axis drift when using inductive sensors to maintain constant positions of the X-plate 3-320 and Y-frame 3-330 is shown in FIG. 3-8. For this measurement, the laser diode beam was focused on an imaging array and the beam position on the array was tracked over time. The plot shows that the beam position deviated by no more than 1 μm over a period of nearly 2 hours, showing excellent long-term stability of the beam-steering assembly 1-115 with inductive sensors. When capacitive sensors were used, the beam drift was measured to be as much as 8 μm over the same period of time. The larger drift for the capacitive sensors is believed to be due to their lower sensing resolution.

Reliable and user-friendly alignment of a focused optical beam 3-201 onto a bio-optoelectronic chip 1-141 requires reproducible registration of the chip to the alignment structure 1-102, according to some embodiments. A close-up view of a region of the alignment structure 1-102 that receives the packaged bio-optoelectronic chip 1-140 is depicted in FIG. 3-9A, according to some embodiments. Visible in the photograph is a portion of a chip interface module 1-145 that can be seen through the chip opening 3-120 in the registration platform 3-102. In the center of the chip opening 3-120 is a thermal post 1-185 that provides thermal contact to and heat removal from the packaged bio-optoelectronic chip 1-140. A bottom side of the thermal post 1-185 may be in intimate contact with a heat-sinking element 1-190 (see FIG. 1-1), such as a thermoelectric cooler. The heat-sinking element 1-190 may be mounted on springs to the main control board 1-180, according to some embodiments, so that the thermal post 1-185 may move against spring force with respect to the main control board 1-180 when the packaged bio-optoelectronic chip 1-140 is mounted in the bioanalytic instrument 1-100. A thermal post 1-185 can be formed from any suitable material or combination of materials that provides high heat conductivity such as, but not limited to, aluminum, copper, gold, graphite, tungsten, and zinc. In some cases, a thermal post 1-185 can be formed from a non-electrically-conductive material, such as a ceramic or alumina.

To aid in optical alignment of the packaged bio-optoelectronic chip 1-140 to the optical beam 3-201 coming from the laser diode 2-201, a recessed chip guide 3-110 is formed in the registration platform 3-102 of the alignment structure 1-102. The recessed chip guide 3-110 can provide registration of the packaged bio-optoelectronic chip 1-140, when inserted in the instrument by a user, to the alignment structure and to the optical components that are also registered to the registration platform 3-102. In this manner, bio-optoelectronic chips may be interchanged with reliable alignment to the optical beam 3-201.

The recessed chip guide 3-110 may further provide alignment and registration for an interposer 3-930 (depicted in FIG. 3-9B) to the chip interface module 1-145. For example, there may be an interposer guide 3-920 formed in the recessed chip guide 3-110 that mates to a corresponding interposer tab 3-950 on the interposer 3-930. The interposer guide 3-920, interposer tab 3-950, and recessed chip guide 3-110 can aid the user in orienting the interposer 3-930 with respect to the underlying chip interface module 1-145. When the user inserts the interposer into the recessed chip guide 3-110, interposer alignment pins 3-961, 3-962 may engage in corresponding holes 3-963, 3-964 (slightly visible in the figure) located in the chip interface module 1-145. The interposer alignment pins 3-961, 3-962 can provide accurate alignment for the plurality of spring pins 3-940 on the interposer to corresponding conductive pads 3-942 located on the chip interface module 1-145.

To retain the interposer 3-930 in place, magnetic retainers 3-910, 3-912 may be located around the periphery of the recessed chip guide 3-110 and periphery of the interposer 3-930 to draw the interposer spring pins 3-940 into intimate contact with the corresponding conductive pads 3-942 on the chip interface module 1-145. According to some embodiments, the magnetic retainers may be pairs of magnets or a magnet and corresponding ferromagnetic material that are mounted in the retaining holes 3-112 (see FIG. 3-1A), for example. When a packaged bio-optoelectronic chip 1-140 is placed into the bioanalytic instrument 1-100, electrical pins on the packaged bio-optoelectronic chip may press against pins on the interposer 3-930 providing a plurality of electrical contacts between the bio-optoelectronic chip 1-141 and the bioanalytic instrument 1-100. Additionally a thermal pad on the packaged bio-optoelectronic chip 1-140 may press against the thermal post 1-185 providing intimate thermal contact and thermal conduction to the heat-sinking element 1-190 located below the chip interface module 1-145. According to some embodiments, a lid of the bioanalytic instrument 1-100 may press against the packaged bio-optoelectronic chip 1-140 improving electrical contact to pins and thermal contact to the thermal post 1-185. According to some embodiments, the recessed chip guide 3-110 and/or alignment features on a top side of the interposer 3-930 may provide accurate alignment features for aligning the packaged bio-optoelectronic chip 1-140 (e.g., to within tens of microns) to the registration platform 3-102 and the optical system 3-205 of the bioanalytic instrument 1-100.

In some implementations, the bio-optoelectronic chip 1-141 and its package may be disposable, whereas in other implementations the chip may be reusable. When the chip is received by the instrument, it may be in electrical communication with the instrument 1-100 through the plurality of contact pads 3-942 and in optical communication with the instrument's optical system 3-205 and laser diode 2-201. The main control board 1-180 may include circuitry configured to provide electrical power, one or more clock signals, and control signals to the packaged bio-optoelectronic chip 1-140, and signal-processing circuitry arranged to receive signals representative of fluorescent emission detected by photodetectors at the reaction chambers. The main control board 1-180 and/or chip interface module 1-145 may also include circuitry configured to receive feedback signals relating to optical coupling and power levels of the optical pulses 1-122 coupled into waveguides of the bio-optoelectronic chip 1-141. Data returned from the bio-optoelectronic chip may be processed in part or entirely by the instrument 1-100, although data may be transmitted via a network connection to one or more remote data processors, in some implementations.

In this regard, the main control board 1-180 can include computing and graphical resources to render a user interface on a display (e.g., a touch screen or LCD display which can be mounted on the bioanalytic instrument). The user interface can allow a user to select, for example, an optical source for delivering excitation pulses to the packaged bio-optoelectronic chip 1-140. The user interface can allow a user to select a power source for the instrument (e.g., on-board batteries or line power). In some cases, the user interface can allow a user to configure a bioanalytic instrument in a network of bioanalytic instruments, so that they can operate in parallel on a sample or different samples. Network connectivity can also allow faster external computing resources access to data received from the bio-optoelectronic chip 1-141, so that sample analysis can be performed more quickly.

Further details of how components of a hand-held, bio-optoelectronic instrument may be arranged are depicted in FIG. 3-10A and FIG. 3-10B. The arrangement of components shown in FIG. 3-10A is similar to that depicted in FIG. 1-1, although the alignment structure 1-102 is not shown. According to some embodiments, a chip interface module 1-145 may be located near the receptacle guide 1-107 and is configured to make electrical connections with the packaged bio-optoelectronic chip 1-140. A heat sink element 1-190 may mount to the chip interface module 1-145 and a thermal post 1-185 may pass through the chip interface module 1-145, according to some implementations.

In embodiments, a chip interface module 1-145 can comprise a printed circuit board and electronic components (e.g., integrated circuit chips and discrete components such as resistors, capacitors, diodes, transistors, inductors, etc.). The chip interface module can make electrical connections to the packaged bio-optoelectronic chip 1-140 (e.g., through interposer 3-930) and be configured to perform various functionalities relating to the chip. Such functionalities include, but are not limited to: distributing power to the bio-optoelectronic chip 1-141, evaluating and controlling chip temperature, evaluating and controlling alignment of the optical beam to the chip, providing one or more clock signal(s) to the chip for data acquisition, receiving data from the chip, packaging and/or formatting data from the chip for transmission over a data link to a processor for further analysis, and evaluating a chip load status and controlling a safety interlock for the laser that can disable the laser when a chip is not in the instrument or when a lid over the chip is opened.

Electrical connectors 3-1005 may be used to pass power and/or data between the control board 1-180, a battery 3-1010, the chip interface module 1-145, the pulsed source board 1-110 and the beam-steering assembly 1-115. In some embodiments, a cooling fan 3-1020 may be mounted to a casing 3-1030 (depicted as a dashed line) and located near the pulsed source board 1-110 to aid in heat removal from the optical source. A hinged access port 3-1035 (indicated by the dashed lines) may open to provide access to the receptacle guide 1-107 for insertion and removal of the packaged bio-optoelectronic chip 1-140.

According to some embodiments, the battery 3-1010 may comprise one or more rechargeable batteries that can be used to power the hand-held, bio-optoelectronic instrument for several hours when used in a remote location (e.g., when line power or generator power is not available). In some implementations, the battery 3-1010 may comprise an assembly of not more than eight model 18650, 3.7 V, lithium ion batteries. In some embodiments, the battery 3-1010 may be mounted internal to the instrument casing 3-1030, as depicted in FIG. 3-10A.

In other embodiments, as depicted in FIG. 3-10B, the instrument's battery 3-1010 may be mounted external to the instrument casing 3-1030. External mounting may provide for a more compact instrument and allow easy exchange of the battery pack, so that the instrument could be operated for longer durations on battery power. In some cases, a power storage element (e.g., a capacitor, not shown) may be included within the instrument to allow for hot-swapping of the battery 3-1010 during operation of the instrument, so that a bio-analysis may continue with minimal or no disruption during exchange of the battery.

When a larger number of reaction chambers are included in the bio-optoelectronic chip 1-141, the size of the optical excitation source may increase and the data-handling capacity will increase. An increase in data-handling capacity may lead to a larger instrument control board 1-180. An increase in the size, or number, of the optical source may lead to increased heating within the instrument, which can undesirably affect optical alignment to the bio-optoelectronic chip. In some embodiments, the pulsed source board 1-110 and optical source or sources mounted thereon may be moved away from the beam-steering assembly 1-115 and closer to the fan 3-1020. Additionally, a thermal dissipative element 3-1050 (e.g., cooling fins or thermally conductive plate) may be mounted to the pulsed source board 1-110 to aid in removing heat from the optical source. By separating the pulsed source board 1-110 and the beam-steering assembly 1-115, the instrument control board 1-180 may be increased in size to accommodate more electronic components. The instrument control board 1-180 may include a hole that allows the beam from the optical source 1-110 to pass through to the beam-steering assembly 1-115. Other arrangements of instrument components are also possible.

FIG. 3-10C illustrates another arrangement of components in a bioanalytic instrument 1-100. In this illustration, the alignment structure 1-102 is illustrated in cut-away view so that components in an upper chamber 3-1090, partially enclosed by the alignment structure 1-102 can be seen. The upper chamber 3-1090 may be substantially enclosed by the alignment structure 1-102 and the instrument control board 1-180, which mounts to the alignment structure. The upper chamber 3-1090 may contain a majority of the instrument electronics.

In the illustrated embodiment, at least one optical component is attached to an upper surface of the registration platform 3-302 of the alignment structure 1-102. For example, the turning mirror 1-121, turning-mirror mount 3-225, second lens 1-127, and second lens mount 3-208 can register to an upper surface of the registration platform 3-102. Also, the packaged bio-optoelectronic chip 1-140 can register to the same surface. The beam-steering assembly 1-115 and pulsed source board 1-110 with laser diode 2-201 can register to an opposing lower surface of the registration platform 1-102, so that all of these components and the optical components can be aligned and maintained stably in alignment, as described above. The packaged bio-optoelectronic chip 1-140 may be received by an interposer 3-930 that is located in a recessed chip guide 3-110, as described above in connection with FIG. 3-9A and FIG. 3-9B. The interposer 3-930 can provide electrical connections between contacts on the packaged chip 1-140 and contacts on a chip interface module 1-145.

To remove heat from the bio-optoelectronic chip 1-141, the chip can mount in thermal contact with one or more thermal posts 1-185 that convey heat through openings in the interposer 3-930 and chip interface module 1-145. A thermal post 1-185 can also extend through an opening in the instrument control board 1-180 and thermally contact a thermal dissipative element 3-1052 mounted in a lower chamber 3-1091 of the instrument. In some implementations, a thermal post 1-185 may thermally contact a heat sink element 1-190 (e.g., a thermo-electric cooler) that thermally contacts the thermal dissipative element 3-1052, as illustrated in FIG. 3-10C. In this manner, a majority of heat from the bio-optoelectronic chip 1-141 can be transported from the chip and upper chamber 3-1090 to the thermal dissipative element 3-1052 in the lower chamber 3-1091.

A cooling fan 3-1020 can be located in the lower chamber and force an air flow (indicated by broad arrows in FIG. 3-10C) through the lower chamber in any suitable direction. To improve heat dissipation, a plurality of fins 3-1053 can be located across the thermal dissipative element 3-1052. The thermal dissipative element 3-1052 may be formed of any suitable material or combination of materials having a high thermal conductivity such as, but no limited to aluminum. In some implementations, the air flow may be mostly confined to the lower chamber 3-1091 by the instrument control board 1-180. For example, the instrument control board 1-180 can comprise the majority of an extended surface that forms at least one wall of a chamber 3-1091 in the bioanalytic instrument 1-100. In the illustrated example, the instrument control board 1-180 substantially forms an upper wall or ceiling to the lower chamber 3-1091 and helps contain air flow within the lower chamber.

To remove heat from the laser diode 2-201 and pulsed source board 1-110, a thermally-conductive reinforcing element 3-710 can thermally couple to second thermal dissipative element 3-1050 located in the lower chamber 3-1091. The second thermal dissipative element 3-1050 can also include a plurality cooling fins 3-1051 over which air flows. In some cases, the reinforcing element 3-710 may contact directly to the second thermal dissipative element 3-1050. In other cases, the reinforcing element 3-710 may thermally contact a heat sink element 1-190 (e.g., a thermo-electric cooler) that thermally contacts the second thermal dissipative element 3-1050, as illustrated in FIG. 3-10C.

According to some implementations, one or more batteries 3-1010 for powering the instrument can be located in the lower chamber 3-1091. As these batteries are discharged, they can produce heat. The heat from the discharging batteries can be removed by air flow in the lower chamber 3-1091.

In some implementations, the alignment structure 1-102 can participate in or provide some means for heat removal. For example, heat from electrical components mounted adjacent to the alignment structure 1-102 or within a chamber 3-1090 that is at least partially enclosed by the alignment structure can radiate to and be absorbed by the alignment structure 1-102. Excess heat can then be dissipated external to the bioanalytic instrument 1-100 (e.g., dissipated by walls 1-103 located at or near a periphery of the instrument).

In some implementations, the alignment structure 1-102 can form the majority of at least one wall surface of a chamber 3-1090 within the bioanalytic instrument 1-100. In some cases, the alignment structure 1-102 can form at least a portion of the bioanalytic instrument's exterior enclosure. In some cases, the alignment structure 1-102 and/or registration platform 3-102 can form at least a portion of a wall that guides or blocks air flow in the instrument. For example, an upper wall or ceiling of the alignment structure 1-102 (in which the registration platform may be formed) can guide any airflow received from the lower chamber back to the lower chamber and exhaust and block turbulent air flow from reaching the optical beam path (indicated by dashed lines) where such turbulence could adversely affect beam alignment to the bio-optoelectronic chip 1-141. In some cases, air flow can be admitted into a chamber 3-1090 that is at least partially enclosed by one or more walls of the alignment structure 1-102, and the one or more walls can provide heat dissipation external to the bioanalytic instrument 1-100

According to some embodiments, a hand-held, bio-optoelectronic instrument 1-100 may be of small size and easily portable. For example, the instrument 1-100 may have an external dimension that is no greater than 30 cm, and the instrument may weigh no more than 3 kilograms, or in some cases no more than 2 kilograms, including battery weight. In some embodiments, the instrument 1-100 may have an external dimension that is no greater than 25 cm, and the instrument may weigh no more than 2 kilograms including battery weight. In some embodiments, the instrument 1-100 may have an external dimension that is no greater than 20 cm, and the instrument may weigh no more than 2 kilograms including battery weight. The overall shape of the instrument may be rectangular.

IV. Automated Alignment of the Optical Beam to the Bio-optoelectronic Chip

According to some embodiments, an automated alignment procedure and apparatus may be used to align the laser beam from a pulsed source board 1-110 to a coupler 1-310 (e.g., a grating coupler) on a bio-optoelectronic chip 1-140. An alignment procedure may comprise executing a spiral search for the grating coupler 1-310, as depicted in FIG. 4-1. The spiral search may be executed by rotating the X-plate 3-320 and the Y-frame 3-330 in the beam-steering assembly 1-115 to deflect the optical beam in the x and y directions on the surface of the chip 1-141. For example, after a packaged chip 1-140 is loaded into a bioanalytic instrument 1-100 and the pulsed laser diode turned on, the laser beam may strike the surface of the chip at the location marked "A" in FIG. 4-1. At this location, there may be no signal detected by a quad detector 1-320 located on the chip 1-141. A spiral search path 4-110 may be executed, while signals from the quad detector are monitored. At location "B" the quad detector may begin to register x, y position signals of the beam from its detectors. Control circuitry may then determine the location of the beam with respect to a center of the quad detector, cancel execution of the spiral path, and operate the voice coils 3-340 to steer the beam to a center of the quad detector 1-320, point "C." The coupler 1-310 may be located approximately centrally over the quad detector. Subsequently, fine position and incident angle adjustments may be made to increase an amount of optical energy coupled into the waveguide 1-312 or waveguides. In some embodiments, the optical powers from multiple integrated photodiodes 1-324 at the ends of multiple waveguides 1-312 are monitored, so that fine adjustments may be made to the laser beam at the grating coupler to increase uniformity of the powers coupled into the multiple optical waveguides.

Other methods and apparatus may be used to search for the quad detector 1-320 and align the focused beam 3-205 to the grating coupler 1-310. In some embodiments, the sensitivity of the quad detector 1-320 can be improved to expand the range over which the laser beam may be detected. For example, signals from the quad detector with the laser power at a high power (e.g., fully on) may be compared against signals from the quad detector with the laser power at a low setting (e.g., off or nearly off). Additionally, the signals may be integrated over longer periods of time to improve the location-detection sensitivity of the quad detector, when the laser beam may be located at an appreciable distance from the quad detector.

In some embodiments, light scattering elements (not shown in FIG. 4-1) may be fabricated on the chip 1-141 around the quad detector 1-320. When the focused beam is misaligned and at a peripheral location away from the quad detector, the scattering elements may scatter light from the focused beam towards the quad detector 1-320. The detected scattered light may then indicate a position of the beam.

In some implementations, a narrow, linear scattering element or line detector, similar in width to the anticipated focused beam size, may be placed through the center of the quad detector (or in any suitable orientation with respect to the quad detector), and extend significantly beyond opposite edges of the quad detector (e.g., to a distance greater than a reasonable expectation of initial beam offset error). Since the orientation of this element or detector is known by design, the focused beam can first be scanned in a direction perpendicular to the element until the beam strikes the element or detector and is positively detected, either by scatter to the quad detector 1-320, or directly by the line detector. Then, the beam may be scanned in the other direction to find the quad detector 1-320.

In some implementations, photodetectors 1-322 may be used to align the beam to an optical coupler 1-310 on the bio-optoelectronic chip 1-141. For example, one or more photodetectors 1-322 may be used to sense an amount of excitation radiation delivered to one or more reaction chambers 1-330 as the beam of pulses is scanned by the beam-steering assembly 1-115. In some cases, a sub-group of photodetectors 1-322 (e.g., a group of photodetectors located at a center of the array) may be used to monitor excitation radiation coupled to the reaction chambers.

After alignment, the incident laser beam may be maintained actively in an aligned position. For example, an x, y position of the beam determined after the initial alignment with respect to the quad detector 1-320 may be actively maintained using feedback from the quad detector and activation of the voice coils 3-340 to maintain the beam in an approximately fixed location. Additionally, an amount of power coupled into the waveguides may be maintained at approximately a constant level throughout measurements by adjusting an injection current to the laser diode 2-201, for example.

Example circuitry for beam alignment and power stabilization is depicted in FIG. 4-2, according to some embodiments. The quad detector 1-320 is represented as four photodiodes, and a waveguide photodiode 1-324 is represented as a fifth photodiode in the drawing. In some implementations, there may be a large plurality of waveguides to which optical power is coupled from a single grating coupler 1-310. Accordingly, there may be a large plurality of waveguide photodiodes 1-324 at end of the waveguide that have signal outputs connected to control circuitry 4-230. Amplifying circuitry 4-210 may be arranged to detect voltages produced by photoconduction of the diodes. The amplifying circuitry 4-210 may comprise CMOS electronics (e.g., FETs, sampling circuits, analog-to-digital converters) that convert an analog signal to a digital signal, according to some embodiments. In other embodiments, analog signals may be provided from the amplifying circuitry to control circuitry 4-230.

In some embodiments, control circuitry may comprise one or a combination of the following elements: analog and digital circuitry, an ASIC, an FPGA, a DSP, a microcontroller and microcontroller code, and a microprocessor and code. The control circuitry 4-230 may be configured to process received signals from the one or more waveguide photodiodes to determine a level of optical power in each waveguide. Control circuitry 4-230 may be further configured to process received signals from the quad detector 1-320 to determine an x, y location of the optical beam with respect to the quad detector. In some implementations, the control circuitry 4-230 is configured to detect power coupled into each waveguide, and provide a control signal to the actuators to move the laser beam such that power is equalized in the waveguides or has a highest uniformity across the waveguides.

A position of the laser beam in the x direction may be determined, for example, by control circuitry 4-230 adapted to execute the following algorithm:

$$S_x = [(V_{Q2}+V_{Q3})-(V_{Q1}+V_{Q4})]/V_T$$

where $S_x$ is a normalized signal level corresponding to the x direction, $V_{Qn}$ is a signal level (e.g., voltage) received from the $n^{th}$ photodiode of the quad detector, and $V_T$ is a total signal level received by summing the signal from all four photodiodes. Additionally, a position of the laser beam in the y direction may be determined, for example, using the following algorithm:

$$S_y = [(V_{Q3}+V_{Q4})-(V_{Q1}+V_{Q2})]/V_T.$$

An average power coupled into all waveguides on the chip 1-141 may be determined by summing signals from all of the photodiodes 1-324 arranged to detect power in each of the waveguides on the chip.

Control signals may be generated by control circuitry 4-230 responsive to detected beam position in x and y and responsive to power levels detected in one or more waveguides of the bio-optoelectronic chip 1-141 by one or more photodiodes. The control signals may be provided as digital signals over communication links (SM1, SM2) to voice coils 3-340 of the beam-steering assembly 1-115 and a communication link DP to the pulsed source board 1-110 that controls an amount of laser diode power.

In some implementations, power in one or more waveguides can be maintained at essentially constant values using a PID control loop that is implemented in hardware, software, or a combination thereof. Power in one or more waveguides can be sensed by one or more photodiodes arranged to receive light from the one or more waveguides. Output from the PID control loop can be provided to the beam-steering assembly 1-115 to make fine adjustments that will maintain essentially constant power levels in the one or more waveguides.

According to some embodiments, power delivered from the optical source can be stabilized using a PID control loop that is implemented in hardware, software, or a combination thereof. For example, power from a laser diode 2-201 can be monitored with a photodiode and provided as an input signal to a PID control loop. The photodiode may be internal to a laser diode package 2-212 or may be mounted external to the package and located to detect scattered excitation light or partially transmitted light from a turning mirror, such as turning mirror 1-121.

An example method 4-300 for aligning and maintaining alignment of the pulsed-laser beam to an optical coupler (e.g., a grating coupler) on a bio-optoelectronic chip 1-141 is illustrated in FIG. 4-3. According to some embodiments, control circuitry 4-230 within the bioanalytic instrument 1-100 may be configured to detect (act 4-305) the loading of a packaged bio-optoelectronic chip 1-140 in the instrument. When a new chip is loaded, its optical coupler may not be aligned precisely to the focused laser beam from the pulsed laser diode 2-201, but may be within 10's of microns of an aligned position. Responsive to detection of the loading, control circuitry 4-230 may operate the beam-steering assembly 1-115 to execute (act 4-310) spiral scanning (or any other suitable scanning method described above) of the pulsed-laser beam over the surface of the bio-optoelectronic chip, as depicted in FIG. 4-1, for example. The control circuitry may operate voice coils 3-340 on the pulsed source board 1-110 to move the beam in a spiral path 4-110, or any other suitable path. While the pulsed-laser beam is being scanned over the surface of the chip, signals from a quad detector 1-320 may be monitored (act 4-315) by control circuitry 4-230 to determine whether a position of the laser beam is detected.

If signals from the quad detector indicate (act 4-320) that a position of the pulsed-laser beam has not been detected, then the control circuitry may continue scanning (act 4-310) the laser beam over the surface of the bio-optoelectronic chip. Alternatively, if the beam's position has been detected, the spiral scan may be stopped and the voice coils of the beam-steering assembly may be driven to approximately center (act 4-325) the pulsed-laser beam over the quad detector 1-320. According to some embodiments, a grating coupler 1-310 may be approximately centered over the quad detector, so that centering the laser beam over the quad detector approximately aligns the beam to the grating coupler. With the pulsed-laser beam at the approximate location of the grating coupler, the control circuitry may drive voice coils 3-340 of the pulsed source board 1-110 to execute (act 4-330) an x-y scan in the immediate vicinity of the grating coupler. For example, the beam-steering assembly may be driven to execute a sequential linear scan in the x direction to find a first optimum coupling value and then a linear scan in the y direction to find a second optimum coupling value. While the laser beam is being scanned, output signals from the quad detector 1-320 and one or more waveguide photodiodes 1-324 may be monitored (act 4-335).

As the pulsed-laser beam is scanned in the vicinity of the grating coupler, power detected from the one or more waveguide photodiodes 1-324 may increase and decrease. In some embodiments, there may be a maximum in total power coupled into the waveguides (detected by one or more waveguide photodiodes 1-324) corresponding to a first $x_1$, $y_1$ position of the pulsed-laser beam (as determined by the quad detector 1-320). In some cases, there may be a second $x_2$, $y_2$ position of the pulsed-laser beam for which power levels detected in a plurality of waveguides connected to the grating coupler are approximately equal (e.g., within ±20% or even within ±10%). At the second position, the total power coupled into the waveguides may be less than the amount coupled into the waveguides in the first position.

According to some embodiments, control circuitry 4-230 may be adapted to move the pulsed-laser beam until a highest total power coupled into the waveguides within a predetermined uniformity (e.g., ±15%) across waveguides is achieved. The corresponding location may be a first optimized location $x_3$, $y_3$, which may be different from the first position $x_1$, $y_1$ and second position $x_2$, $y_2$. In some implementations, larger power variations across waveguides may be tolerated (e.g., the power variations may be normalized out of the resulting data). In such implementations, the first optimized location $x_3$, $y_3$ may be a location at which total power into the waveguides is maximized.

If control circuitry 4-230 determines (act 4-340) that a first optimized location $x_3$, $y_3$ has not been found, control circuitry may continue operating the voice coils 3-340 of the pulsed source board 1-110 to execute (act 4-330) an x-y scan of the pulsed-laser beam in the vicinity of the grating coupler 1-310. If a first optimized coupling location has been found, then control circuitry 4-230 may hold (act 4-345) the laser-beam's position by operating voice coils 3-340 to maintain the laser beam at a fixed location sensed by the quad detector 1-320.

With the pulsed-laser beam's position being maintained, a measurement on the bio-optoelectronic chip 1-141 may begin. In some embodiments, the pulsed-laser beam's position may be maintained with respect to the quad detector 1-320 during a measurement, which could last for 10's of minutes, hours, or longer. For example, active feedback may be employed to sense the beam's position at the optical coupler (with quad detector 1-320) and maintain the pulsed laser beam at the sensed position (for example, by operating voice coils 3-340 to compensate for drift or vibrations in the system).

As a measurement commences, optical power levels in the reaction chambers may also be maintained (act 4-370). According to some embodiments, maintaining the optical power level may comprise monitoring waveguide power levels with one or more waveguide photodiodes 1-324 located at the end of one or more waveguides, and compensating for changes in optical power by changing an amount of current injected into the laser diode 2-201 on the pulsed laser system 1-110. As described above, the amount of injected current may be altered by changing the duration of the electrical pulse applied to the laser diode. In this manner, power fluctuations that would otherwise occur in the reaction chambers can be significantly reduced.

In some embodiments, control circuitry 4-230 may receive an end-of-measurement signal from the bio-optoelectronic chip 1-141 or bioanalytic instrument 1-100 at the conclusion of a measurement. If the control circuitry does not detect (act 4-375) an end-of-measurement signal, the beam position and power levels may be maintained. If the control circuitry detects (act 4-375) an end-of-measurement signal, the process may end. In some embodiments, ending the process may comprise powering down the pulsed source board 1-110, its voice coils 3-340 and the laser diode 2-201.

Various configurations of a bioanalytic instrument are possible. Some example configurations are listed below.

(1) A system for identifying different biochemical specimens within a sample, the system comprising a hand-held instrument that contains: a laser diode configured to operate at a single characteristic wavelength; a driving circuit connected to the laser diode that causes the laser diode to output a beam of optical pulses having the single characteristic wavelength; a chip receptacle adapted to receive a packaged bio-optoelectronic chip comprising a bio-optoelectronic chip that includes a plurality of sample analysis pixels, wherein the chip receptacle includes a first plurality of contacts that electrically connect to a second plurality of contacts on the packaged bio-optoelectronic chip so as to receive a plurality of electrical signals generated by the plurality of sample analysis pixels; and a beam-steering assembly adapted to steer the beam of optical pulses from the laser diode to the packaged bio-optoelectronic chip and to automatically maintain alignment of the beam of optical pulses to an optical coupler on the bio-optoelectronic chip.

(2) The system of configuration 1, wherein the hand-held instrument is configured to receive three different electronic signals from each sample analysis pixel of the plurality of sample analysis pixels that distinguish three different biochemical specimens in response to excitation of fluorophores linked to the three different biochemical specimens and excited with only the optical pulses having the single characteristic wavelength.

(3) The system of configuration 2, wherein the three different biochemical specimens are three different biochemical specimens selected from the group of: nucleotides and nucleotide analogs.

(4) The system of any one of configurations 1 through 3, wherein the single characteristic wavelength has a value between 505 nm and 535 nm.

(5) The system of any one of configurations 1 through 4, wherein the hand-held instrument weighs no more than three kilograms.

(6) The system of any one of configurations 1 through 5, wherein the hand-held instrument has a maximum edge length no longer than 25 centimeters.

(7) The system of any one of configurations 1 through 6, wherein the beam-steering assembly provides a stability of the beam position at the optical coupler of no greater than one micron of drift for a period as long as two hours.

(8) The system of any one of configurations 1 through 7, wherein the hand-held instrument comprises an alignment structure in which a recess for the chip receptacle is formed.

(9) The system of configuration (8), wherein the alignment structure includes features that register and align the beam-steering assembly, the packaged bio-optoelectronic chip, and intervening optical components to the alignment structure and to an optical beam path extending from the laser diode to the packaged bio-optoelectronic chip.

(10) A system for identifying different biochemical specimens within a sample, the system comprising a hand-held instrument that contains: a laser diode configured to operate at a single characteristic wavelength; a driving circuit connected to the laser diode that causes the laser diode to output a beam of optical pulses having the single characteristic wavelength; a chip receptacle adapted to receive a packaged bio-optoelectronic chip comprising a bio-optoelectronic chip having a plurality of reaction chambers in which a plurality of the samples are contained; a beam-steering assembly configured to steer the beam of optical pulses from the laser diode to the bio-optoelectronic chip and to automatically maintain alignment of the optical pulses to an optical coupler on the bio-optoelectronic chip, wherein the driving circuit is formed on a printed circuit board and includes voice coils that activate optical components in the beam-steering assembly; and an alignment structure, wherein the beam-steering assembly and the packaged bio-optoelectronic chip align and mount to the alignment structure.

(11) A system for identifying different biochemical specimens within a sample, the system comprising a hand-held instrument that contains: a laser diode configured to operate at a single characteristic wavelength; a driving circuit connected to the laser diode that causes the laser diode to output a beam of optical pulses having the single characteristic wavelength; a chip receptacle adapted to receive a packaged bio-optoelectronic chip comprising a bio-optoelectronic chip having a plurality of reaction chambers in which a plurality of the samples are contained; and a beam-steering assembly and optical system adapted to direct the beam of optical pulses from the laser diode to the bio-optoelectronic chip and to automatically maintain alignment of the optical pulses to an optical coupler on the bio-optoelectronic chip, wherein the beam-steering assembly and optical system includes three lenses of which one is tipped and tilted to change a position of the beam of optical pulses on the bio-optoelectronic chip.

(12) A printed circuit board supported in an instrument, the printed circuit board comprising: voice coils arranged to act upon magnets or ferromagnetic material located adjacent to the printed circuit board; and a board reinforcing member attached to one or more unsupported regions of the printed circuit board so as to prevent electro-mechanical oscillation of the printed circuit board.

(13) A hand-held bioanalytic instrument comprising: an alignment structure; a pulsed optical source registered to the alignment structure; a chip receptacle formed in the alignment structure and adapted to receive a packaged bio-optoelectronic chip; and a beam-steering assembly registered to the alignment structure and adapted to steer a beam of optical pulses from the pulsed optical source to the packaged bio-optoelectronic chip, wherein the alignment structure forms a majority of at least one enclosing wall in or on the hand-held bioanalytic instrument.

(14) The bioanalytic instrument of (13), wherein the at least one enclosing wall dissipates heat generated within the bioanalytic instrument.

(15) The bioanalytic instrument of (13) or (14), wherein the at least one enclosing wall guides or blocks forced air flow within the bioanalytic instrument

(16) The bioanalytic instrument of any of (13) through (15), wherein the bioanalytic instrument weighs no more than three kilograms.

(17) The bioanalytic instrument of any of (13) through (16), wherein the bioanalytic instrument has a maximum edge length no longer than 25 centimeters.

(18) The bioanalytic instrument of any of (13) through (17), wherein the alignment structure comprises a registration platform to which the pulsed optical source and beam-steering assembly are registered, and further comprising at least one optical component mounted to the registration platform that operates on the beam of optical pulses.

(19) The bioanalytic instrument of (18), wherein the packaged bio-optoelectronic chip and at least one optical component register to a first surface of the registration platform and the pulsed optical source and beam-steering assembly register to a second surface of the registration platform that is opposite the first surface.

(20) The bioanalytic instrument of (19), further comprising kinematic recesses formed in the second surface of the registration platform, wherein the beam-steering assembly self-aligns to the registration platform via the kinematic recesses.

(21) The bioanalytic instrument of (18), wherein the alignment structure includes walls or reinforcing ribs that stiffen the registration platform.

(22) The bioanalytic instrument of any of (13) through (21), further comprising a printed circuit control board that forms the majority of a wall of a chamber within the bioanalytic instrument.

(23) The bioanalytic instrument of (22), wherein the printed circuit control board confines a majority of forced air flow within the bioanalytic instrument to the chamber.

(24) The bioanalytic instrument of (22) or (23), further comprising: a thermal post located adjacent to the chip receptacle and arranged to convey heat from the packaged bio-optoelectronic chip toward the chamber; and a heat dissipating element located in the chamber and thermally coupled to the thermal post.

(25) The bioanalytic instrument of any of (22) through (24), further comprising: a thermally conductive reinforcing element attached to a circuit board on which the pulsed optical source is mounted and arranged to convey heat from the pulsed optical source toward the chamber; and a heat dissipating element located in the chamber and thermally coupled to the thermally conductive reinforcing element.

(26) The bioanalytic instrument of any of (22) through (25), further comprising at least one battery located in the chamber.

(27) The bioanalytic instrument of any of (13) through (26), wherein the pulsed optical source comprises: a pulsed source circuit board on which a laser diode is mounted; and a driving circuit for the laser diode formed on the pulsed source board, wherein the pulsed source board attaches directly to the beam-steering assembly.

(28) The bioanalytic instrument of (27), further comprising inductive sensors located on the pulsed source circuit board that sense motion of moveable components in the beam-steering assembly.

(29) The bioanalytic instrument of (28), further comprising conductive elements mounted to the moveable components in the beam-steering assembly that alter an inductance of the inductive sensors as the moveable components move.

(30) The bioanalytic instrument of any of (27) through (29), further comprising: a collecting lens mounted to the pulsed source circuit board; and two or more voice coils mounted to the pulsed source circuit board, wherein the two or more voice coils are configured to activate moveable components in the beam-steering assembly.

(31) The bioanalytic instrument of any of (13) through (30), wherein the beam-steering assembly stabilizes motion of a position of the beam of optical pulses at a location of the chip receptacle to no greater than one micron of drift for a period as long as two hours.

(32) The bioanalytic instrument of (30) or (31), further comprising a beam-control circuit configured to receive signals from at least one photodiode on the bio-optoelectronic chip and activate the two or more voice coils to position the optical pulses with respect to the optical coupler.

(33) The bioanalytic instrument of any of (27) through (32), further comprising a board reinforcing element attached to the pulsed source circuit board that stiffens the pulsed source board.

(34) The bioanalytic instrument of (33), wherein the board reinforcing element thermally couples to a heat dissipating element.

(35) The bioanalytic instrument of any of (27) through (34), wherein the driving circuit comprises: a pulse-generating circuit configured to produce unipolar pulses; and a diode-driving circuit that outputs an electrical pulse to the laser diode.

(36) The bioanalytic instrument of (35), wherein the pulse-generating circuit comprises a logic gate configured to receive differential clock signals and output the unipolar pulses.

(37) The bioanalytic instrument of (35) or (36), wherein the diode-driving circuit comprises: a first transistor connected as a common source amplifier and arranged to receive the unipolar pulses from the pulse-generating circuit;

and a second transistor connected as a source follower and arranged to receive an output from the common source amplifier.

(38) The bioanalytic instrument of (37), wherein the first transistor and second transistor are high-electron-mobility transistors.

(39) The bioanalytic instrument of (37) or (38), further comprising an inductor connected between a drain of the first transistor and a voltage supply for the first transistor.

(40) The bioanalytic instrument of any of (35) through (39), wherein the diode-driving circuit comprises: a field-effect transistor connected between a cathode of the laser diode and a reference potential; an inductor and resistor connected in series between an anode and the cathode of the laser diode; and a capacitor connected between the anode and the reference potential.

(41) The bioanalytic instrument of any of (37) through (40), wherein the diode-driving circuit causes the laser diode to output an optical pulse on average having a temporal full-width half-maximum value between 40 ps and 250 ps in response to application of a unipolar pulse of the unipolar pulses to a gate of the field-effect transistor.

(42) The bioanalytic instrument of any of (35) through (41), wherein the diode-driving circuit causes the laser diode to output the optical pulse such that an intensity of the pulse reduces by no less than 40 dB by at most 600 ps from a peak value of the optical pulse.

(43) The bioanalytic instrument of any of (13) through (42), wherein the beam-steering assembly comprises: a lens; and a gimbal that supports and rotates the lens about two axes to laterally translate a beam passing through the lens.

(44) The bioanalytic instrument of any of (13) through (43), further comprising: a first lens mounted adjacent to the pulsed optical source; a second lens mounted in a moveable component of the beam-steering assembly; and a third lens arranged to focus a beam from the second lens onto an optical coupler on the bio-optoelectronic chip.

(45) The bioanalytic instrument of (44), wherein the first lens, the second lens, and the third lens are the only lenses located between the pulsed optical source and the chip receptacle.

(46) The bioanalytic instrument of (44) or (45), wherein the first lens, the second lens, and the third lens produce a magnified beam at the location of the optical coupler of a beam emitted at an emission face of the laser diode, wherein a magnification factor for the magnified beam is between 10 and 30.

(47) The bioanalytic instrument of any of (44) through (46), wherein the first lens, the second lens, and the third lens produce an elliptical beam at the location of the optical coupler.

(48) The bioanalytic instrument of any of (13) through (47), wherein the bioanalytic instrument is configured to process data received from the packaged bio-optoelectronic chip to determine information about DNA.

(49) The bioanalytic instrument of any of (13) through (47), wherein the bioanalytic instrument is configured to process data received from the packaged bio-optoelectronic chip to determine information about one or more proteins.

(50) The bioanalytic instrument of any of (13) through (47), wherein the bioanalytic instrument is configured to process data received from the packaged bio-optoelectronic chip to determine information about at least one metabolic reaction.

V. Conclusion

Having thus described several aspects of several embodiments of a hand-held bioanalytic instrument, it is to be appreciated that various alterations, modifications, and improvements will readily occur to those skilled in the art. Such alterations, modifications, and improvements are intended to be part of this disclosure, and are intended to be within the spirit and scope of the invention. While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art.

While various inventive embodiments have been described and illustrated, those of ordinary skill in the art will readily envision a variety of other means and/or structures for performing the function and/or obtaining the results and/or one or more of the advantages described, and each of such variations and/or modifications is deemed to be within the scope of the inventive embodiments described. More generally, those skilled in the art will readily appreciate that all parameters, dimensions, materials, and configurations described are meant to be examples and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure may be directed to each individual feature, system, system upgrade, and/or method described. In addition, any combination of two or more such features, systems, and/or methods, if such features, systems, system upgrade, and/or methods are not mutually inconsistent, is included within the inventive scope of the present disclosure.

Further, though some advantages of the present invention may be indicated, it should be appreciated that not every embodiment of the invention will include every described advantage. Some embodiments may not implement any features described as advantageous. Accordingly, the foregoing description and drawings are by way of example only.

All literature and similar material cited in this application, including, but not limited to, patents, patent applications, articles, books, treatises, and web pages, regardless of the format of such literature and similar materials, are expressly incorporated by reference in their entirety. In the event that one or more of the incorporated literature and similar materials differs from or contradicts this application, including but not limited to defined terms, term usage, described techniques, or the like, this application controls.

The section headings used are for organizational purposes only and are not to be construed as limiting the subject matter described in any way.

Also, the technology described may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used, should be understood to control over dictionary definitions, definitions in documents incorporated by reference, and/or ordinary meanings of the defined terms.

Numerical values and ranges may be described in the specification and claims as approximate or exact values or ranges. For example, in some cases the terms "about," "approximately," and "substantially" may be used in reference to a value. Such references are intended to encompass the referenced value as well as plus and minus reasonable variations of the value. For example, a phrase "between about 10 and about 20" is intended to mean "between exactly 10 and exactly 20" in some embodiments, as well as "between 10±δ1 and 20±δ2" in some embodiments. The amount of variation δ1, δ2 for a value may be less than 5% of the value in some embodiments, less than 10% of the value in some embodiments, and yet less than 20% of the value in some embodiments. In embodiments where a large range of values is given, e.g., a range including two or more orders of magnitude, the amount of variation δ1, δ2 for a value could be as high as 50%. For example, if an operable range extends from 2 to 200, "approximately 80" may encompass values between 40 and 120 and the range may be as large as between 1 and 300. When exact values are intended, the term "exactly" is used, e.g., "between exactly 2 and exactly 200."

The term "adjacent" may refer to two elements arranged within close proximity to one another (e.g., within a distance that is less than about one-fifth of a transverse or vertical dimension of a larger of the two elements). In some cases there may be intervening structures or layers between adjacent elements. In some cases adjacent elements may be immediately adjacent to one another with no intervening structures or elements.

The indefinite articles "a" and "an," as used in the specification and in the claims, unless clearly indicated to the contrary, should be understood to mean "at least one."

The phrase "and/or," as used in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The claims should not be read as limited to the described order or elements unless stated to that effect. It should be understood that various changes in form and detail may be made by one of ordinary skill in the art without departing from the spirit and scope of the appended claims. All embodiments that come within the spirit and scope of the following claims and equivalents thereto are claimed.

The invention claimed is:

1. A bioanalytic instrument comprising:
   a pulsed optical light source having a laser diode to produce a beam of optical pulses;
   a chip receptacle adapted to receive a packaged bio-optoelectronic chip;
   a beam-steering assembly adapted to steer the beam of optical pulses from the pulsed optical light source to the packaged bio-optoelectronic chip, the beam steering assembly including movable members;
   an alignment structure physically supporting each of the pulsed optical light source, the chip receptacle, and beam steering assembly; and
   a printed circuit board, registered to the alignment structure, on which the laser diode is mounted, and on which are also located a motion sensor which senses motion of the movable members in the beam-steering assembly;
   wherein the motion sensor includes an inductive motion sensor that senses inductive changes of the moveable members.

2. The bioanalytic instrument of claim 1, wherein at least one enclosing wall dissipates heat generated within the bioanalytic instrument.

3. The bioanalytic instrument of claim 1, wherein at least one enclosing wall guides or blocks forced air flow within the bioanalytic instrument.

4. The bioanalytic instrument of claim 1, wherein the bioanalytic instrument weighs no more than three kilograms.

5. The bioanalytic instrument of claim 1, wherein the bioanalytic instrument has a maximum length of no longer than 25 centimeters.

6. The bioanalytic instrument of claim 1, wherein the alignment structure comprises a registration platform to which the pulsed optical source and beam-steering assembly are registered, and further comprising at least one optical component mounted to the registration platform that operates on the beam of optical pulses.

7. The bioanalytic instrument of claim 6, wherein the packaged bio-optoelectronic chip and at least one optical component register to a first surface of the registration platform and the pulsed optical source and beam-steering assembly register to a second surface of the registration platform that is opposite the first surface.

8. The bioanalytic instrument of claim 7, further comprising kinematic recesses formed in the second surface of the registration platform, wherein the beam-steering assembly self aligns to the registration platform via the kinematic recesses.

9. The bioanalytic instrument of claim 6, wherein the alignment structure includes walls or reinforcing ribs that stiffen the registration platform.

10. The bioanalytic instrument of claim 1, wherein the printed circuit control board forms the majority of a wall of a chamber within the bioanalytic instrument.

11. The bioanalytic instrument of claim 10, wherein the printed circuit control board confines a majority of forced air flow within the bioanalytic instrument to the chamber.

12. The bioanalytic instrument of claim 11, further comprising:
a thermal post located adjacent to the chip receptacle and arranged to convey heat from the packaged bio-optoelectronic chip toward the chamber; and
a heat dissipating element located in the chamber and thermally coupled to the thermal post.

13. The bioanalytic instrument of claim 11, further comprising:
a thermally conductive reinforcing element attached to the printed circuit board and arranged to convey heat from the pulsed optical source toward the chamber; and
a heat dissipating element located in the chamber and thermally coupled to the thermally conductive reinforcing element.

14. The bioanalytic instrument of claim 11, further comprising at least one battery located in the chamber.

15. The bioanalytic instrument of claim 1, wherein the pulsed optical light source comprises:
a driving circuit for the laser diode formed on the printed circuit board, wherein the pulsed printed circuit board attaches directly to the beam-steering assembly.

16. The bioanalytic instrument of claim 1, further comprising conductive elements mounted to the moveable members in the beam-steering assembly.

17. The bioanalytic instrument of claim 16, further comprising:
a collecting lens mounted to the printed circuit board; and
two or more voice coils mounted to the printed circuit board, wherein the two or more voice coils are configured to activate the moveable members in the beam-steering assembly.

18. The bioanalytic instrument of claim 15, further comprising a board reinforcing element attached to the pulsed source circuit board that stiffens the pulsed source board.

19. The bioanalytic instrument of claim 18, wherein the board reinforcing element thermally couples to a heat dissipating element.

20. The bioanalytic instrument of claim 15, wherein the driving circuit comprises:
a pulse-generating circuit configured to produce unipolar pulses; and
a diode-driving circuit that outputs an electrical pulse to control the laser diode.

21. The bioanalytic instrument of claim 20, wherein the pulse-generating circuit comprises a logic gate configured to receive differential clock signals and output the unipolar pulses.

22. The bioanalytic instrument of claim 20, wherein the diode-driving circuit comprises:
a first transistor connected as a common source amplifier and arranged to receive the unipolar pulses from the pulse-generating circuit; and
a second transistor connected as a source follower and arranged to receive an output from the common source amplifier.

23. The bioanalytic instrument of claim 22, wherein the first transistor and second transistor are high-electron-mobility transistors.

24. The bioanalytic instrument of claim 22, further comprising an inductor connected between a drain of the first transistor and a voltage supply for the first transistor.

25. The bioanalytic instrument of claim 20, wherein the diode-driving circuit comprises:
a field-effect transistor connected between a cathode of the laser diode and a reference potential;
an inductor and resistor connected in series between an anode and the cathode of the laser diode; and
a capacitor connected between the anode and the reference potential.

26. The bioanalytic instrument of claim 25, wherein the diode-driving circuit causes the laser diode to output an optical pulse on average having a temporal full-width half-maximum value between 40 ps and 250 ps in response to application of a unipolar pulse of the unipolar pulses to a gate of the field-effect transistor.

27. The bioanalytic instrument of claim 26, wherein the diode-driving circuit causes the laser diode to output the optical pulse such that an intensity of the pulse reduces by no less than 40 dB by at most 600 ps from a peak value of the optical pulse.

28. The bioanalytic instrument of claim 1, wherein the beam-steering assembly further includes a gimbal, and wherein the moveable members includes
a lens;
wherein the gimbal supports and rotates the lens about two axes to laterally translate the beam passing through the lens.

29. The bioanalytic instrument of claim 1, further comprising:
a first lens mounted adjacent to the pulsed optical source;
a second lens mounted in a moveable component of the beam-steering assembly; and
a third lens arranged to focus a beam from the second lens onto an optical coupler on the bio-optoelectronic chip.

30. The bioanalytic instrument of claim 29, wherein the first lens, the second lens, and the third lens are the only lenses located between the pulsed optical source and the chip receptacle.

31. The bioanalytic instrument of claim 29, wherein the first lens, the second lens, and the third lens produce a magnified beam at the location of the optical coupler of a beam emitted at an emission face of the laser diode, wherein a magnification factor for the magnified beam is between 10 and 30.

32. The bioanalytic instrument of claim 29, wherein the first lens, the second lens, and the third lens produce an elliptical beam at the location of the optical coupler.

33. The bioanalytic instrument of claim 1, wherein the bioanalytic instrument is configured to process data received from the packaged bio-optoelectronic chip to determine information about DNA.

34. The bioanalytic instrument of claim 1, wherein the bioanalytic instrument is configured to process data received from the packaged bio-optoelectronic chip to determine information about one or more proteins.

35. The bioanalytic instrument of claim 1, wherein the bioanalytic instrument is configured to process data received from the packaged bio-optoelectronic chip to determine information about at least one metabolic reaction.

36. A bioanalytic instrument comprising:
- a optical light source;
- a chip receptacle adapted to receive a packaged bio-optoelectronic chip;
- a beam-steering assembly adapted to steer a beam of optical pulses from the pulsed optical light source to the packaged bio-optoelectronic chip, the beam steering assembly including movable members;
- an alignment structure physically supporting each of the pulsed optical light source, the chip receptacle, and beam steering assembly; and
- a driver, including a plurality of voice coils, configured to drive motion of the movable members in the beam steering assembly.

* * * * *